United States Patent [19]
Odake et al.

[11] Patent Number: 5,627,779
[45] Date of Patent: May 6, 1997

[54] NON-VOLATILE SEMICONDUCTOR MEMORY HAVING AN ARRAY OF NON-VOLATILE MEMORY CELLS AND METHOD FOR DRIVING THE SAME

[75] Inventors: Yoshinori Odake; Akira Asai; Yasushi Okuda; Toshiki Mori; Ichirou Nakao, all of Osaka, Japan

[73] Assignee: Matsushita Electric Industrial Co., Ltd., Osaka, Japan

[21] Appl. No.: 505,638

[22] Filed: Jul. 21, 1995

[30]    Foreign Application Priority Data

Jul. 22, 1994  [JP]  Japan .................................. 6-171405
Oct. 3, 1994   [JP]  Japan .................................. 6-238758

[51] Int. Cl.⁶ ..................... G11C 16/02; H01L 29/788
[52] U.S. Cl. .......................... 365/185.01; 365/185.02; 365/185.12; 257/316; 257/322
[58] Field of Search .................... 365/185.01, 185.02, 365/185.2, 185.26, 185.18, 185.12; 257/315, 316, 322

[56]    References Cited

U.S. PATENT DOCUMENTS 3,744,036  7/1973  Frohman-Bentchkowsky ... 365/185.18
5,251,171  10/1993  Yamauchi ........................ 365/185.18

FOREIGN PATENT DOCUMENTS 4-15953   1/1992  Japan ............................ H01L 27/115
5-28778   2/1993  Japan ............................ G11C 16/06
5-326892  12/1993 Japan ............................ H01L 27/115

*Primary Examiner*—David C. Nelms
*Assistant Examiner*—Son Mai
*Attorney, Agent, or Firm*—McDermott, Will & Emery

[57]    ABSTRACT

An array of non-volatile memory cells arranged in rows and columns is provided. Each memory cell is composed of a transistor made up of a gate, a source, and drain and a capacitance section. Each memory cell is connected to a row decoder through a wordline, to a column decoder through a bitline, and to a source decoder through a sourceline. Arranged in a path extending from a bitline to a sourceline through a transistor is an anisotropic resistance section, e.g., a diode, exhibiting different voltage-current characteristics for different levels of voltages applied thereacross. Because of such arrangement, leakage current occurring to a deselected memory cell in a reading operation can be reduced or can be eliminated. Read errors due to leakage current can be avoided and the power consumption can be reduced.

12 Claims, 46 Drawing Sheets

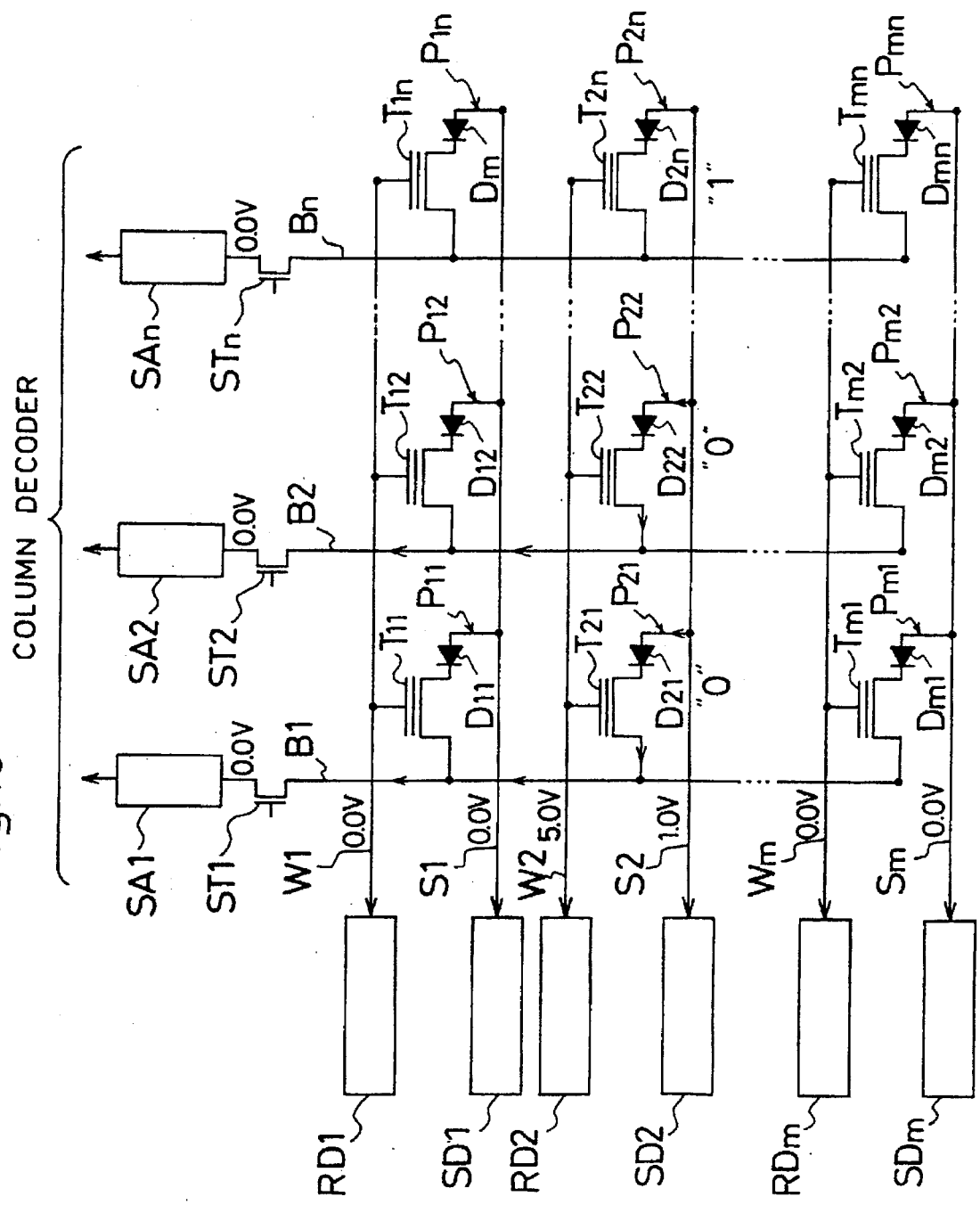

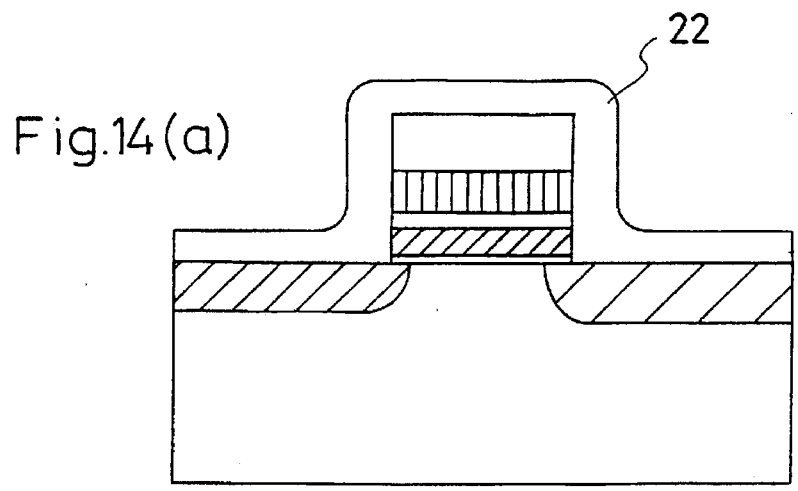
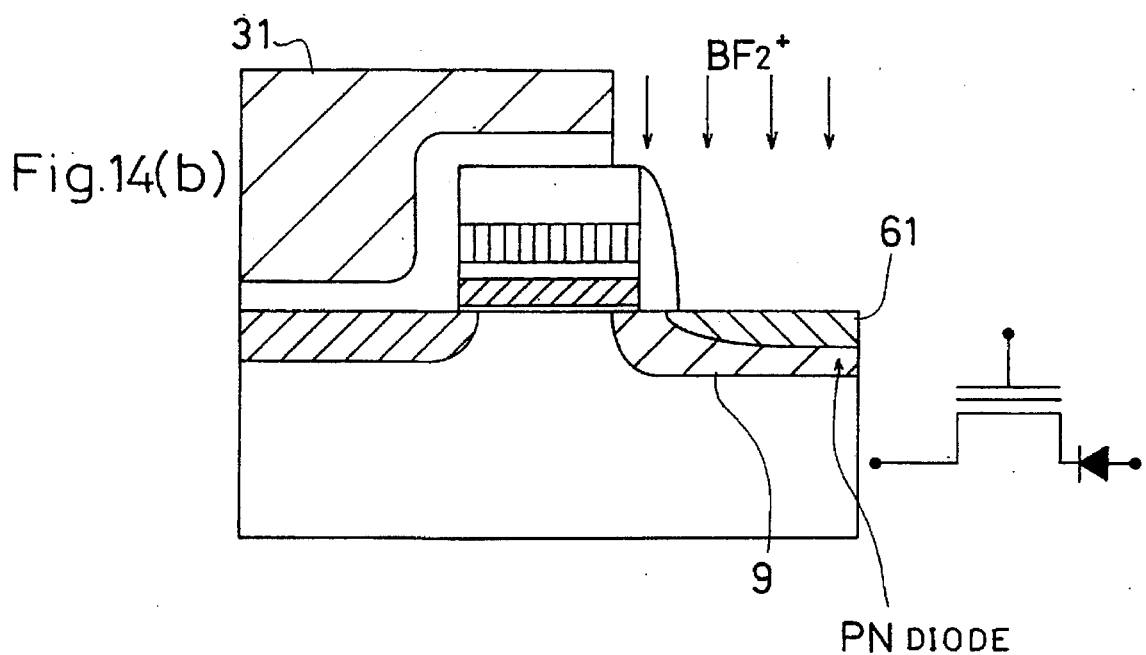

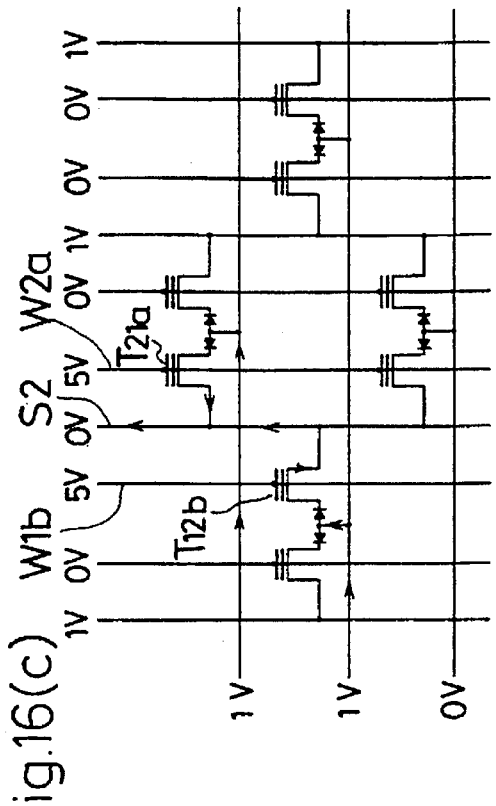
Fig.16(a)
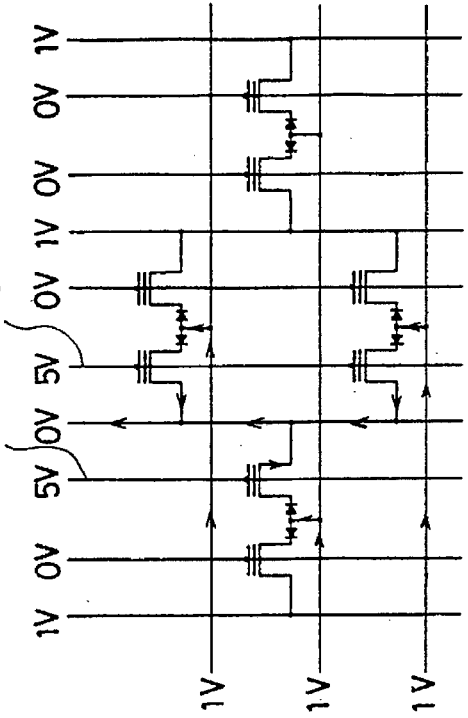
Fig.16(c)
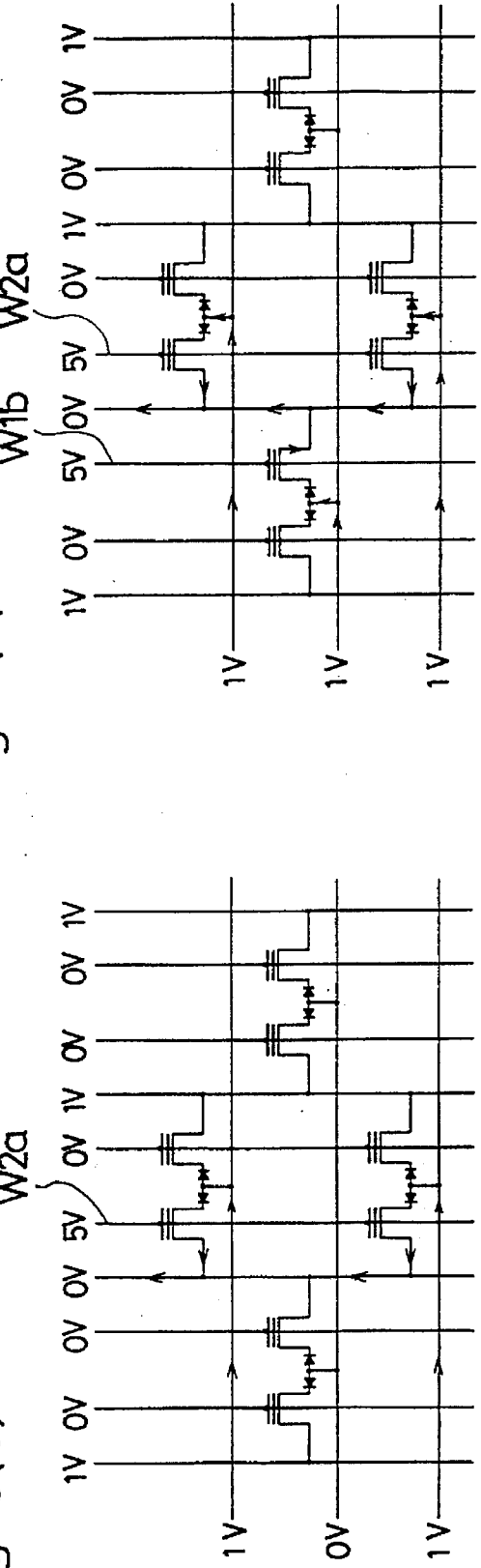
Fig.16(b)
Fig.16(d)

CELL AREA = 2 × 5.5 × L × L

CELL AREA = 2 × 5.5 × L × L

Fig.43 PRIOR ART COLUMN DECODER

NON-VOLATILE SEMICONDUCTOR MEMORY HAVING AN ARRAY OF NON-VOLATILE MEMORY CELLS AND METHOD FOR DRIVING THE SAME

BACKGROUND OF THE INVENTION

This invention relates to a non-volatile semiconductor memory having an array of non-volatile memory cells and relates to a method for driving a non-volatile semiconductor memory.

Many such non-volatile semiconductor memories have been known in the art. Japanese Patent Application (Pub. No. 5-28778) and Japanese Patent Application (Pub. No. 4-15953) each disclose a non-volatile semiconductor memory, wherein source decoders are connected to separate sourcelines associated with separate memory cell sources. Referring now to FIGS. 42–44, a non-volatile semiconductor memory of a conventional type having an array of nonvolatile memory cells is illustrated. FIG. 42 outlines in block form a conventional non-volatile semiconductor memory structure. Shown in FIG. 42 are a memory cell array 101, a row decoder circuit 102, a column decoder circuit 103, and a source decoder circuit 104. FIG. 43 is a circuit diagram depicting a part of the memory cell array 101. Referring to FIG. 43, therein are shown TRANSISTORS T11–Tmn, WORDLINES W1–Wm, BITLINES B1–Bn, SOURCELINES S1–Sm, and COLUMN SELECTION TRANSISTORS ST1–STn. Each TRANSISTOR T11–Tmn has a source, a drain, and a gate underlying which is a floating gate (i.e., a capacitance section). The memory cell array 101 has an array of memory cells arranged in m rows and n columns, each memory cell having therein a TRANSISTOR T. Each of the gates of TRANSISTORS T11–T1n in the first row is coupled to WORDLINE W1, and each of the gates of TRANSISTORS T21–T2n in the second row to WORDLINE W2, and each of the gates of TRANSISTORS Tm1–Tmn in the mth row to WORDLINE Wm. Each of the sources of TRANSISTORS T11–T1n in the first row is coupled to SOURCELINE S1, and each of the sources of TRANSISTORS T21–T2n in the second row to SOURCELINE S2, and each of the sources of TRANSISTORS Tm1–Tmn in the mth row to SOURCELINE Sm. Each of the drains of TRANSISTORS T11–Tm1 in the first column is coupled to BITLINE B1, and each of the drains of TRANSISTORS T12–Tm2 in the second column to BITLINE B2, and each of the drains of TRANSISTORS T1n–Tmn in the nth column to BITLINE Bn. Such arrangement is called an NOR-type structure in which transistors are arranged at points where WORDLINES W1–Wm and BITLINES B1–Bn cross one another. Here, WORDLINES W1–Wm run parallel with SOURCELINES S1–Sm. Whereas WORDLINES W1–Wm are connected to corresponding ROW DECODERS RD1–RDm of the row decoder circuit 102, SOURCELINES S1–Sm are connected to corresponding SOURCE DECODERS SD1–SDm of the source decoder circuit 104. BITLINES B1–Bn run in the cross direction to WORDLINES W1–Wm and SOURCELINES S1–Sm and are connected to the column decoder circuit 103 via SENSE AMPLIFIERS SA1–SAn. If, in a TRANSISTOR T, the capacitance section has a memory state of "one" when the electric potential of the gate is above Vt (the threshold voltage) and when $V_{DS}$ (the drain-source voltage) is above a predetermined value, then a current flows through a PATH P (P11–Pmn) extending from a certain location of a BITLINE B to a SOURCELINE S through TRANSISTOR T. On the other hands, if the capacitance section has a memory state of "zero", then no electric current flows.

Referring now to FIG. 44, a reading operation of extracting data out of a conventional non-volatile semiconductor memory is explained. The writing and erasing of a non-volatile semiconductor memory, e.g., an EEPROM (electrically-erasable, electrically-programmable, read-only-memory), is performed by greatly changing a transistor threshold voltage level. If a transistor is in a high threshold voltage state above Vcc (the reading supply voltage), this is called a "zero" state. On the other hand, if a transistor is in a low threshold voltage state below Vcc, this is called a "one" state. These transistor state definitions are used hereinafter throughout the specification.

A conventional reading operation of extracting data out of, for example, a memory cell having therein TRANSISTOR T22 (hereinafter called MEMORY CELL (T22)) is now explained. WORDLINE W2, which is a selected wordline, is set to Vcc (the reading supply voltage), for example, 5 V. On the other hand, WORDLINES W1, W3–Wm, which are deselected wordlines, are set to Vss (the ground level), for example, 0 V. At the same time, SOURCELINE S2, which is a selected sourceline, is set to Vss. On the other hand, SOURCELINES S1, S3–Sm), which are deselected sourcelines, are set to Vrm (the reading intermediate voltage level), for example, 1 V, or are brought to a "float" while being kept at Vrm. BITLINE B2, which is a selected bitline, is set to Vrm via a corresponding sense amplifier. On the other hand, BITLINES B1, B3–Bn, which are deselected bitlines, are set to Vss or are brought to a "float" while being kept at Vss. Practically, a bitline is connected to a respective sense amplifier and a slight bitline potential variation from Vrm occurs. However, for the purpose of simplifying the description, it is assumed that the bitline potential stays constant. Although it has been described that deselected sourcelines and deselected bitlines may be brought to a "float", the description will be made on condition that a deselected sourceline is set to Vrm and a deselected bitline is set to Vss. MEMORY CELL (T22) in the "zero" state passes no current and no current flows through BITLINE B2 accordingly. If MEMORY CELL (T22) has a "one" state, a current flows from BITLINE B2 to SOURCELINE S2 through MEMORY CELL (T22). By detecting the presence or absence of a current flowing in BITLINE B2, a read is accomplished.

In the above-described semiconductor memory, SOURCELINE S1 is at Vrm so that SOURCELINE S1 and BITLINE B2 are at the same electric potential. This produces greater resistance to a current flowing from BITLINE B2 to SOURCELINE S1. Therefore, MEMORY CELL (T12) is unlikely to be misread, thereby increasing the margin of reading.

In semiconductor memories having an array of non-volatile memory cells, control of writing and erasing operations may not be a solution to improving variations in the memory cell threshold-voltage and a memory cell is likely to be over-depleted to have a negative threshold voltage. During fabrication of non-volatile semiconductor memories, variations in the memory cell threshold voltage are caused by processing variations including variations in the impurity concentration and variations in the size. Additionally, as the level of integration increases, dimensional errors and the like produce larger threshold voltage variations. Further, the semiconductor memory industry is now trying to reduce the operating voltage of non-volatile semiconductor memories of large integration as low as possible, to provide low power memories for the purpose of solving heat problems. Therefore, the center of the distribution of threshold voltages among individual memory cells now shifts to lower voltage ranges. Such, however, produces some problems. For example, as the dimensions of non-volatile semiconductor memories decrease and as the scale of integration increases, the probability of part of memory cells in an array being over-depleted increases.

If MEMORY CELL (T22) in the "one" state is read when MEMORY CELL (T12), which is a deselected memory cell and which is coupled to the selected BITLINE B2, is in an over-depletion state, then an electric current flows through BITLINE B2 and the potential of BITLINE B2 drops. At this point in time, a current flows from SOURCELINE S1 at Vrm into BITLINE B2 through MEMORY CELL (T12), whereupon the potential of BITLINE B2 is brought back to Vrm. If BITLINE B2 makes no potential transitions, this may cause SENSE AMPLIFIER SA2 coupled to BITLINE B2 to make an incorrect detection that MEMORY CELL (T22) has a "zero" state, although MEMORY CELL (T22) has in fact a "one" state. Read errors may result. Conventional non-volatile semiconductor memories produce the problem that read errors are likely to occur because of existence of depleted memory cells.

In a conventional non-volatile semiconductor memory, in a reading operation (see FIG. 44), even when a deselected memory cell, e.g., MEMORY CELL (T11), is slightly depleted, an electric current flows from SOURCELINE S1 into BITLINE B1 which is a deselected bitline. Such a current causes no read errors because it flows in a deselected bitline but increases the amount of power required. In a conventional non-volatile semiconductor memory, a deselected sourceline and a deselected bitline are brought to a "float". However, in such a case, a transitional current is created for every reading operation, and low power dissipation cannot be accomplished during a fast reading operation.

Even if writing and erasing operations are controlled by performing a verification operation, there still exist large variations in the memory cell property and a memory cell is depleted having a threshold voltage of 0 V or less. Variations in the memory cell threshold voltage are caused by processing variations including variations in the impurity concentration and variations in the size. Additionally, as the level of integration increases, dimensional errors and the like produce larger threshold voltage variations.

The threshold voltage of non-volatile memory transistors, especially the threshold voltage of non-volatile memory transistors having a stack-type floating gate, is drain voltage-dependent. This is explained with reference to FIGS. 46, 47a–b and using formulas expressing the relationship of capacitance versus electric potential. FIG. 46 shows in cross section a transistor having a stack-type floating gate structure. FIGS. 47a, 47b are graphs each showing the relationships of drain current, Id, versus gate voltage, Vg in trial products of the present invention having a stack-type floating gate structure and in usual MOS transistors. In FIG. 46, 61 is a floating gate. 62 is a control gate. 63 is a drain. 64 is a source. 1 is a semiconductor substrate. Dielectric layers are not shown in the figure. Cc is the floating gate-control gate capacitance. Cd is the floating gate-drain capacitance. Cs is the floating gate-source capacitance. Cb is the floating gate-semiconductor substrate capacitance. Vcg is the voltage applied to the control gate 62. Vfg is the electric potential of the floating gate 61. Vd is the drain voltage. Vs is the source voltage. Vb is the electric potential of the semiconductor substrate 1. As shown in FIG. 47b, in the usual MOS transistor there is almost no difference in the threshold voltage between when Vd=0.1 V and when Vd=2.0 V. A threshold voltage viewed from a floating gate, VTfg, is almost independent of Vd and stays constant. On the other hand, as shown in FIG. 46, the floating gate 61 and the drain 63 are in capacitive coupling relationship. Upon application of Vd to the drain 63, the potential of the Floating gate 61, Vfg, drops by rd Vd (rd=Cd/Ct) as shown in the following formulas. Additionally, a threshold voltage viewed from the control gate 62, VTcg, drops by rd Vd/r because of Vd. As a result, as shown in FIG. 47a, in the non-volatile memory transistor having a stack-type floating gate structure, there is a difference of about 0.3 V (usually 0.2–0.4 V) in the threshold voltage between when Vd=0.1 V and when Vd=2.0 V.

$Ct=Cc+Cd+Cs+Cb$ $r=Cc/Ct, rd=Cd/Ct, rs=Cs/Ct, rb=Cb/Ct$ $Vcg=(Vfg-rd\ Vd-rs\ Vs-rb\ Vb)/r$ $\therefore Vfg=r\ Vcg+rd\ Vd+rs\ Vs+rb\ Vb$ $VTcg0=(VTfg-rs\ Vs-rb\ Vb)/r$ $VTcg=VTcg0-rd\ Vd/r$ There are produced variations in the memory cell threshold voltage because of the heterogeneous distribution of impurity concentrations during manufacture and because of the condition of how voltages are applied to individual sections. On the whole, the distribution of threshold voltages among individual memory cells falls within a certain range. FIG. 45 is a graph showing an example of the distribution of threshold voltages. In the graph, the abscissa indicates the non-volatile memory threshold voltage and the ordinate indicates the frequency. In an NOR-type memory cell array, a threshold voltage is controlled by a verification operation to have a rather high value, to eliminate read errors. Curve A–B of FIG. 45 illustrates a type of memory cell threshold voltage Vt distribution in the high threshold voltage condition (i.e., the "zero" state). Curve C–D of FIG. 45 illustrates a type of memory cell threshold voltage Vt distribution in the low threshold voltage condition (i.e., the "one" state). As already explained, in a reading operation, Vt, which is Vd-dependent, drops 0.2–0.4 V, resulting in the threshold voltage Vt distribution represented by Curve A'–B' and resulting in the threshold voltage Vt distribution represented by Curve C'–D'.

In the low threshold voltage condition, in order to guarantee a reading current (above 50 µA) that starts flowing when Vccmin (the minimum of Vcc) is applied to the control gate of a memory cell, the memory cell must have a threshold voltage lower by about 1.0 V than Vccmin (see Point B' of FIG. 45), although such depends on the sensitivity of sense amplifier as well as on the memory cell mutual conductance. In an NOR-type memory cell array, in order to prevent a deselected memory cell from being misread, a sum of leakage currents of deselected memory cells coupled to a single bitline must be sufficiently lower than a reading current (above 50 µA), and a memory cell in the low threshold voltage condition must have a threshold voltage above 0.5 V (see Point A' of FIG. 45).

If Vcc=3 V and Vccmin=2.7 V in the low threshold voltage condition, then a potential difference between Point A' and Point B of FIG. 45 must be below 1.2 V. If it is assumed that there is a threshold voltage drop of 0.2–0.4 V caused by Vd, then the width of the Curve A–B threshold voltage distribution must be below 1.0 V. These are the minimum requirements. In an actual memory, control margins for verification must be considered. Much more severe control on the distribution of threshold voltages Vt among individual memory cells is required, particularly in the low threshold voltage condition. The semiconductor industry is now trying to reduce the operating voltage of non-volatile semiconductor memories of large integration, to accomplish low power dissipation for solving heat problems. As Vcc (the reading voltage) becomes lower, it is necessary to control the threshold voltage distribution in a much more severe manner. For example, where Vcc is around 3.0 V, even a drop in the threshold voltage caused by Vd cannot be ignored. This results in increasing the probability of some memory cells being over-depleted.

A memory cell in the high threshold voltage condition must have an off state even when Vccmax (the maximum of Vcc) is applied thereto. A leakage current of that memory cell must be sufficiently lower than a reading current (above 50 μA) but greater than Vccmax by about 0.5 V (see Point C' of FIG. 45). Apart from the above, there are no other rigorous limitations for a memory cell in the high threshold voltage condition. Greater threshold voltage provides better advantage when considering reading operations only, thereby providing a greater threshold voltage control margin.

When considering improvement in the writing operations and improvement in the number of times a write/erase operation is executed, a lower threshold voltage is preferable. However, when considering only reading operations, there is no need to lower a threshold voltage. The present invention pertains to reading operations, so it is assumed here that greater memory cell threshold voltage provides better advantage.

In a reading operation of extracting data out of the FIG. 42 non-volatile semiconductor memory, Vrm (the reading intermediate voltage) is applied to a selected bitline coupled to the drain of a target memory cell. This causes the threshold voltage of deselected memory cells coupled to that selected bitline to drop, thereby increasing the possibility that over-depletion occurs. Vrm is applied to the drains of MEMORY CELLS (T12) and (Tm2) as well as the sources thereof and their threshold voltages viewed from the floating gates increase by the substrate bias effect. However, if Vrm=1.0 V, then the substrate bias effect is only about 0.1 V and is cancelled by a drop in the threshold voltage caused by Vs. Accordingly the threshold voltage viewed from the control gate decreases more.

Accordingly, if MEMORY CELL (T22) in the low threshold voltage condition is read when MEMORY CELL (T12), which is a deselected memory cell and which is coupled to the selected BITLINE B2, is being over-depleted, then an electric current flows through BITLINE B2, and BITLINE B2 slightly drops in potential. At this point in time, a current flows from SOURCELINE S1 at Vrm into BITLINE B2 through MEMORY CELL (T12), whereupon the potential of BITLINE B2 is brought back to Vrm. If BITLINE B2 makes no electric potential transitions, this may cause SENSE AMPLIFIER SA2 coupled to BITLINE B2 to make an incorrect detection that MEMORY CELL (T22) has a high threshold voltage condition, although MEMORY CELL (T22) has in fact has a low threshold voltage condition. Reading errors may result. Additionally, improvements in the mutual conductance necessary for accomplishing high-speed reading operations become difficult to accomplish.

SUMMARY OF THE INVENTION

Bearing in mind the above-noted problems with the prior art techniques, the present invention was made.

An object of the present invention is to eliminate read errors by preventing a current from being created in a deselected memory cell in a read mode of operation (the first object).

Another object of the present invention is to provide a low power semiconductor memory by preventing a current from being created in a deselected memory cell (the second object).

Still another object of the present invention is to eliminate read errors by preventing a drop in the threshold voltage in a deselected memory cell in a read mode of operation (the third object).

A further object of the present invention is to provide low power semiconductor memories by preventing a deselected sourceline from being charged or discharged in a read mode of operation (the fourth object).

A still further object of the present invention is to provide a semiconductor memory capable of fast reading in addition to eliminating read errors and accomplishing low power dissipation (the fifth object).

In order to achieve the first and second objects, the present invention discloses a non-volatile semiconductor memory. This non-volatile semiconductor memory comprises:

an array of non-volatile memory cells arranged in columns and rows, wherein each said non-volatile memory cell has a transistor and a capacitance section, said transistor being composed of, at least, a gate, a source, and a drain;

a plurality of wordlines, wherein each said wordline is connected to each of said gates in a row of said memory cell array;

a plurality of bitlines, wherein each said bitline is connected to each of said drains in a column of said memory cell array;

a plurality of sourcelines, wherein each said sourceline is connected to each of said sources in a row of said memory cell array;

a row decoder circuit for selecting among said plurality of wordlines;

a column decoder circuit for selecting among said plurality of bitlines;

a source decoder circuit for selecting among said plurality of sourcelines;

a plurality of anisotropic resistance sections;

wherein:

each said anisotropic resistance section is arranged in a path from a said bitline to a said sourceline through a said transistor;

each said anisotropic resistance section has voltage-current properties which are different for different levels of voltages applied across said anisotropic resistance section;

each said anisotropic resistance section has a forward direction in which a current flows therethrough with lesser resistance and a reverse direction in which a current flows therethrough with greater resistance.

Such arrangement makes it possible to minimize the magnitude of a current flowing in an opposite direction to a reading operation or to cut off such a current. As a result, even if there is a depleted memory cell, an unwanted current is reduced or eliminated which flows in an opposite direction to a reading operation, which is to say, from a deselected sourceline to a deselected bitline or from a deselected sourceline to a selected bitline. This not only eliminates read errors but also reduces power consumption.

In the non-volatile semiconductor memory, it is preferable that (i) the aforesaid anisotropic resistance section is a diode capable of permitting a current to pass therethrough in one direction only, (ii) the aforesaid diode is a Schottky diode formed by depositing a conductive layer directly on a semiconductor substrate surface region acting as a transistor source or drain, and (iii) the aforesaid diode is a PN diode formed between an internal region of a semiconductor substrate acting as a transistor source or drain and a contact region of the semiconductor substrate.

In the non-volatile semiconductor memory, it is preferable that the anisotropic resistance section is an offset region formed by implanting, between a transistor source or drain and an under-gate channel region, an impurity of the same conductivity type as the channel region.

In the non-volatile semiconductor memory, the following are preferable that (i) drains of each of pairs of memory cells in adjacent relationship are connected to a common bitline, (ii) the pairs of memory cells are placed in checkerboard arrangement to form an array structure, and (iii) two wordlines are arranged to a single sourceline, and sources of memory cells, connected to the wordlines located next to the source line, are connected to the source line.

The non-volatile semiconductor memory cell further comprises:
- a plurality of sense amplifiers, each of the sense amplifiers requiring a reference electric potential;
- a plurality of reference dummy cells, each of the reference dummy cells being arranged in each said bitline;

wherein:
the reference electric potential is generated in one of two adjoining bitlines.

In accordance with such an organization, two memory cells in pair are connected to a common bitline, requiring less area on a chip. Further, a single sourceline is arranged for each two wordlines, which contributes to further reducing areas to be occupied by memory cells. Because of the provision of sense amplifiers requiring a reference potential and the provision of reference dummy cells in a common bitline, the sensitivity of amplifiers can be set high. Therefore, read errors can be eliminated more effectively.

In order to eliminate the occurrence of read errors, the present invention discloses a method of driving a non-volatile semiconductor memory, said memory comprising:
an array of non-volatile memory cells arranged in columns and rows, wherein each said non-volatile memory cell has a transistor and a capacitance section, said transistor being composed of, at least, a gate, a source, and a drain;
a plurality of wordlines, wherein each said wordline is connected to each of said gates in a row of said memory cell array;
a plurality of bitlines, wherein each said bitline is connected to each of said drains in a column of said memory cell array;
a plurality of sourcelines, wherein each said sourceline is connected to each of said sources in a row of said memory cell array;
a row decoder circuit for selecting among said plurality of wordlines;
a column decoder circuit for selecting among said plurality of bitlines;
a source decoder circuit for selecting among said plurality of sourcelines;
a plurality of anisotropic resistance sections;
wherein:
each said anisotropic resistance section is arranged in a path from a said bitline to a said sourceline through a said transistor;
each said anisotropic resistance section has voltage-current properties which are different for different levels of voltages applied across said anisotropic resistance section;
each said anisotropic resistance section has a forward direction in which a current flows therethrough with lesser resistance and a reverse direction in which a current flows therethrough with greater resistance.

said drive method comprising the steps of:
selecting, from among said plurality of bitlines, a bitline associated with a memory cell to be read by means of said column decoder circuit;
selecting, from among said plurality of sourcelines, a sourceline associated with said memory cell by means of said source decoder circuit;
setting the electric potential of said selected bitline and the electric potential of said selected sourceline such that the electric potential relationship of said selected bitline versus said selected sourceline agrees with said forwarding direction of said anisotropic resistance section, and setting the higher of said selected bitline's electric potential and said selected sourceline's electric potential as a reading electric potential;
setting the electric potential of deselected sourcelines to an electric potential level above the lower of said selected bitline's electric potential and said selected sourceline's electric potential but below said reading electric potential.

In accordance with such a drive method, even if there is a depleted memory cell among deselected memory cells, a leakage current in the deselected memory cell is reduced or eliminated because during a reading operation the potential relationship between a bitline and a sourceline which are associated with a deselected memory cell is set in such a way as to agree with a reverse direction of an anisotropic resistance section. This minimizes or eliminates a leakage current in a deselected memory cell. Therefore, read error due to such a leakage current can be avoided, requiring less power.

In the drive method described above, the non-volatile semiconductor memory further comprises:
a plurality of sense amplifiers, each of said sense amplifiers requiring a reference electric potential;
a plurality of reference dummy cells, each of said reference dummy cell being arranged in a said bitline;
wherein:
said reference electric potential is generated in one of two adjoining bitlines;
said drive method further comprising the steps of:
selecting, from among said dummy memory cells, a dummy memory cell connected to a bitline located next to said selected bitline by means of said column decoder circuit;
bringing the electric potential of a deselected bitline located next to said selected bitline to the same electric potential level as the electric potential of said selected bitline;
setting the electric potential of a sourceline connected to said selected dummy memory cell such that the electric potential relationship of a bitline connected to said selected dummy cell with said sourceline agrees with a forward direction of an anisotropic resistance section of said selected dummy cell;
generating said reference electric potential in said bitline next to said selected bitline.

In the aforesaid drive method, all of the wordlines are set to a ground level when reading a memory cell.

The present invention provides a method of driving a non-volatile semiconductor memory;
said non-volatile semiconductor memory comprising:

an array of non-volatile memory cells arranged in columns and rows, wherein each said non-volatile memory cell has a transistor and a capacitance section, said transistor being composed of, at least, a gate, a source, and a drain;

a plurality of wordlines, wherein each said wordline is connected to each of said gates in a row of said memory cell array;

a plurality of bitlines, wherein each said bitline is connected to each of said drains in a column of said memory cell array;

a plurality of sourcelines, wherein each said sourceline is connected to each of said sources in a row of said memory cell array;

a row decoder circuit for selecting among said plurality of wordlines;

a column decoder circuit for selecting among said plurality of bitlines;

a source decoder circuit for selecting among said plurality of sourcelines;

a plurality of anisotropic resistance sections;

wherein:

each said anisotropic resistance section is arranged in a path from a said bitline to a said sourceline through a said transistor;

each said anisotropic resistance section has voltage-current properties which are different for different levels of voltages applied across said anisotropic resistance section;

each said anisotropic resistance section has a forward direction in which a current flows therethrough with lesser resistance and a reverse direction in which a current flows therethrough with greater resistance wherein:

said forward direction of said anisotropic resistance section is formed such that a voltage on the bitline side is greater than a voltage on the sourceline side;

said drive method comprising the steps of:

bringing an erased memory cell to having a negative threshold voltage;

selecting, from among said plurality of bitlines, a bitline associated with a memory cell to be read by means of said column decoder circuit;

selecting, from among said plurality of sourcelines, a sourceline associated with said memory cell by means of said source decoder circuit;

bringing the electric potential of all of said wordlines to a ground level;

increasing the electric potential of said selected bitline;

bringing the electric potential of said selected sourceline to said ground level;

bringing the electric potential of deselected bitlines to said ground level;

passing an electric current between said selected bit line and said selected sourceline thereby to generate hot electrons for increasing said memory cell's threshold voltage.

With such a drive method, smooth writing can be accomplished and a depleted memory cell can be restored smoothly to the initial state.

In order to achieve the third to fifth objects, the present invention discloses a third drive method of driving a non-volatile semiconductor memory;

said non-volatile semiconductor memory comprising:

an array of non-volatile memory cells arranged in columns and rows, wherein each said non-volatile memory cell has a transistor and a capacitance section, said transistor being composed of, at least, a gate, a source, and a drain;

a plurality of wordlines, wherein each said wordline is connected to each of said gates in a row of said memory cell array;

a plurality of bitlines, wherein each said bitline is connected to each of said drains in a column of said memory cell array;

a plurality of sourcelines, wherein each said sourceline is connected to each of said sources in a row of said memory cell array;

a row decoder circuit for selecting among said plurality of wordlines;

a column decoder circuit for selecting among said plurality of bitlines;

a source decoder circuit for selecting among said plurality of sourcelines;

said drive method comprising the steps of:

selecting, from among said plurality of sourcelines, a source line associated with a memory cell of said memory cells to be read by means of said source decoder circuit;

selecting, from among said plurality of wordlines, a wordline associated with said memory cell;

setting the electric potential of said selected wordline to a given electric potential level;

setting the electric potential of all of said bitlines to a first electric potential level;

setting the electric potential of said selected sourceline to a second electric potential level higher than said first electric potential level for reading said memory cell.

The above-described drive method may include a step of bringing the first electric potential level to approximately the same level as the ground potential level when reading said memory cell.

Owing to the above-descried method read errors can be controlled even in a non-volatile semiconductor memory without an anisotropic resistance section, in other words since the potential of bitlines is set lower than the potential of a selected sourceline when reading a memory cell a drop in the threshold voltage dependent of the drain voltage can be controlled in each deselected memory cell associated with the selected sourceline. Therefore read errors due to error operations of the deselected memory cells can be eliminated.

The above-described drive method may include a step of setting the electric potential of deselected sourcelines to the first electric potential level when reading a memory cell.

Because of the above-described method, a deselected sourceline and a bitline are at the same potential. As a result of such arrangement, even when a deselected memory cell is being over-depleted, there is little or no electric current from the deselected sourceline to the bitline. This prevents the occurrence of read errors without fail.

The above-described drive method may include a step of extracting items of data out of a group of all memory cells associated with a selected sourceline by bringing the electric potential of all bitlines (i.e., the first electric potential level) to a ground level when reading a memory cell.

Owing to such a method, application of voltage is performed on a selected sourceline and a selected wordline only at the beginning of a reading operation. This greatly reduces the power consumption during the charge/discharge operations.

The above-described drive method may include a step of setting the electric potential of a selected sourceline in a reading operation of a write verification operation or erase verification operation, to below the electric potential of a selected sourceline in a reading operation.

As a result of such a method, the threshold voltage is controlled during a verification operation so as to have a rather high level, while during a usual reading operation it is controlled to be at a rather low level. Although the threshold voltage of a deselected memory cell is kept remaining high, the threshold voltage of a selected memory cell can be controlled to be at a suitable level. Then, the upper limit of the threshold voltage of a memory cell in the "one" state can be set high, thereby providing greater threshold voltage design margins of the semiconductor memory.

In the above-described drive method, it is preferable that the non-volatile memory cell is a non-volatile memory cell formed such that the capacitive coupling ratio between a source and a capacitance section is greater than the capacitive coupling ratio between a drain and a capacitance section.

Such a method provides a structure capable of increasing a threshold voltage drop due to the source voltage. This allows a source voltage to be set high but not so high as to cause soft writing. A memory cell can be read at a high speed with a great memory cell mutual conductance.

BRIEF DESCRIPTION OF THE DRAWINGS

FIG. 10 is a circuit diagram useful in understanding the reading of a group of memory cells associated with a single wordline of a memory cell array of the second embodiment.

FIG. 14, comprised of 14a and 14b, shows in cross section a sequence of the fabrication of a memory cell of the fourth embodiment up to a step of forming a PN diode after deposition of an $SiO_2$ layer.

FIG. 16, comprised of 16a–16d, shows circuit diagrams useful in understanding the reading of a memory cell array of the fifth embodiment.

FIG. 17 comprises 17a and 17b wherein

FIG. 21, comprised of 21a–21d, is a circuit diagram useful in understanding the reading of a memory cell array of the sixth embodiment.

FIG. 26 comprises 26a and 26b wherein

DESCRIPTION OF THE INVENTION

Preferred embodiments of the present invention are now described by making reference to the accompanying drawing figures.

EMBODIMENT 1

Figure 1:
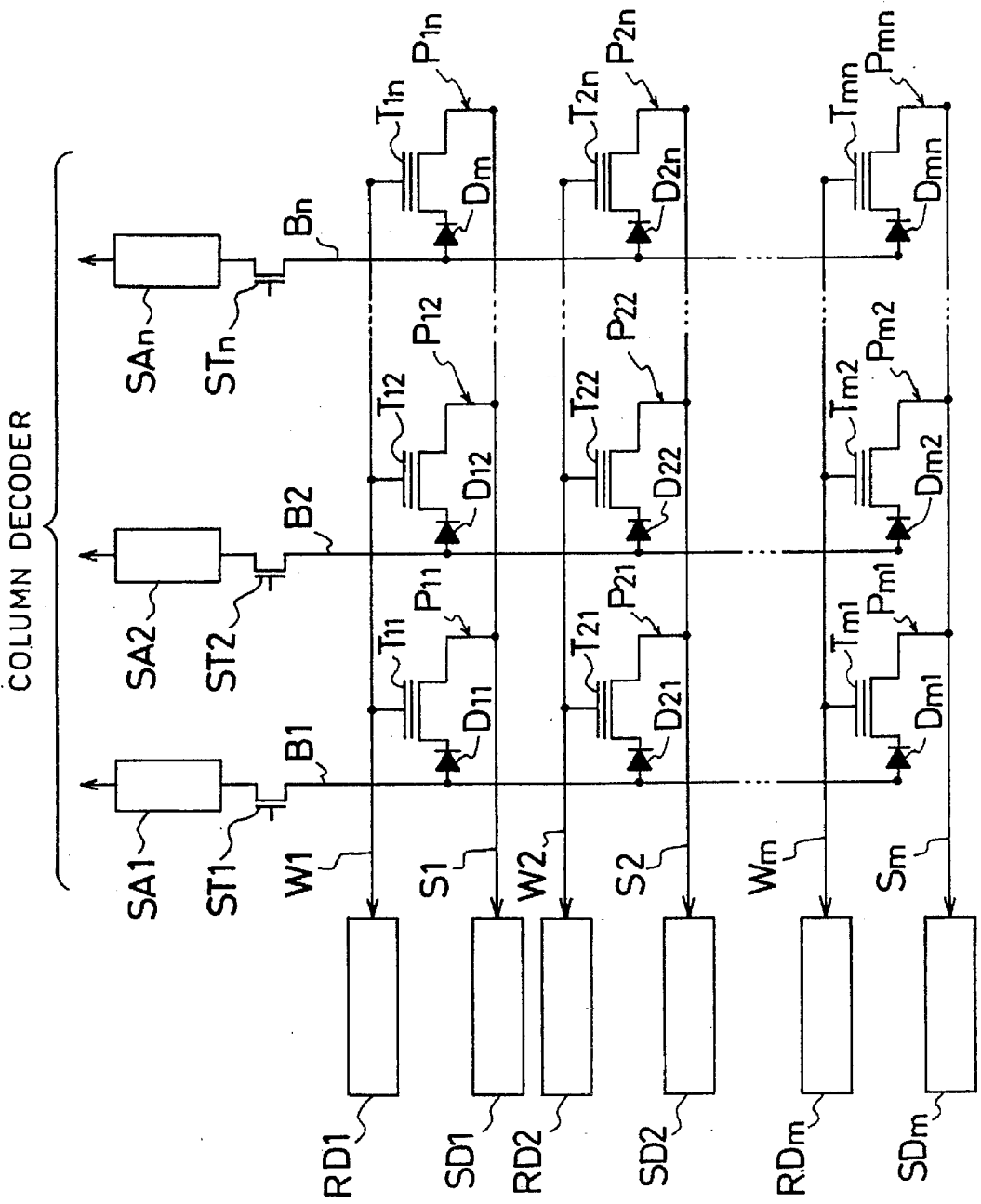
FIG. 1 is a circuit diagram depicting an array of memory cells in accordance with a first embodiment of the present invention.

A semiconductor memory of the first embodiment and the reading thereof are described below. This semiconductor memory is not shown here in the form of a block diagram since it is basically identical in configuration with the one shown in FIG. 42, and the description thereof is not made accordingly. FIG. 1 is a circuit diagram showing part of a memory cell array of a flash-type EEPROM. More specifically, a large plurality of non-volatile memory cells (T11)–(Tmn), each of which comprising a respective TRANSISTOR T and a respective capacitance section, are arranged in m rows and n columns. FIG. 1 shows BITLINES B1–Bn, WORDLINES W1–Wm, SOURCELINES ST1–STn, SENSE AMPLIFIERS SA1–SAn, ROW DECODERS RD1–RDm, and SOURCE DECODERS SD1–SDm (see FIG. 42 for their structures and arrangement relationship).

A semiconductor memory of the present embodiment is characterized by the provision of DIODES D11–Dmn, each DIODE D11–Dmn being connected between a drain of each of TRANSISTORS T11–Tmn and each BITLINE B1–Bn. For example, DIODE D11 is connected between the drain of TRANSISTOR T11 and BITLINE B1, and so on. In each DIODE D11–Dmn, a current is allowed to flow in one direction only, in other words a current is allowed to flow from a bitline to a transistor through a diode. Owing to the provision of DIODE D, a current flowing from the drain of TRANSISTOR T to the source of TRANSISTOR T (i.e., in the forward direction) is almost equal to the operating current of TRANSISTOR T. This provides the current characteristic that little or no current flows from the source of TRANSISTOR T to the drain of TRANSISTOR T (i.e., in the reverse direction). Each diode D11–Dmn acts as an anisotropic resistance section of the present invention. Such an anisotropic resistance section does not necessarily have such a diode function that a current flowing in the reverse direction is cut off about 100%. It is sufficient that the value of current in the reverse direction is low in comparison with the value of current in the forward direction. For convenience, an anisotropic resistance section is referred to as a diode.

Figure 2A:
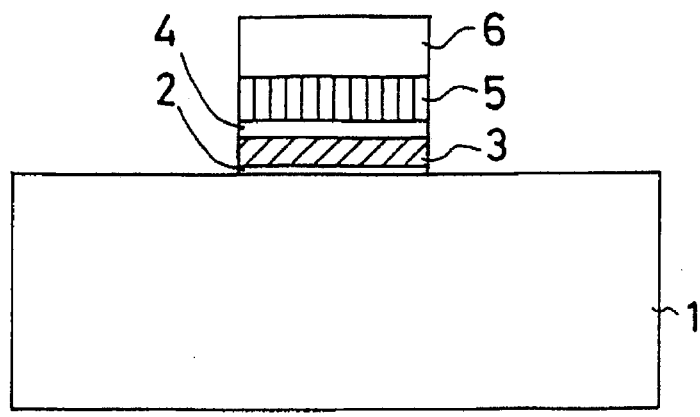
FIG. 2, comprised of 2a–2c, shows in cross section a sequence of the fabrication of a memory cell of the first embodiment up to a step of forming an n⁺layer.

The fabrication of a semiconductor memory of the present embodiment is described. As shown in FIG. 2a, a tunnel $SiO_2$ layer 2 is formed on a surface of a semiconductor substrate 1 of p-type by means of a thermal oxidation process. After patterning of a floating gate 3, a capacitance dielectric layer 4 is formed on a surface of the floating gate 3 by means of a CVD or thermal oxidation process. A control gate 5 of conductive material such as polycide is formed on the floating gate 3. An $SiO_2$ layer 6, as a passive layer, is formed on the control gate 5. The control gate 5 and the $SiO_2$ layer 6 are patterned in order that they are in crossing relationship with the floating gate 3. Using the control gate 5 and the $SiO_2$ layer 6 as a mask, an anisotropic etching is carried out in self-matching manner to the capacitance dielectric layer 4, the floating gate 3, and the tunnel $SiO_2$ layer 2. A structure, shown in FIG. 2a, is a structure known in the art as a stack-type floating gate EEPROM.

Figure 2B:
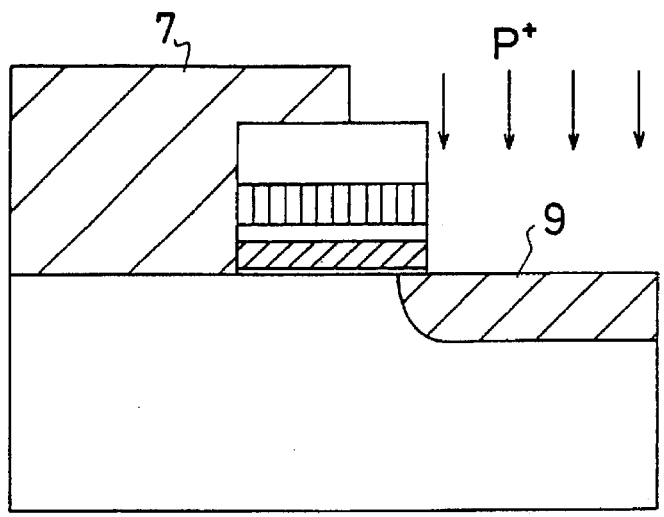
Figure 2C:
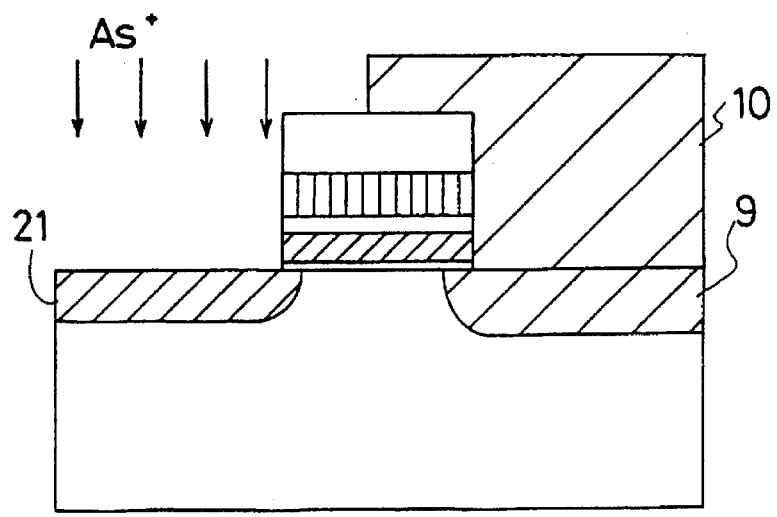

A resist 7 is applied. The resist 7 is selectively removed such that a region where DIODE D is formed is exposed. An implantation with $P^+$ ions is performed, whereupon an $n^-$ layer 9 is formed having a desired concentration (see FIG. 2b). A resist 10 is applied. The resist 10 is selectively removed such that other regions other than the foregoing diode formation region are exposed. An implantation with $As^+$ ions is performed, whereupon an $n^+$ layer 21 is formed having a high concentration (see FIG. 2c).

Figure 3A:
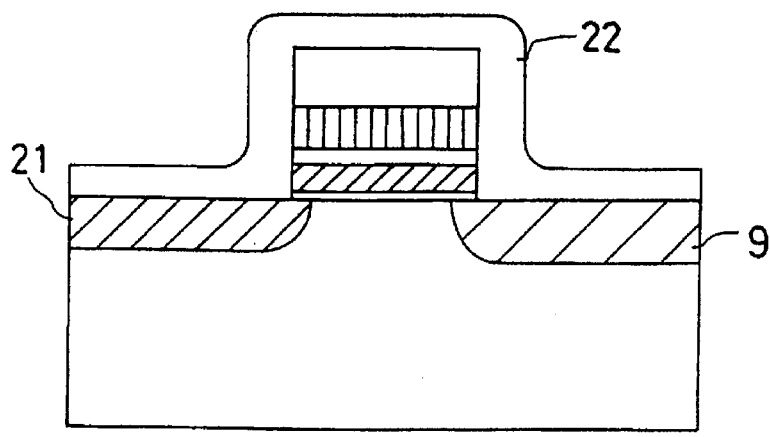
FIG. 3, comprised of 3a–3c, shows in cross section a sequence of the fabrication of a memory cell of the first embodiment up to a step of forming a Schottky diode after deposition of an $SiO_2$ layer.
Figure 3B:
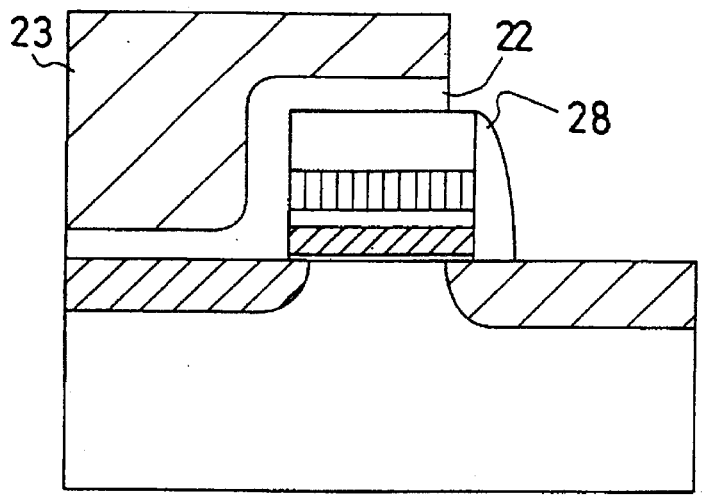
Figure 3C:
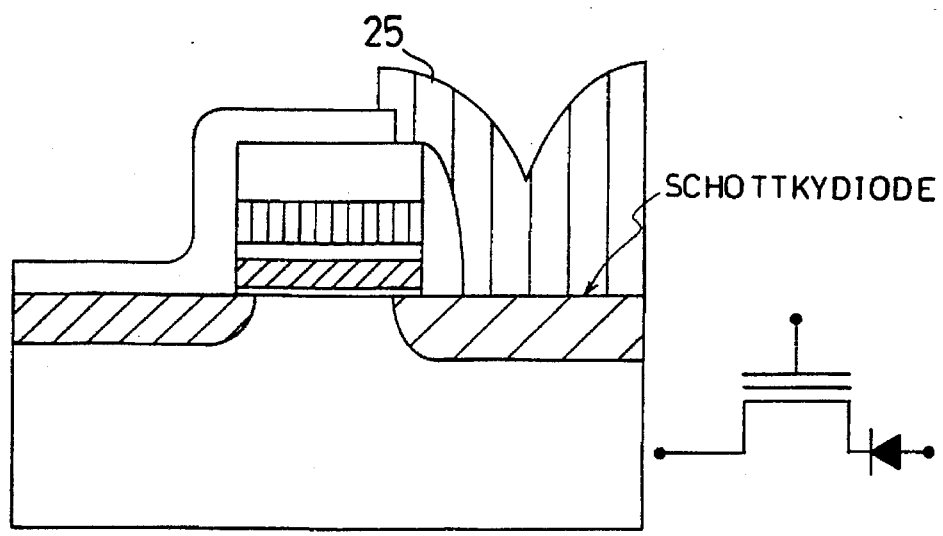

After deposition of an $SiO_2$ layer 22 acting as a passive layer by a CVD technique (see FIG. 3a), a resist 23 is applied. The resist 23 is selectively removed such that the diode formation region is exposed. The $SiO_2$ layer 22 is etched back by means of an anisotropic etching technique in such a way that a sidewall 28 is left on a gate sidewall of the diode formation region (see FIG. 3b). A WSix layer 25 is formed on the semiconductor substrate 1 and is patterned to form a Schottky diode (see FIG. 3c). The WSix layer 25 may be patterned to form a wiring layer or may be pattered to form a contact embedding layer. Although, in the FIG. 3c memory cell, a Schottky diode is formed in a region where a source or drain of a conventional stack-type floating gate transistor is usually formed, the provision of such a Schottky diode does not increase the entire memory cell area.

Figure 4:
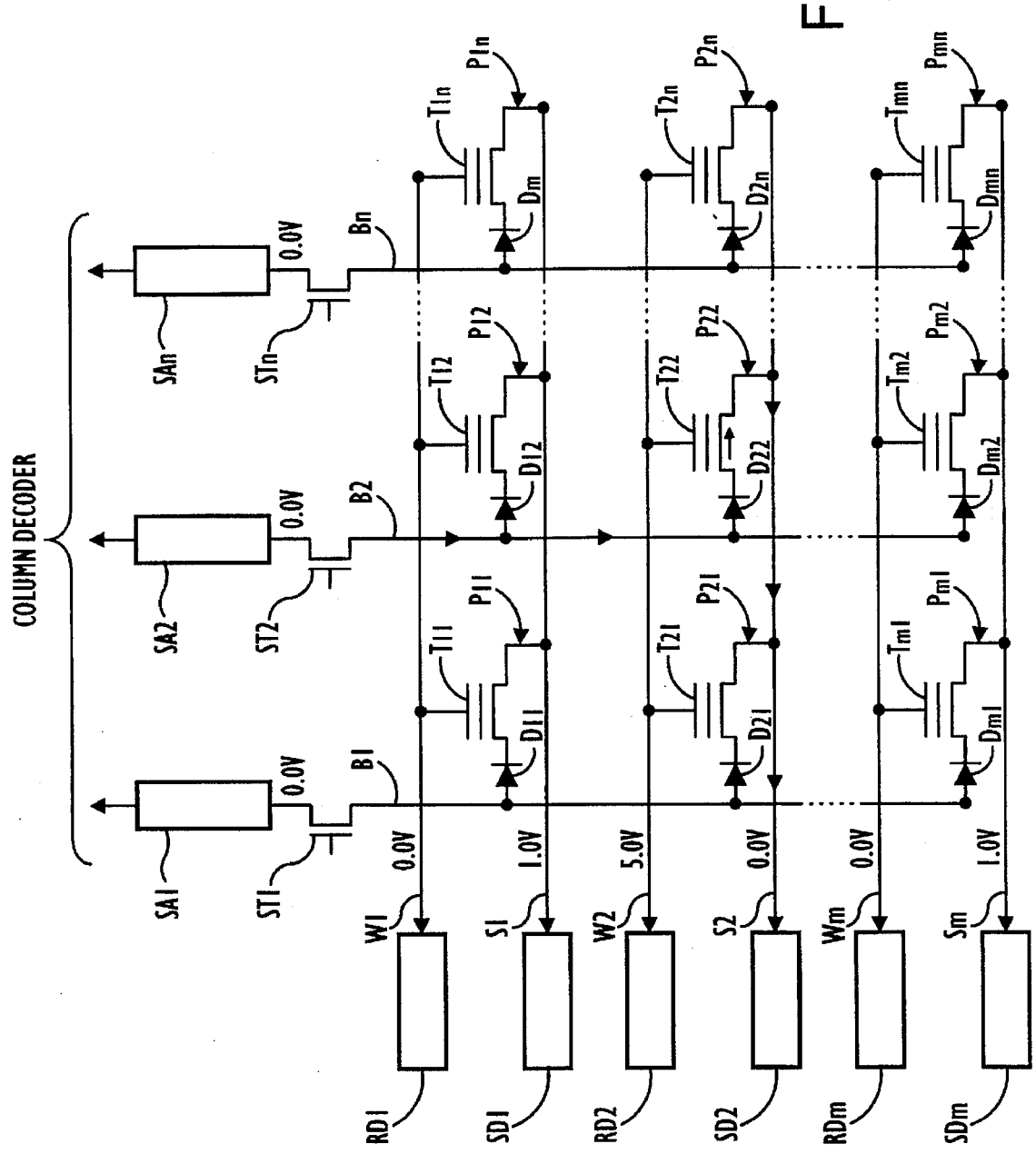
FIG. 4 is a circuit diagram useful in understanding the 1-bit reading of a memory cell array of the first embodiment.

Referring now to FIG. 4, a reading operation of extracting data from a semiconductor memory of the first embodiment is explained. Although a Schottky diode may be formed in a drain or source region, the following description is made on a case where a Schottky diode is formed in a drain region. A reading operation when a Schottky diode is formed in a source region will be described later in the second embodiment. Here, MEMORY CELL (T22) is a candidate for reading. Assuming MEMORY CELL (T11) and MEMORY CELL (T12) are now being over-depleted, in other words these two memory cells each have a negative threshold voltage, a reading operation of extracting information from MEMORY CELL (T22) is described. WORDLINE W2, which is a selected wordline, is set to Vcc (for example, 5 V). WORDLINES W1, W3–Wm, which are deselected wordlines, are set to Vss (for example, 0 V). At the same time SOURCELINE S2, which is a selected sourceline, is grounded to Vss while SOURCELINES S1, S3–Sm, which are deselected sourceline, are set to Vrm (for example, 1 V). BITLINE B2, which is a selected bitline, is set to Vrm via a corresponding sense amplifier, while BITLINES B1, B3–Bn, which are deselected bitlines, are set to Vss. BITLINE B is coupled to SENSE AMPLIFIER SA, as a result of which the potential of BITLINE B changes slightly from Vrm. However, for the sake of easy understanding of the description, it is assumed that BITLINE B has a constant potential of Vrm.

If MEMORY CELL (T22) has a "zero" state, then MEMORY CELL (T22) will not operate and no current flows. Although MEMORY CELL (T12) is being over-depleted, no current flows in MEMORY CELL (T12) because BITLINE B2 and SOURCELINE S1 are at the same potential. Therefore no current will flow through BITLINE B2, which guarantees that MEMORY CELL (T22) is detected to be having a "zero" state without fail.

If, on the other hand, MEMORY CELL (T22) has a "one" state, then MEMORY CELL (T22) operates and a current flows. The potential of BITLINE B2 slightly decreases. At this point in time, there is produced a potential difference between SOURCELINE S1 and BITLINE B2. In spite of MEMORY CELL (T12) being over-depleted, no current flows through MEMORY CELL (T12) because of the existence of DIODE D12 coupled to the drain of MEMORY CELL (T12). The potential of BITLINE B2 will not be brought back to Vrm (1 V). A current flows through BITLINE B2, from which MEMORY CELL (T22) can be detected to be having a "one" state without fail. MEMORY CELL (T11) is also over-depleted thereby to create a potential difference of 1 V between SOURCELINE S1 and BITLINE B1. However, no current will flow through MEMORY CELL (T11) and through BITLINE B1 because of the existence of DIODE D11 coupled to the drain of MEMORY CELL (T11) (reverse bias). No excess power is consumed.

As a result of such arrangement, even if there exists an over-depleted memory cell in the memory cell array, the state of a selected memory cell can be detected correctly without fail. Read errors are eliminated. No current flows in the deselected bitlines and no excess power is consumed.

In the first embodiment's reading method, the potential of a selected bitline and the potential of deselected sourcelines are set at Vrm (the reading intermediate voltage). However, Vcc (the reading supply voltage) may be used instead of Vrm.

Figure 5:
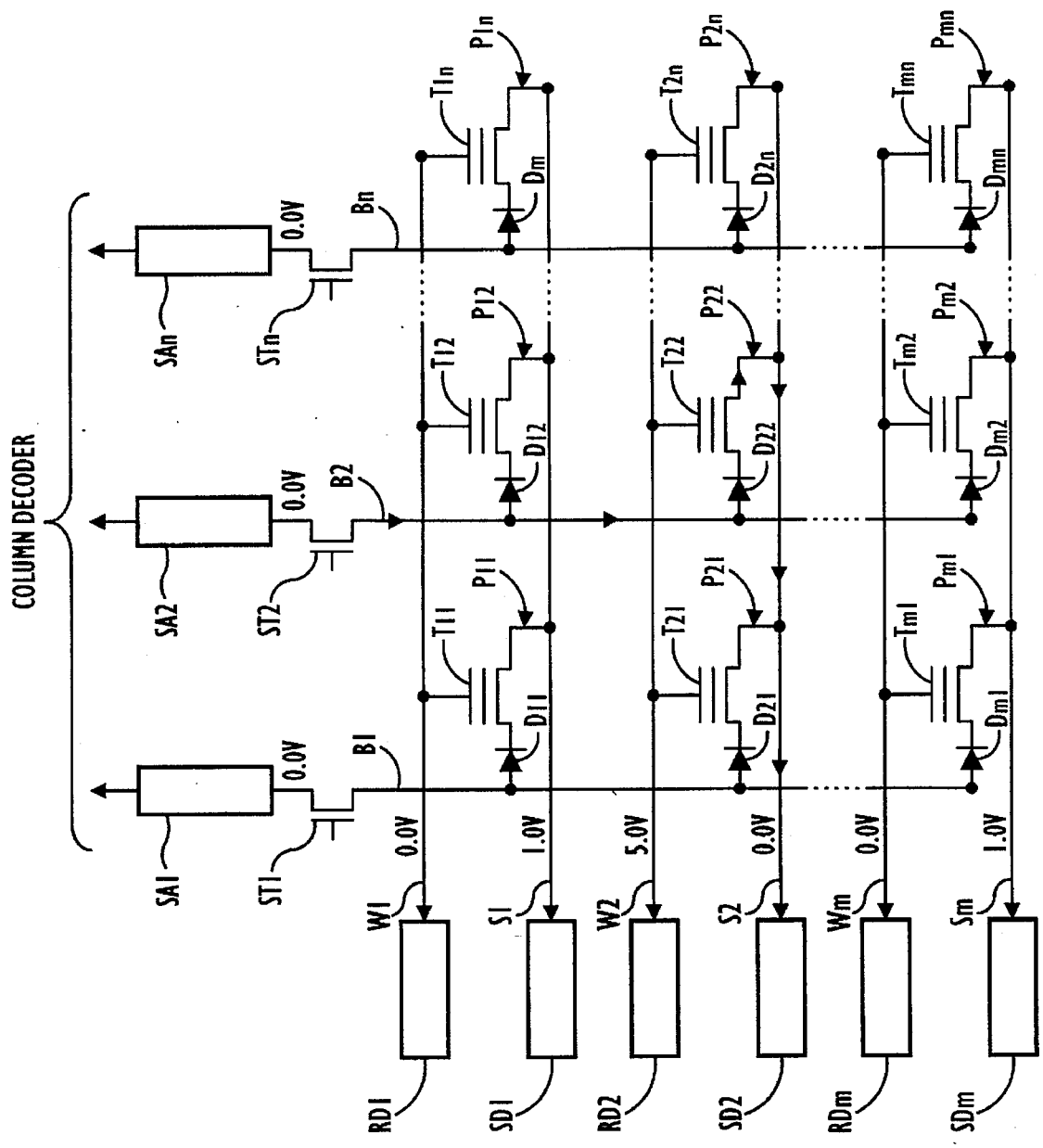
FIG. 5 is a circuit diagram useful in understanding the reading of a group of memory cells associated with a single wordline of a memory cell array of the first embodiment.

Next, referring to FIG. 5, a reading operation of extracting items of data from a group of all memory cells associated with a single wordline is described. Assuming MEMORY CELL (T11) and MEMORY CELL (T12) are being over-depleted, a reading operation of extracting items of data from a group of all memory cells associated with WORDLINE W2 is explained here. WORDLINE W2, which is a selected wordline, is set to Vcc (for example, 5 V). WORDLINES W3–Wm, which are deselected wordlines, are set to Vss (0 V). Simultaneously SOURCELINE S2, which is a selected sourceline, is set to Vss while SOURCELINES S1, S3–Sm, which are deselected sourcelines, are set to Vrm (for example, 1 V). Each BITLINE B1–Bn is set to Vrm via a respective sense amplifier. BITLINE B is coupled to SENSE AMPLIFIER SA, as a result of which the bitline potential changes slightly from Vrm. However, for the sake of easy understanding of the description, it is assumed that the bitline potential is constant at Vrm. When a memory cell has a "zero" state, no current flows in a corresponding bitline and the potential of the bitline does not make a transition. On the other hand, when a memory cell has a "one" state, a current will flow in the memory cell and the potential of a corresponding bitline is slightly decreased. Such a bitline potential difference is detected by making use of SENSE AMPLIFIER SA. If MEMORY CELL (T11) and MEMORY CELL (T12) are over-depleted, then there is created a potential difference between SOURCELINE S1 which is a deselected sourceline and BITLINE B2 which is a selected bitline. However, in spite of MEMORY CELL (T12) being over-depleted, no current flows in MEMORY CELL (T12) because of the existence of DIODE D12 coupled to the drain of MEMORY CELL (T12) (reverse bias), and the potential of BITLINE B2 will not be brought back to Vrm (1 V). A current flows through BITLINE B2, from which MEMORY CELL (T22) can be detected to be having a "one" state without fail.

DIODE D11, even when reverse-biased, passes a very little amount of leakage current. In a reading operation of extracting items of data from a group of all memory cells associated with WORDLINE W2, SOURCELINE S1 and each of BITLINES B1–Bn are at the same potential. Leakage current can be controlled, and less power consumption can be accomplished. The bitline potential and the deselected sourceline potential are set at Vrm in the description but both of them may be set at Vcc. Such potential is generically called a reading potential in the accompanying claims.

Next, another reading operation is described which is executed with the potential of wordlines kept at Vss (the ground level). This reading operation is similar to a reading operation of FIG. 4 or to a reading operation of FIG. 5. In the present reading operation, however, each of WORDLINES W1–Wm is set to Vss (for example, 0 V), which is not described with a figure. If the threshold voltage of a memory cell in the "one" state is set to be a negative value, then the memory cell passes a current if it has a "one" state while the memory cell passes no current if it has a "zero" state, even if the wordline potential is set at Vss (e.g., 0 V). So even when each of WORDLINES W1–Wm is set to Vss (e.g., 0 V), data can be extracted by detecting the state of a memory cell from the presence or absence of a current flowing in the memory cell. In other words, if SOURCELINE S2, which is a selected sourceline, is set to Vss, if SOURCELINES S1, S3–Sm, which are deselected sourcelines, are set to Vrm (e.g., 1 V), if BITLINE B2, which is a selected bitline, is set to Vrm via a corresponding sense amplifier, and if BITLINES B1, B3–Bn, which are deselected bitlines, are set to Vss, this enables a memory cell selected by SOURCELINE S2 and BITLINE B2 to be read. During the reading operation, the wordline potential does not change. This reduces the power consumption and lowers the supply voltage.

In the reading method of the first embodiment, both the bitline potential and the deselected sourceline potential are set at Vrm, but they may be set at Vcc.

Next, a writing operation is described which is executed with the potential of wordlines kept at Vss. If the threshold voltage of a memory cell in the "one" state is set negative, a current flows in the memory cell even if the wordline potential is set to Vss, say, 0 V. With the wordline potential grounded, if the potential of a selected bitline is set to a high level, if the potential of deselected bitlines is set to Vss, if the potential of a selected sourceline is set to Vss, and if the potential of deselected sourcelines is set to a high level or is brought to a "float", this generates hot electrons in a memory cell selected. In this way, a memory cell having a "one" state makes a transition to a "zero" state.

The above-described writing method may be used for bringing an over-depleted memory cell back to a high threshold voltage level.

In the above description, a write of data into a memory cell is implemented by means of an implantation of hot electrons. F-N current may be used instead of hot electrons. In the present embodiment, however, DIODE D is provided on the drain side, so that a high electric field is likely to be created between a drain and a floating gate. Therefore, a writing operation by means of hot electrons used in a conventional flash-type EEPROM is preferable in comparison with a writing operation by means of F-N current.

EMBODIMENT 2

Figure 6A:
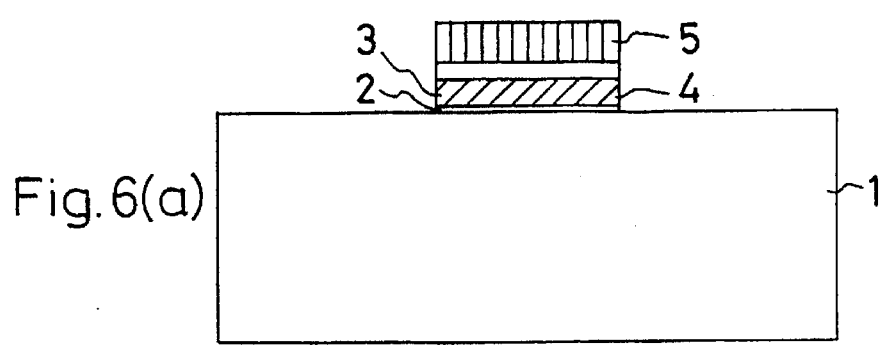
FIG. 6, comprised of 6a–6d, shows in cross section a sequence of the fabrication of a memory cell in accordance with a second embodiment of the present invention.
Figure 6B:
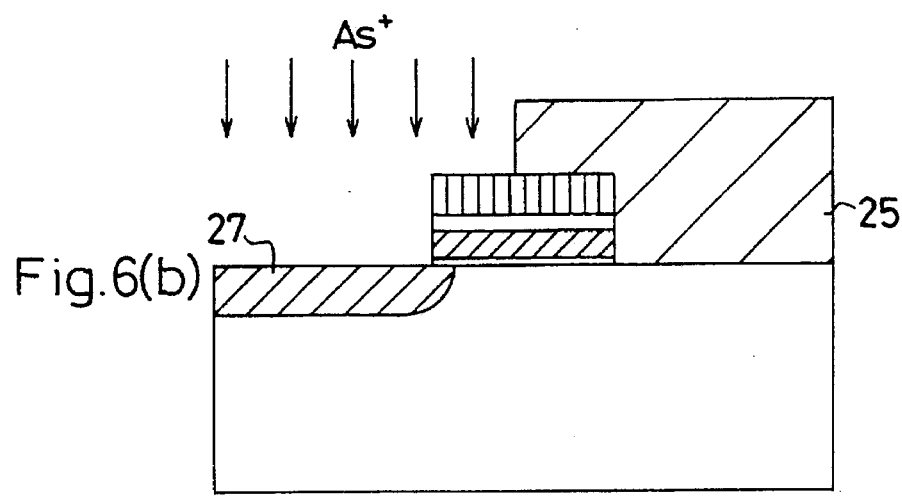
Figure 6C:
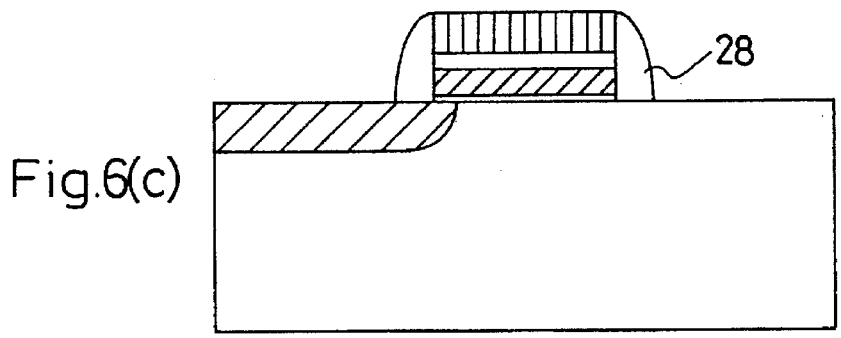
Figure 6D:
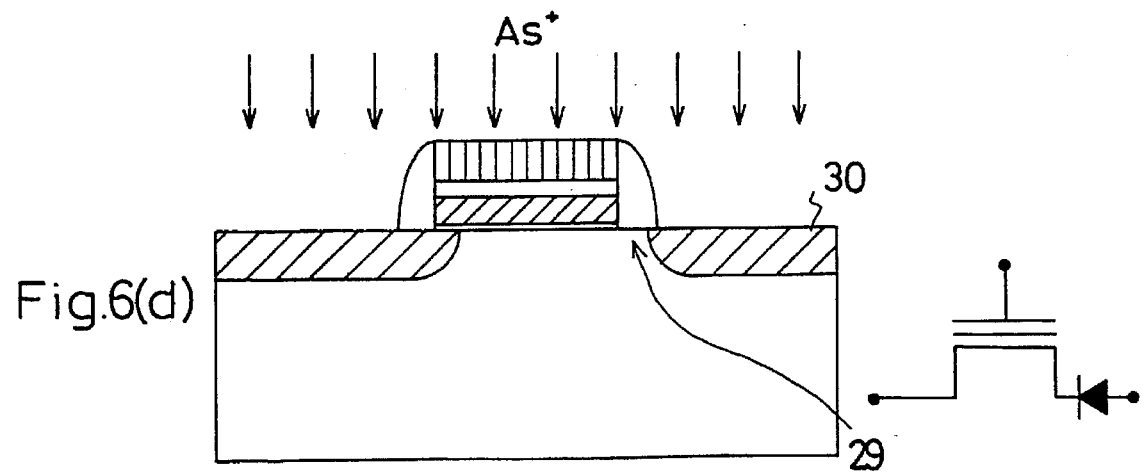

The fabrication of a semiconductor memory of the second embodiment is described. FIG. 6a, which is similar to FIG. 2a, shows a stage where a stack-type floating gate structure is formed. A resist 25 is applied onto the semiconductor substrate 1. The resist 25 is selectively removed from the semiconductor substrate i such that only a region where a diode is formed at a later step is exposed. An implantation of As$^+$ ions is carried out thereby to form an n$^+$ layer 27 having a high concentration (see FIG. 6b). This is followed by deposition of a layer of SiO$_2$. This SiO$_2$ layer is etched back to form a sidewall 28 (see FIG. 6c). Thereafter an implantation of As$^+$ ions is carried out, whereupon an n$^+$ layer 30 is formed having a high concentration (see FIG. 6d). In the FIG. 6d stage, the n$^+$ layer 30 and the floating gate 3 are offset horizontally. The length of an offset region 29 is controlled by the film thickness of the sidewall 28.

Figure 7:
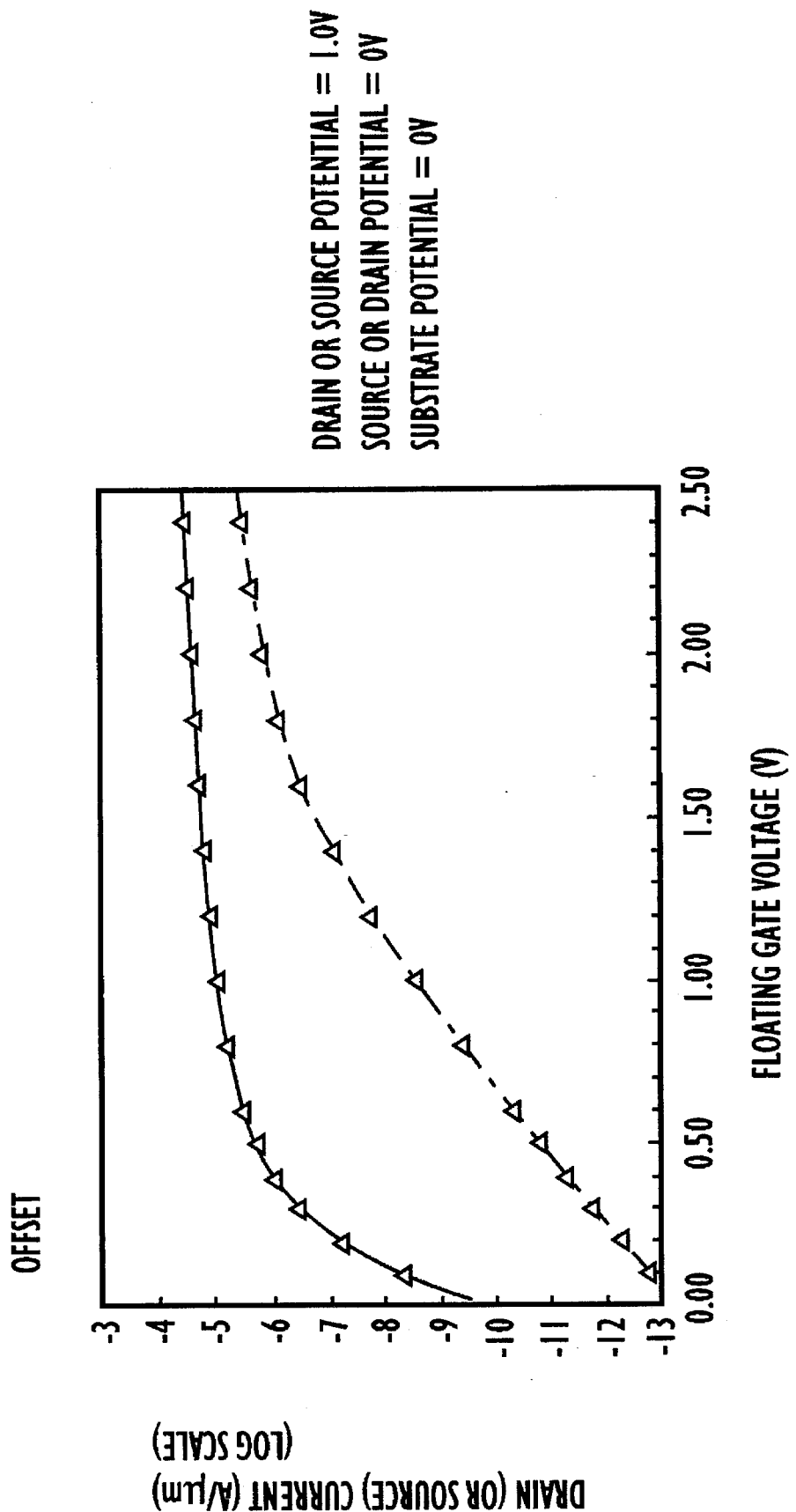
FIG. 7 is a graph showing simulation results of the voltage-current characteristic of a memory cell in accordance with the second embodiment of the present invention.

Referring again to FIG. 6d, a section, composed of the n$^+$ layer 30, the offset region 29, and a channel region, functions almost the same way that a diode does. This is explained as follows. FIG. 7 is a graph showing simulation results of the voltage-current characteristic of a memory cell including such an offset region 29. Whereas the ordinate indicates the memory cell operating current, the abscissa indicates the gate (floating gate) voltage. The gate length is 0.5 μm. The offset amount is 0.2 μm. The drain-source voltage is 1 V. In the FIG. 7 graph, the solid line indicates voltage-current characteristics when a zone on the n$^+$ layer 30 located next to the offset region 29 is set a high potential level while the broken line indicates the voltage-current characteristic when a zone on the n$^+$ layer 30 located next to the offset region 29 is set to a low potential level. As can be seen from the FIG. 7 graph, the value of current in the forward direction differs from the value of current in the reverse direction by more Than two positions, in other words source-drain voltages of different potential levels produce different current characteristics. The present embodiment provides a structure of the memory cell which, for the sake of convenience, can be represented as a structure in which a diode is formed on the n$^+$ region's 30 side. In an actual memory cell structure of the present embodiment, however, a section functionally equivalent to a diode is formed between a source region and a drain region.

In comparison with a memory cell having a Schottky diode of the first embodiment, a memory cell with an offset region of the present embodiment is poor at cutting off a one-way electric current. In spite of such a disadvantage, the present memory cell can provide the same effect that the first embodiment memory cell accomplishes, since the value of resistance greatly varies depending on the current flow direction. Additionally the present memory cell structure provides the advantage that it requires a less number of fabrication steps because there is no need for providing a step of exposing a resist to light.

Figure 8:
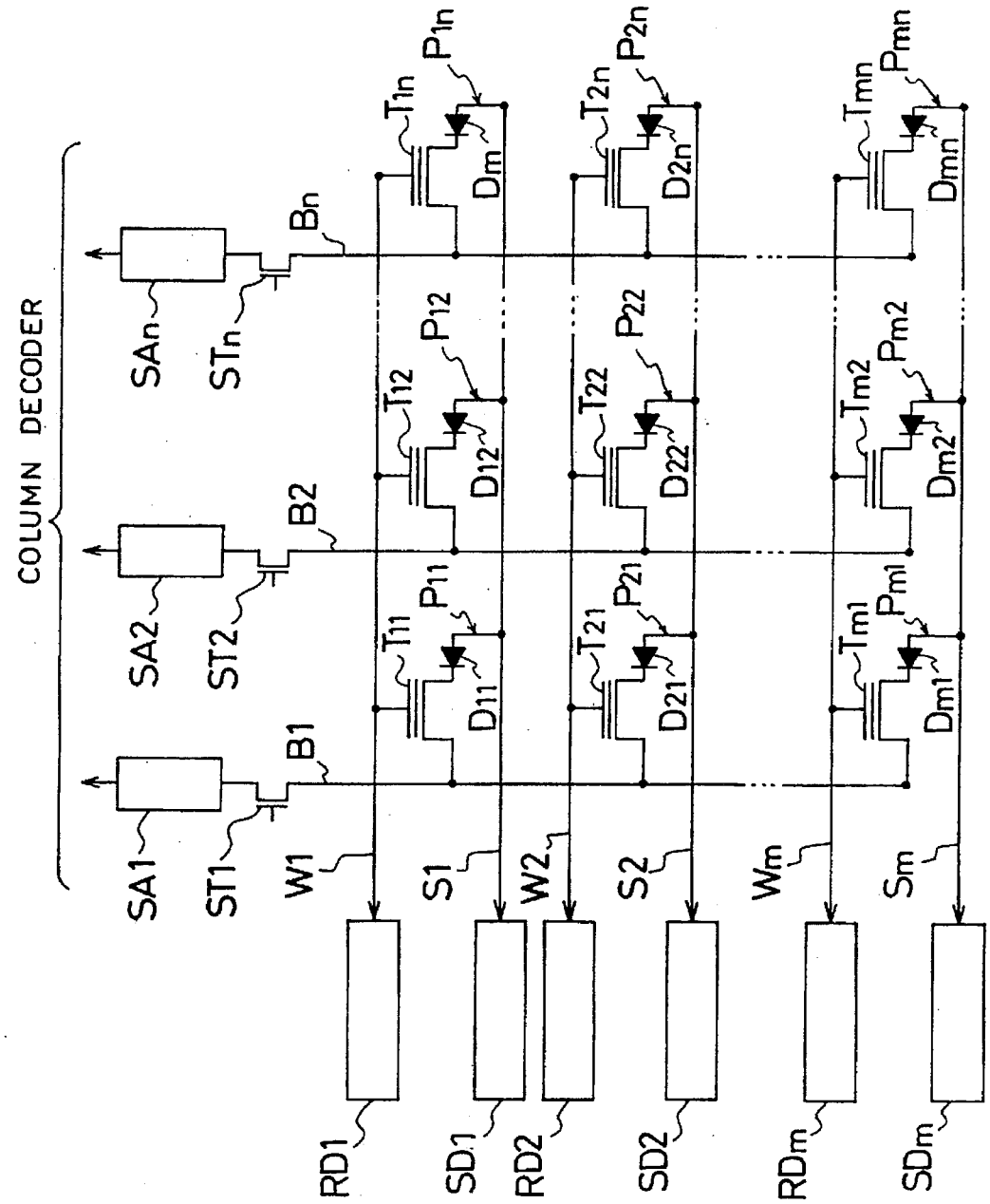
FIG. 8 is a circuit diagram of a memory cell array of the second embodiment.
Figure 9:
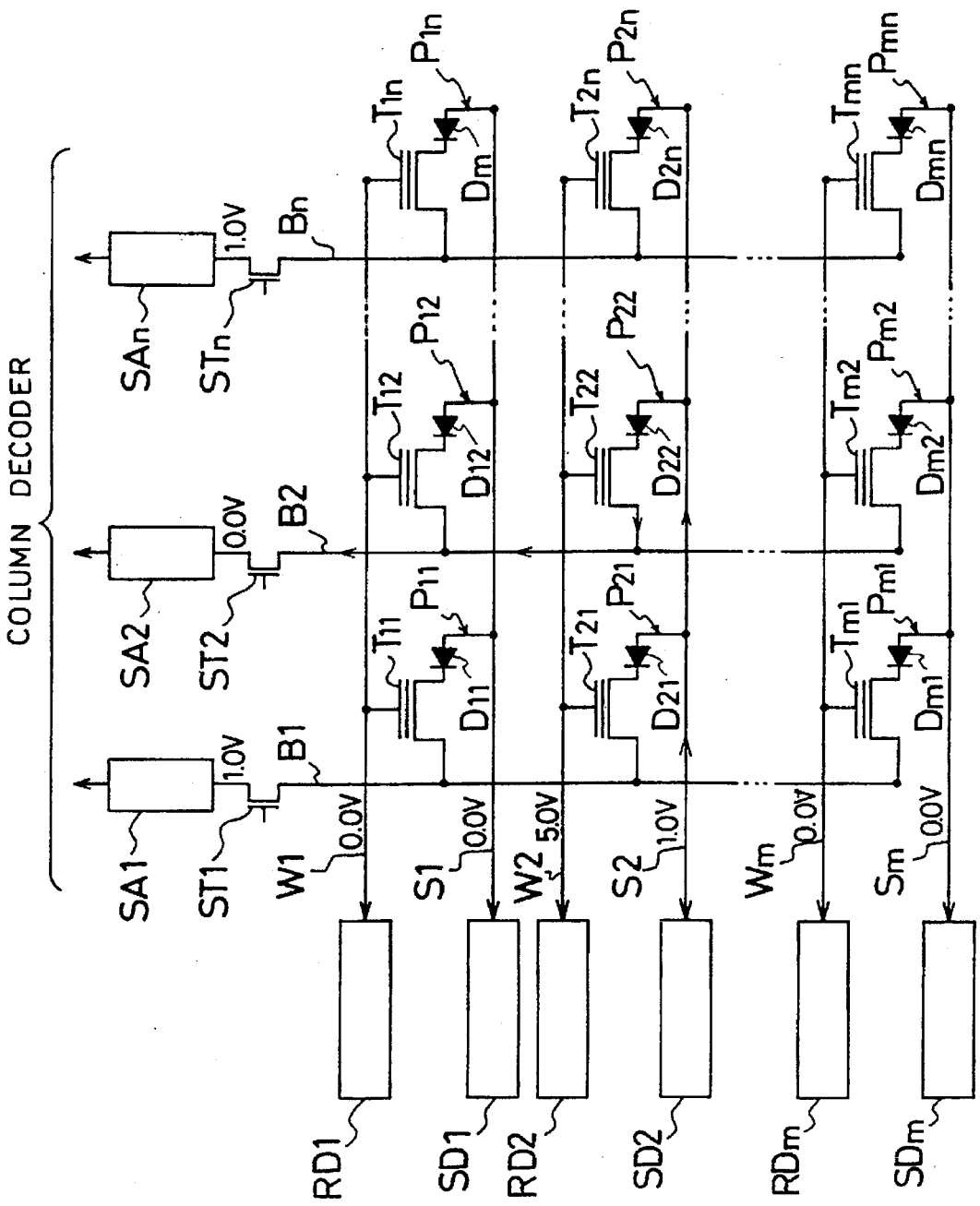
FIG. 9 is a circuit diagram useful in understanding the 1-bit reading of a memory cell array of the second embodiment.

A reading operation of extracting information out of a memory cell of the second embodiment semiconductor memory is explained by making reference to FIGS. 8–10. Also in the present embodiment, as in the first embodiment, the n$^+$ 30 layer located next to the offset region 29 may be either a drain or a source. Here, assuming the n$^+$ 30 layer is a source, the description will be made. For the case of the n$^+$ 30 layer being a drain, the same reading method as used in the first embodiment may be available.

FIG. 8 schematically shows a memory cell array structure of the present embodiment. Each memory cell has on its source side a DIODE D that is operable to accept only a one-way current flowing from source to drain (i.e., From a sourceline to a bitline). A current flowing from source to drain and a memory cell operating current are almost identical with each other, and most of a current flowing from drain to source is cut off by DIODE D.

A reading operation is accomplished as follows (see FIG. 9). Assuming MEMORY CELL (T11) and MEMORY CELL (T12) are now being over-depleted, in other words these two memory cells are having a negative threshold voltage, a reading operation of extracting an item of data out of MEMORY CELL (T22) is described. WORDLINE W2, which is a selected wordline, is set to Vcc (for example, 5 V). WORDLINES W1, W3–Wm, which are deselected wordlines, are set to Vss (for example, 0 V). At the same time, SOURCELINE S2, which is a selected sourceline, is set to Vrm (1 V) while SOURCELINES S1, S3–Sm, which are deselected sourceline, are set to Vss. BITLINE B2, which is a selected bitline, is set to Vss via a corresponding sense amplifier, while BITLINES B1, B3–Bn, which are deselected bitlines, are set to Vrm. BITLINE B is in fact coupled to SENSE AMPLIFIER SA, as a result of which the bitline potential changes slightly from Vss. However, for the sake of easy understanding of the description, it is assumed that the bitline potential is constant at Vss. If MEMORY CELL (T22) has a "zero" state, then MEMORY CELL (T22) will pass no current. Although MEMORY CELL (T12) is being over-depleted, no current flows in MEMORY CELL (T12) because BITLINE B2 and SOURCELINE S1 are at the same potential. Therefore no current will flow through BITLINE B2, which guarantees that MEMORY CELL (T22) is detected to be having a "zero" state without fail.

If MEMORY CELL (T22) has a "one" state, then MEMORY CELL, (T22) operates and a current flows. The potential of BITLINE B2 slightly increases. At this point in time, there is produced a potential difference between SOURCELINE S1 and BITLINE B2. Even if MEMORY CELL (T12) is being over-depleted, no current flows through MEMORY CELL (T12) because of DIODE D12 coupled to the drain of MEMORY CELL (T12) (reverse bias). The potential of BITLINE B2 will not be brought back to a Vss. A current flows through BITLINE B2, from which MEMORY CELL (T22) can be detected to be having a "one" state without fail. MEMORY CELL (T11) is also over-depleted thereby to create a potential difference of 1 V between SOURCELINE S1 and BITLINE B1. However, no current will flow through MEMORY CELL (T11) and through BITLINE B1 because of the existence of DIODE D11 coupled to the drain of MEMORY CELL (T11) (reverse bias). No excess power is consumed. The selected bitline potential and the deselected sourceline potential are set at Vrm. However, Vcc may be used instead of Vrm.

Further, in the above-described reading method, the selected bitline potential is set to Vss via a sense amplifier. However, when a sense amplifier needs a reference potential, the selected bitline potential (SBLP) may be set such that Vss<SBLP<Vrm.

Next, referring to FIG. 10, a reading operation of extracting items of data from a group of all memory cells associated with a single wordline is described. Assuming MEMORY CELL (T11) and MEMORY CELL (T12) are being over-depleted, a reading operation of extracting items of data from a group of all memory cells associated with WORDLINE W2 is explained here. WORDLINE W2, which is a selected wordline, is set to Vcc (for example, 5 V). WORDLINES W3–Wm, which are deselected wordlines, are set to Vss (0 V). Simultaneously, SOURCELINE S2, which is a selected sourceline, is set to Vrm (1 V) while SOURCELINES S1, S3–Sm, which are deselected sourcelines, are set to Vss. Each BITLINE B1–Bn is set to Vss via a respective sense amplifier. BITLINE B is coupled to SENSE AMPLIFIER SA, as a result of which the bitline potential changes slightly from Vss. However, for the sake of easy understanding of the description, it is assumed that the bitline potential is constant at Vss.

For example, when MEMORY CELL (T2n) has a "zero" state, then MEMORY CELL (T2n) is off, no current flows through BITLINE B, and the bitline potential does not change. On the other hand, when MEMORY CELL (T21) and MEMORY CELL (T22) each have a "one" state, both of them operate and current flows. The potential of BITLINE B2 slightly goes up. Such a difference in the bitline potential is detected by a sense amplifier. Although MEMORY CELL (T11) and MEMORY CELL (T12) are being over-depleted, SOURCELINE S1 and all the bitlines are at the same potential, i.e., at Vss and no current flows. Although DIODE D slightly passes a leakage current even when reverse-biased, such a leakage current can be controlled by the above-described reading method. Less power consumption is accomplished. Additionally, in the present reading method, unlike a conventional reading method of extracting items of data out of a group of all memory cells associated with a single word line, voltage application is carried out to a selected wordline and to a selected sourceline only, and less power is consumed at the beginning of a read.

In the second embodiment reading method, the selected sourceline potential is Vrm (e.g., 1 V); however, it may be Vcc.

Further, in the above-described reading method, the selected bitline potential is set to Vss via a sense amplifier. However, when a sense amplifier needs a reference potential, the selected bitline potential (SBLP) may be set such that Vss<SBLP<Vrm.

Next, another reading operation is described which is executed with the potential of wordlines kept at Vss (the ground level). This reading operation is similar to a reading operation of FIG. 9 or to a reading operation of FIG. 10. In the present reading operation, however, each of WORDLINES W1–Wm is set to Vss (for example, 0 V), which is not described with a figure. If the threshold voltage of a memory cell in the "one" state is set to have a negative value, then the memory cell passes a current if it has a "one" state while the memory cell passes no current if it has a "zero" state, even if the wordline potential is set at Vss (e.g., 0 V). So even when each of WORDLINES W1–Wm is set to Vss (e.g., 0 V), data can be extracted by deflecting the state of a memory cell from the presence or absence of a current flowing in the memory cell. In other words, if SOURCELINE S2, which is a selected sourceline, is set to Vrm (for example, 1 V), if SOURCELINES S1, S3–Sm, which are deselected sourcelines, are set to Vss, if BITLINE B2, which is a selected bitline, is set to Vss via a corresponding sense amplifier, and if BITLINES B1, B3–Bn, which are deselected bitlines, are set to Vrm, this enables a memory cell selected by SOURCELINE S2 and BITLINE B2 to be read. During the reading operation, the wordline potential does not change. This reduces the power consumption and the supply voltage. In the above-described reading method, the selected sourceline potential is Vrm (for example, 1 V). However, the selected sourceline potential may be Vcc.

Further, in the above-described reading method, the selected bitline potential is set to Vss via a sense amplifier. However, when a sense amplifier needs a reference potential, the selected bitline potential (SBLP) may be set such that Vss<SBLP<Vrm.

A writing operation by means of hot electrons is now described. In the present embodiment, a structure is provided wherein a memory cell accepts a channel current, only from a sourceline. The selected wordline potential is see to a high level while the deselected wordline potential is set to Vss, and the selected sourceline is set to a high level while the deselected sourceline potential is set to Vss or is brought to a "float", and the selected bitline potential is set to Vss while the deselected bitline potential is set to a high level. As a result of the potential setting, a current flows from a source to a drain of a selected memory cell, whereupon hot electrons are created and data is written into the selected memory cell.

Next, another writing operation is described which is executed with the wordline potential kept at Vss. If the memory cell threshold voltage in the "one" state is set negative, a current flows even if the wordline potential is set to Vss (for example, 0 V). With the wordline potential kept at Vss, if the selected sourceline potential is set to a high level, and if the deselected sourceline potential is set to Vss, and if the selected bitline potential is set to Vss, and if the deselected bitline potential is set to a high level or is brought to a "float", hot electrons are generated in a memory cell selected. In this way, a memory cell having a "one" state makes a transition to a "zero" state.

The above-described writing method may be used for bringing an over-depleted memory cell back to a high threshold voltage level.

In the present embodiment, DIODE D is provided on the drain side, so that a high electric field is likely to be created between a drain and a floating gate. Therefore, a writing operation by means of hot electrons used in a conventional flash-type EEPROM is preferable in comparison with a writing operation by means of F-N current.

EMBODIMENT 3

Figure 11A:
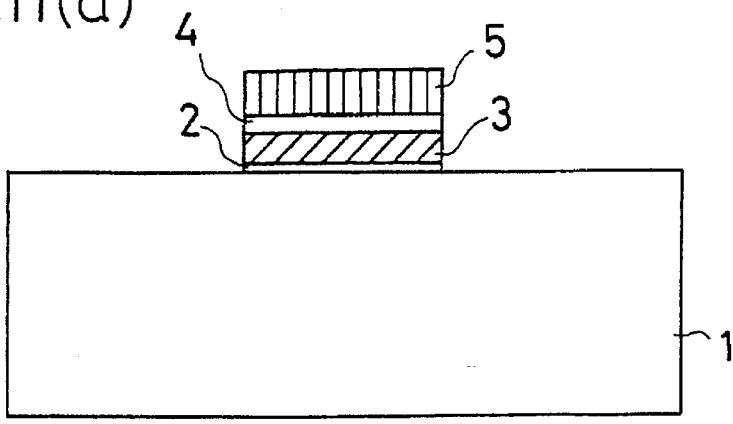
FIG. 11, comprised of 11a–11c, shows in cross section a sequence of the fabrication of a memory cell in accordance with a third embodiment of the present invention.
Figure 11B:
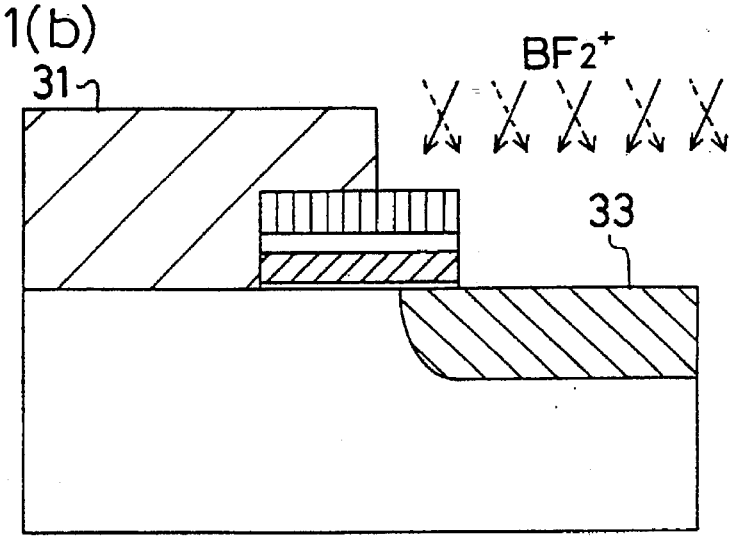
Figure 11C:
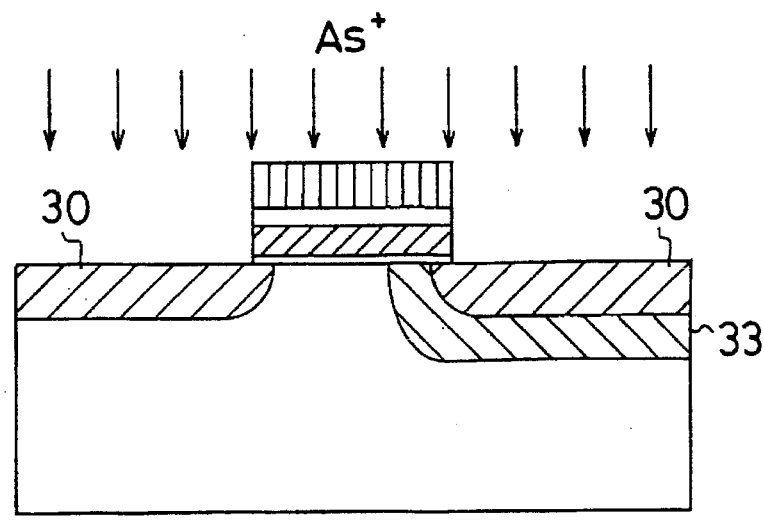
Figure 12:
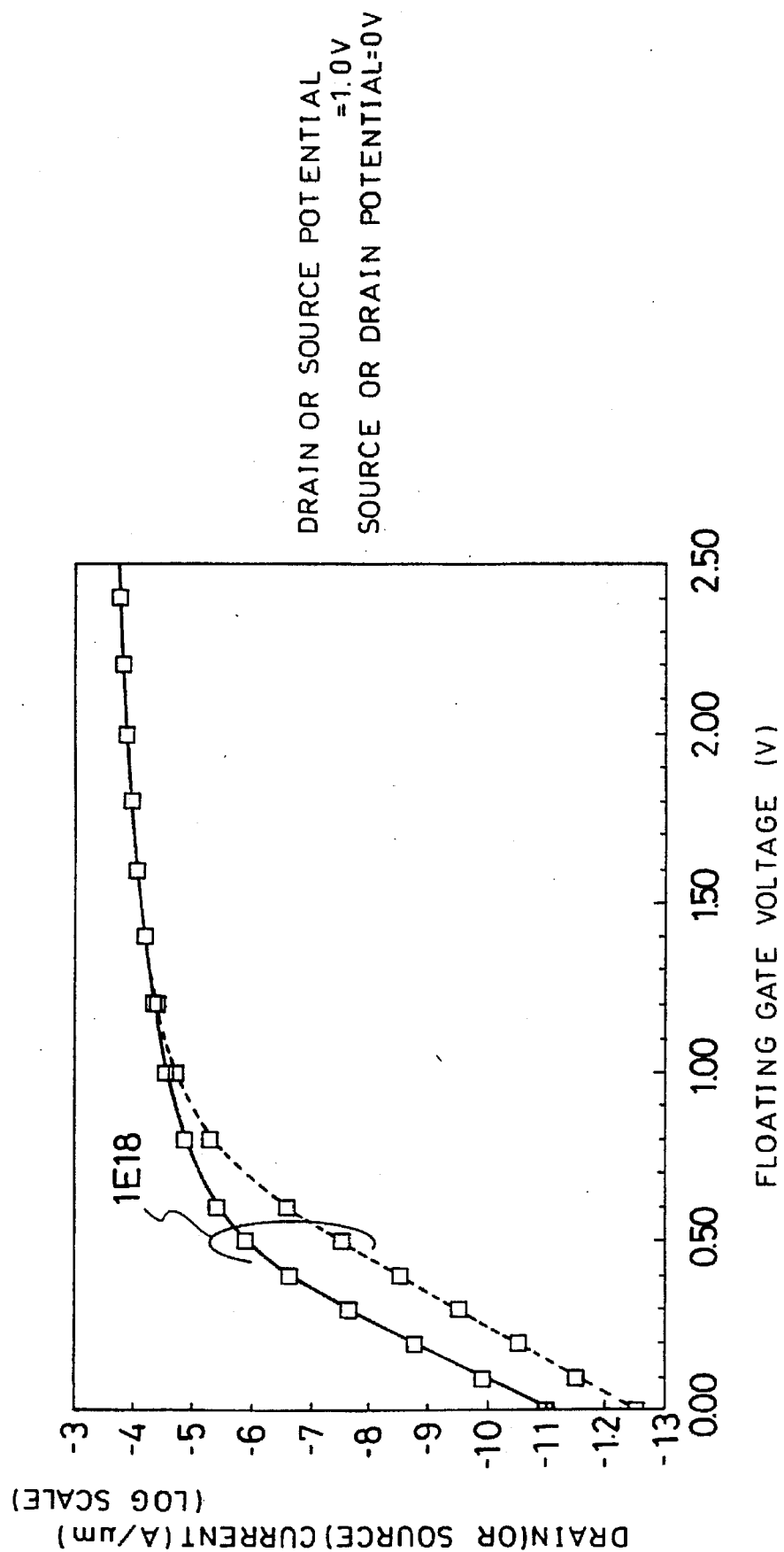
FIG. 12 is a graph showing simulation results of the voltage-current characteristic of a memory cell in accordance with the third embodiment of the present invention.

A semiconductor memory of the third embodiment of the present invention is described. FIG. 11a illustrates a stack-type floating gate structure of the present embodiment similar to the one as shown in FIG. 2a. Applied onto the semiconductor substrate 1 is a resist 31. The resist 31 is selectively removed such that other areas other than an area where a diode is formed are exposed, and an implantation with $BF_2^+$ ions, indicated by reference numeral 32, is performed at an implantation angle of 45 degrees at an implantation energy of 60 keV at a dose of 6E12 atoms/cm$^2$, to form a p-type layer 33 (see FIG. 11b). Other ion implantation parameters may be used. In a fabrication step of FIG. 11c, an implantation with As$^+$ ions is performed whereupon an n$^+$ layer 30 is formed having a high concentration. At a step of FIG. 11c, a p-type layer 33 is formed by means of a doping process using low-concentration impurities, which is located underneath one of the n$^+$ layers 30, 30 one of which acts as a memory cell source and the other of which acts as a memory cell drain. As a result of the formation of the p-type layer 33, the expansion of depletion is controlled. The present embodiment provides the same effects that a technique in which a diode is formed between source and drain regions does. FIG. 12 is a graph showing simulation results of the voltage-current characteristic of a memory cell having a p-type layer 33 formed underneath one of two n$^+$ layers 30, 30. Whereas the ordinate indicates the memory cell operating current, the abscissa indicates the gate (floating gate) voltage. The gate length is 0.5 μm. The layer 33 has a concentration of 1E18 atoms/cm$^3$. There is no offset condition and the drain-source voltage is 1 V. In the FIG. 12 graph, the solid line indicates the voltage-current characteristic when an area on the n$^+$ layer 30 located next to the p-type layer 33 is set to a high potential level while the broken line indicates the voltage-current characteristic when an area on the n$^+$ layer 30 located next to the p-type layer 33 is set to a low potential level. As can be seen from FIG. 12 graph, the value of current in the forward direction differs from the value of current in the reverse direction by one or more positions. The present embodiment provides a structure of the memory cell which, for the sake of convenience, can be represented as a structure in which a diode is formed on the n$^+$ region's 30 side. In an actual memory cell structure of the present embodiment, however, a section functionally equivalent to a diode is formed between a source region and a drain region.

The n$^+$ layer 30 may be brought to an offset condition by increasing the concentration of the p-type layer 33. The FIG. 11 memory cell differs from the FIG. 6 memory cell in that the former does not require a step of forming a sidewall.

EMBODIMENT 4

Figure 13A:
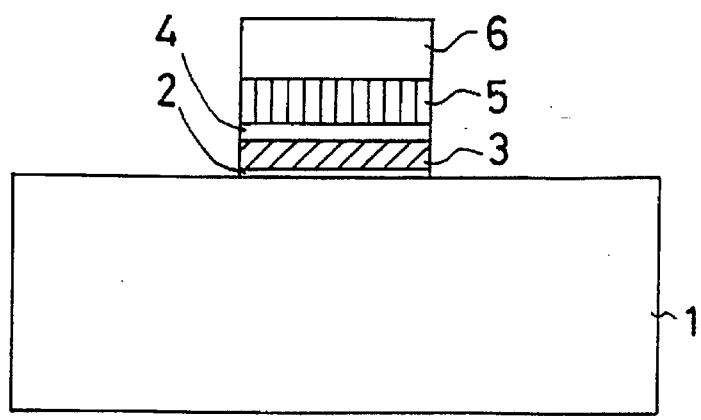
FIG. 13, comprised of 13a–13c, shows in cross section a sequence of the fabrication of a memory cell of a fourth embodiment up to a step of forming an n⁺ layer.
Figure 13B:
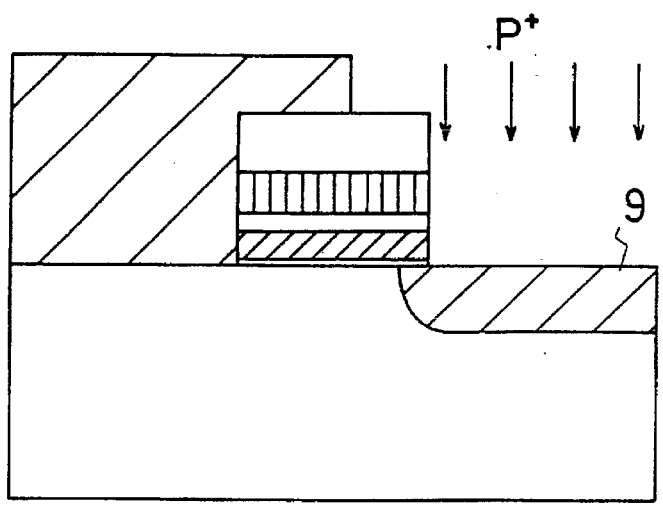
Figure 13C:
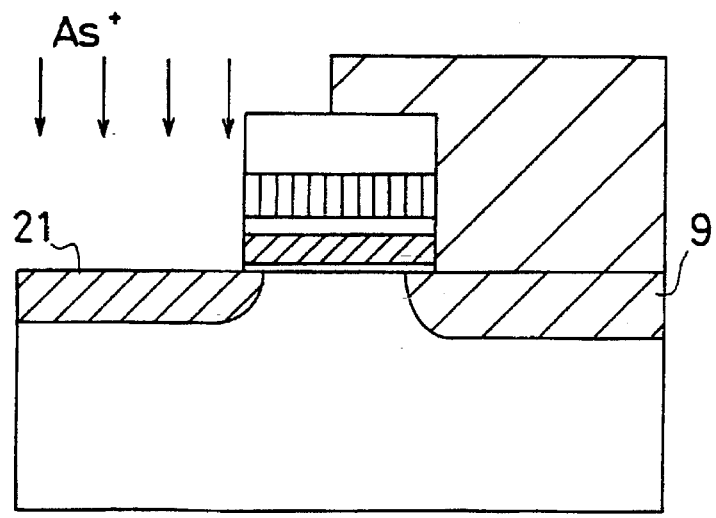

The fabrication of a semiconductor memory of the fourth embodiment is described. FIG. 13a illustrates a stack-type floating gate structure similar to the one as shown in FIG. 2a. A resist is applied. An implantation with P$^+$ ions is performed on a region where DIODE D is formed at a later step, to form an n$^-$ layer 9 having a desired concentration (see FIG. 13b). Next, an implantation with As$^+$ ions is performed on other regions other than the aforesaid diode formation region, to form an n$^+$ layer 21 having a high concentration (see FIG. 13c). An SiO$_2$ layer 22, as a passive layer, is deposited by means of a CVD technique (see FIG. 14a). This SiO$_2$ 22 layer is etched back such that a sidewall 28 is left on a gate sidewall of the diode formation region (see FIG. 14b). A resist 31 is applied. The resist 31 is selectively removed such that the diode formation region becomes exposed. An implantation with $BF_2^+$ ions is performed to form a p-type layer 61. The FIG. 14b memory cell has a PN diode located in a region which, in a conventional stack-type floating gate memory cell, is used for forming a drain or source region. The provision of a PN diode, however, will not increase the area of memory cells.

In this case, diode characteristics are obtained. A memory cell having a structure of the present embodiment can be represented as a memory cell in which a PN diode is formed in a region next to a drain or source (see FIG. 14b).

EMBODIMENT 5

The fifth embodiment of the present invention relates to improvements in the first embodiment structure for accomplishing a larger scale of integration. Since a semiconductor memory of the fifth embodiment can be represented using the FIG. 42 circuit diagram, the circuit structure of the present semiconductor memory is not described here accordingly. For example, the drain of MEMORY CELL (T21a) is connected to one terminal of DIODE D21a and the drain of MEMORY CELL (T21b) is connected to one terminal of DIODE D21b. The other terminals of DIODES D21a, D21b are connected to BITLINE B1. The source of MEMORY CELL (T21a) is connected to SOURCELINE S2. The source of MEMORY CELL (T21b) is connected to SOURCELINE S3. In other words, a pair of memory cells (e.g., MEMORY CELLS (T21a), (T21b)) have sources connected to different sourcelines (e.g., SOURCELINES S2, S3) and drains connected to a common bitline (e.g., BITLINE B1). No memory cells are placed next to MEMORY CELLS (T21a), (T21b) associated with BITLINE B1. With respect to BITLINE B2, a pair of MEMORY CELLS (T12a), (T12b) and a pair of MEMORY CELLS (T32a), (T32b) are arranged at intervals of 2 bits. The drains of MEMORY CELLS (T12a), (T12b) are connected to a common bitline, i.e., BITLINE B2, via DIODES D12a, D12b, respectively. The source of MEMORY CELL (T12b) is connected to SOURCELINE S2 to which the source of the memory cell (T21a) is connected. Likewise, the drains of MEMORY CELLS (T32a), (T32b) are connected to a common bitline, i.e., BITLINE B2, via DIODES D32a, D32b, respectively. The source of MEMORY CELL (T32b) is connected to SOURCELINE S3 that the source of MEMORY CELL (T21b) is connected to.

Arranged between SOURCELINES S1 and S2 are two wordlines, i.e., WORDLINES W1a and W1b. Arranged between SOURCELINES S2 and S3 are two wordlines, i.e., WORDLINES W2a and W2b. BITLINES B1, B2, B3 are in vertical cross arrangement with respect to WORDLINE W and SOURCELINE S, thereby providing a pattern of crossed lines of a "checkerboard" for arrangement of MEMORY CELLS (T) in pairs of two bits. The gate of MEMORY CELL (T), which is of an NOR-type, is connected to WORDLINE W. WORDLINE W1a is connected to ROW DECODER RD1a. WORDLINE W1b is connected to ROW DECODER RD1b. WORDLINE W2a is connected to ROW DECODER RD2b. WORDLINE W2b is connected to ROW DECODER RD2b. WORDLINE W3a is connected to ROW DECODER RD3a. WORDLINE W3b is connected to ROW DECODER RD3b. SOURCELINES S1, S2, S3 are connected to SOURCE DECODERS SD1, SD2, SD3, respectively. BITLINE B1 is connected, via COLUMN SELECTION TRANSISTOR ST1, to SENSE AMPLIFIER SA1 which is connected to a column decoder. BITLINE B2 is connected, via COLUMN SELECTION TRANSISTOR ST2, to SENSE AMPLIFIER SA2 which is connected to a column decoder. BITLINE B3 is connected, via COLUMN SELECTION TRANSISTOR ST3, to SENSE AMPLIFIER SA3 which is connected to a column decoder.

In the present embodiment, reading is accomplished in the same way as in the first embodiment. FIG. 16a shows a 1-bit reading operation for reading MEMORY CELL (T21a) (see arrows in the figure). FIG. 16b shows a multi-bit reading operation for reading every memory cell in a single wordline (see arrows in the figure). In the FIG. 16b reading operation, data is put out every other bitline. As shown in FIG. 16c, two wordlines (e.g., WORDLINES W1b, W2a facing each other across SOURCELINE S2) are selected simultaneously thereby to read MEMORY CELL (T12b) and MEMORY CELL.(T12a). Additionally, every memory cell associated with WORDLINES W1b, W2a can be read (see FIG. 6d). In such a reading operation, data is outputted from each bitline and thus each bitline must be provided with a respective sense amplifier.

In the present embodiment, memory cells in pairs are placed in checkerboard arrangement. However, for the case of a pair of memory cells whose drains are coupled to a common bitline, such checkerboard arrangement may not be considered necessary. For example, where sourcelines are arranged between each wordline, in adjoining arrangement, memory transistors in pairs may be squeezed in rows and columns.

Figure 17A:
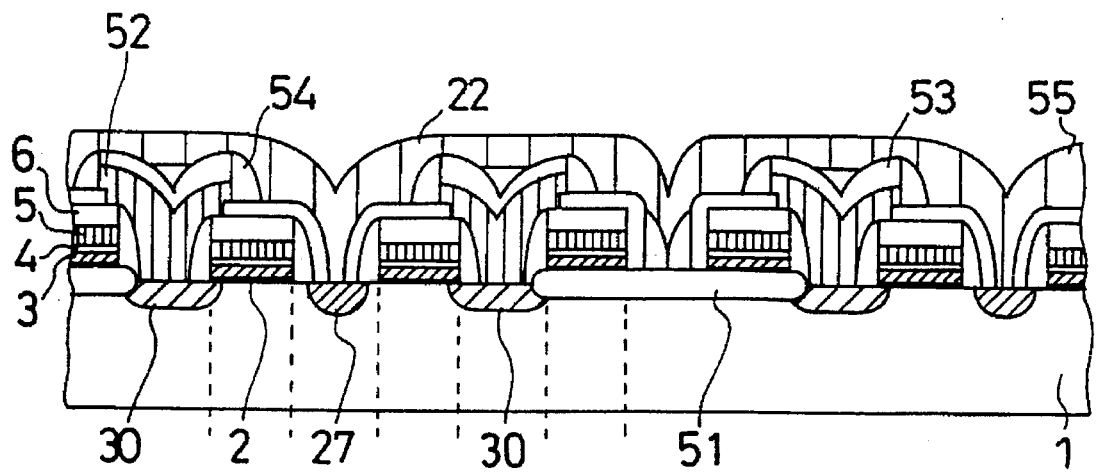
FIG. 17a shows, in cross section taken along in a direction parallel with a memory cell bitline, a memory cell of the fifth embodiment
Figure 17B:
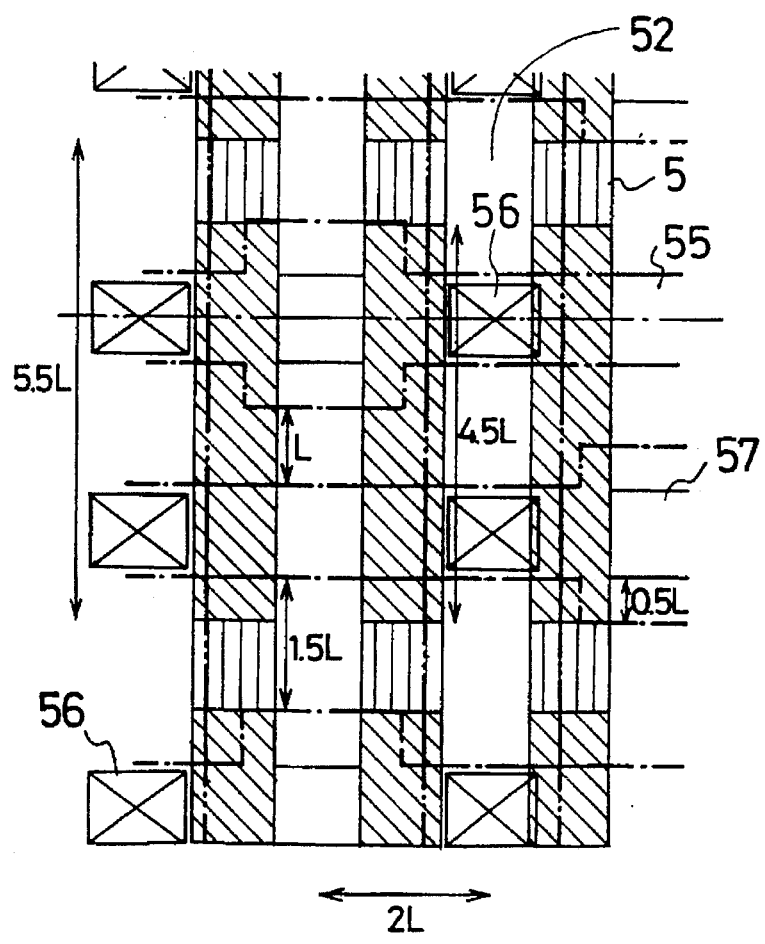
FIG. 17b is the corresponding top plan view.
Figure 18:
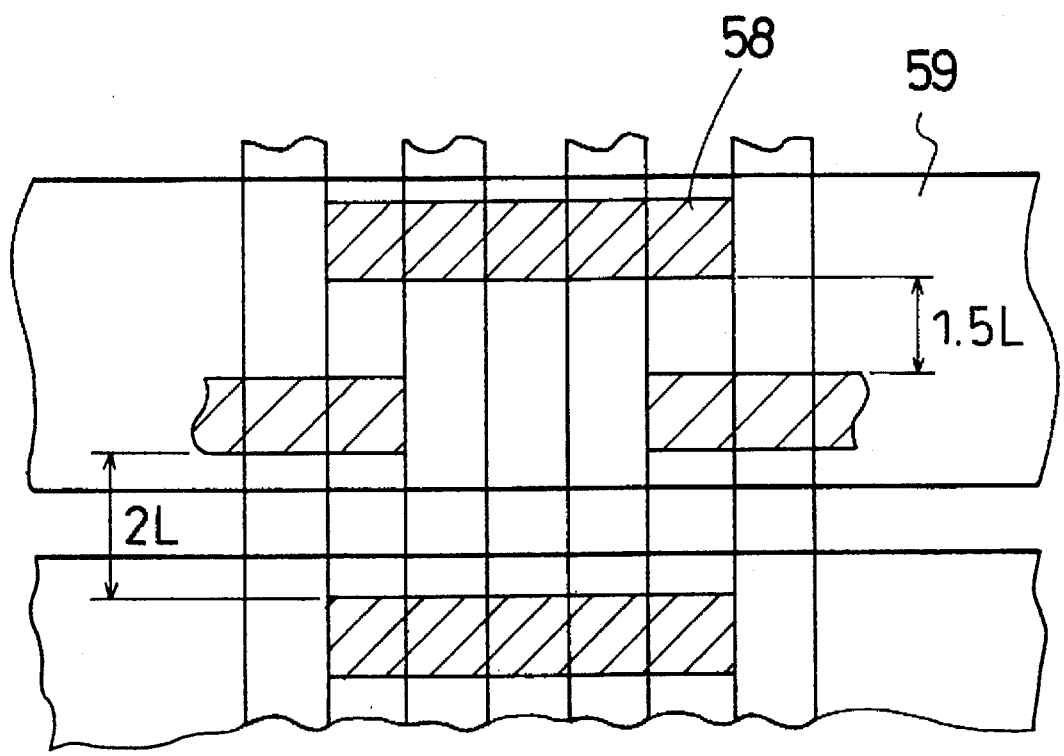
FIG. 18 is a top plan view showing a state after a first patterning step of patterning a floating gate of a memory cell of the fifth embodiment is carried out.
Figure 19:
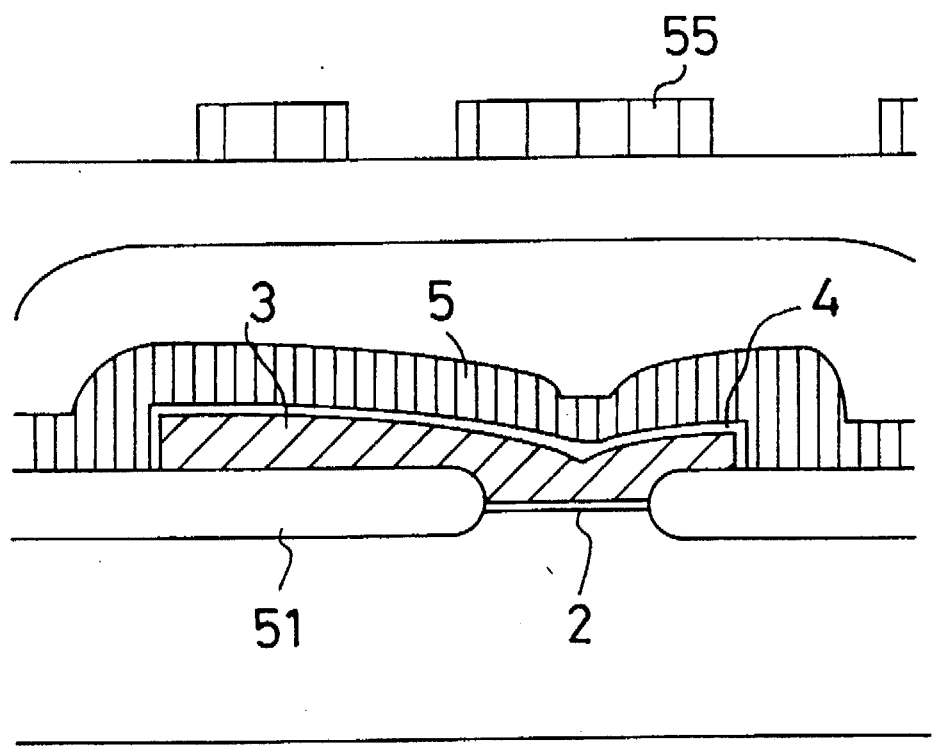
FIG. 19 shows, in cross section taken along in a direction in parallel with a memory cell wordline, a memory cell of the fifth embodiment.

The structure of MEMORY CELL (T) is now described. FIG. 17a shows MEMORY CELL (T) in cross section taken along in a direction in parallel with BITLINE B, and FIG. 17b is the corresponding top plan view. FIG. 18 shows patterning of a floating gate. FIG. 19 shows MEMORY CELL (T) in cross section taken along in a direction in parallel with WORDLINE W. 1 is a semiconductor substrate. 2 is a tunnel $SiO_2$ layer. 3 is a floating gate. 4 is a capacitance dielectric layer. 5 is a control gate. 6 is a layer of $SiO_2$. 22 is a layer of $SiO_2$. 27 is an offset drain. 28 is a sidewall. 30 is a source. 51 is an isolator. 52 is a source wire. 53 is a passive dielectric layer. 54 is an interlayer dielectric film. 55 is a bit wire. 56 is a sourceline contact. 57 is a bitline contact. 58 is an active region. 59 is a post-patterning floating gate. Referring again to FIG. 18, the active region 58, which has a length five times a design rule L and a width of L, is stack-formed. The floating gate 59 is patterned in straight form in the length direction of the active region 58 (the first floating gate patterning). As shown in FIG. 17b, the control gate 5 which is a wordline is patterned at intervals according to design rules. At this point in time, the capacitance dielectric layer 4, the floating gate 3, and the tunnel $SiO_2$ layer 2 are etched in a self-matching manner (the second floating gate patterning). The source 30 is formed by means of an ion implantation. A layer of $SiO_2$ is deposited and etched back to form a sidewall. This is followed by an ion implantation for forming the offset drain 27 deposited on which are a wiring material and the $SiO_2$ layer 53. Thereafter the source wire 52 is patterned. The interlayer dielectric film 54 is deposited and etched back thereby to form an oversized contact hole for the bit contact 57 and a wiring material is deposited thereon. The bit wire 55 is patterned. As shown in FIG. 17b, the memory cell channel width direction is rate-determined by a bitline design rule and a mask alignment margin of the bit contact 57. Referring to FIG. 19, it is shown that the floating gate 3 is asymmetric to the active region 58, which results from linearly pattering the floating gate 3 in the length direction of the active region 58. Since linear patterning becomes easier to perform as design rules are reduced, the above provides advantages for miniaturization.

In FIGS. 17a and 17b, it is assumed that a mask alignment margin is ½ of a design rule, and a cell area is eleven times the square of a design rule. The mask alignment margin, however, depends on the lithography technique, so it may change.

The FIG. 17 memory cell is a Floating gate memory cell having a structure with an offset region in accordance with the second embodiment. However, a memory cell according to the first, third, or fourth embodiment may be used.

In the present embodiment, the active region 58 is rectangular. However, the active region 58 may partly be deformed to a lithography technique used.

In the present embodiment, the floating gate 3, the control gate 5, and the source wire 52 are linear but they may partly be deformed to a lithography technique used.

In the present embodiment, the source wire 52 is a wiring material but it may be formed by a diffused layer.

EMBODIMENT 6

Figure 15:
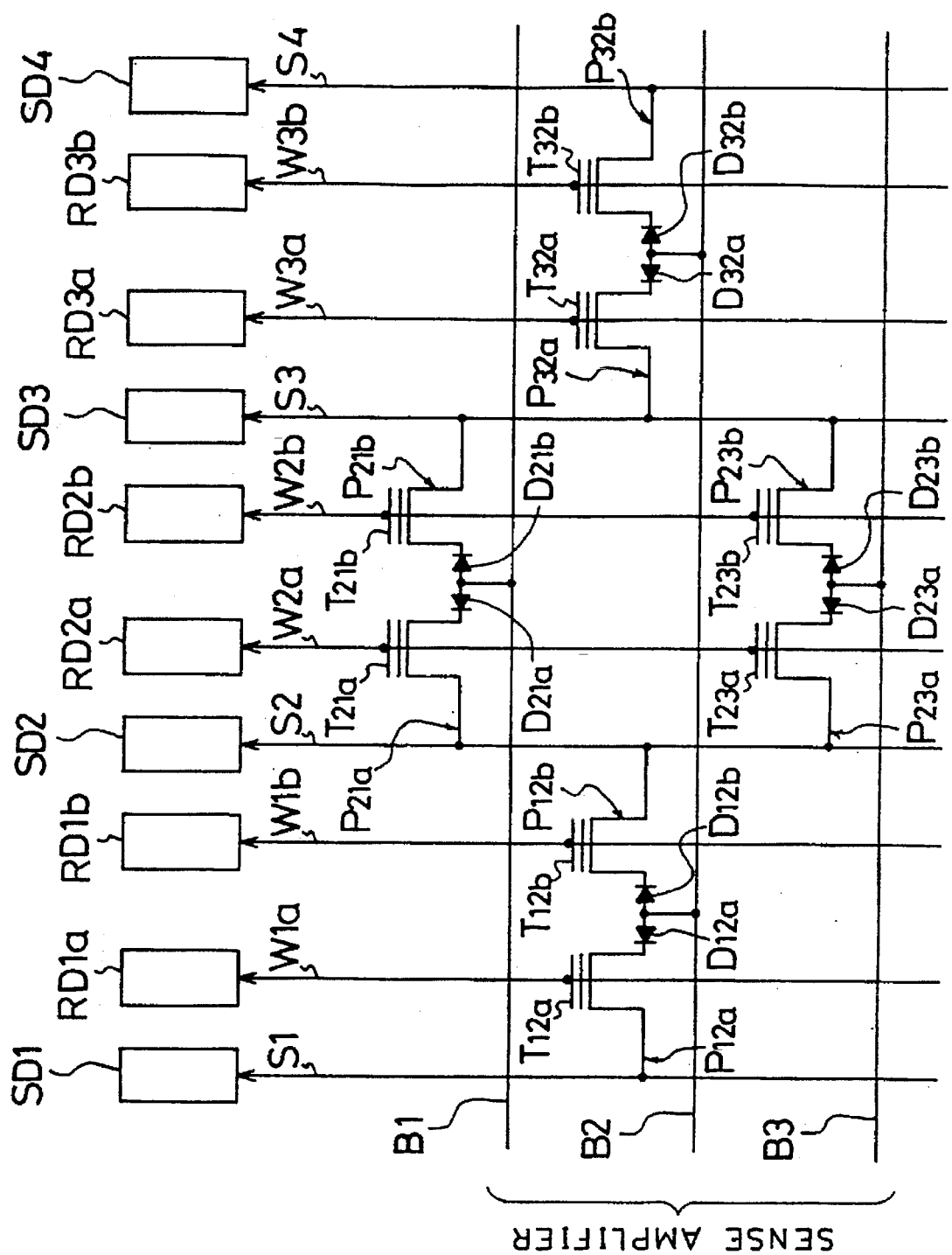
FIG. 15 is a circuit diagram depicting a memory cell array in accordance with a fifth embodiment of the present invention.
Figure 20:
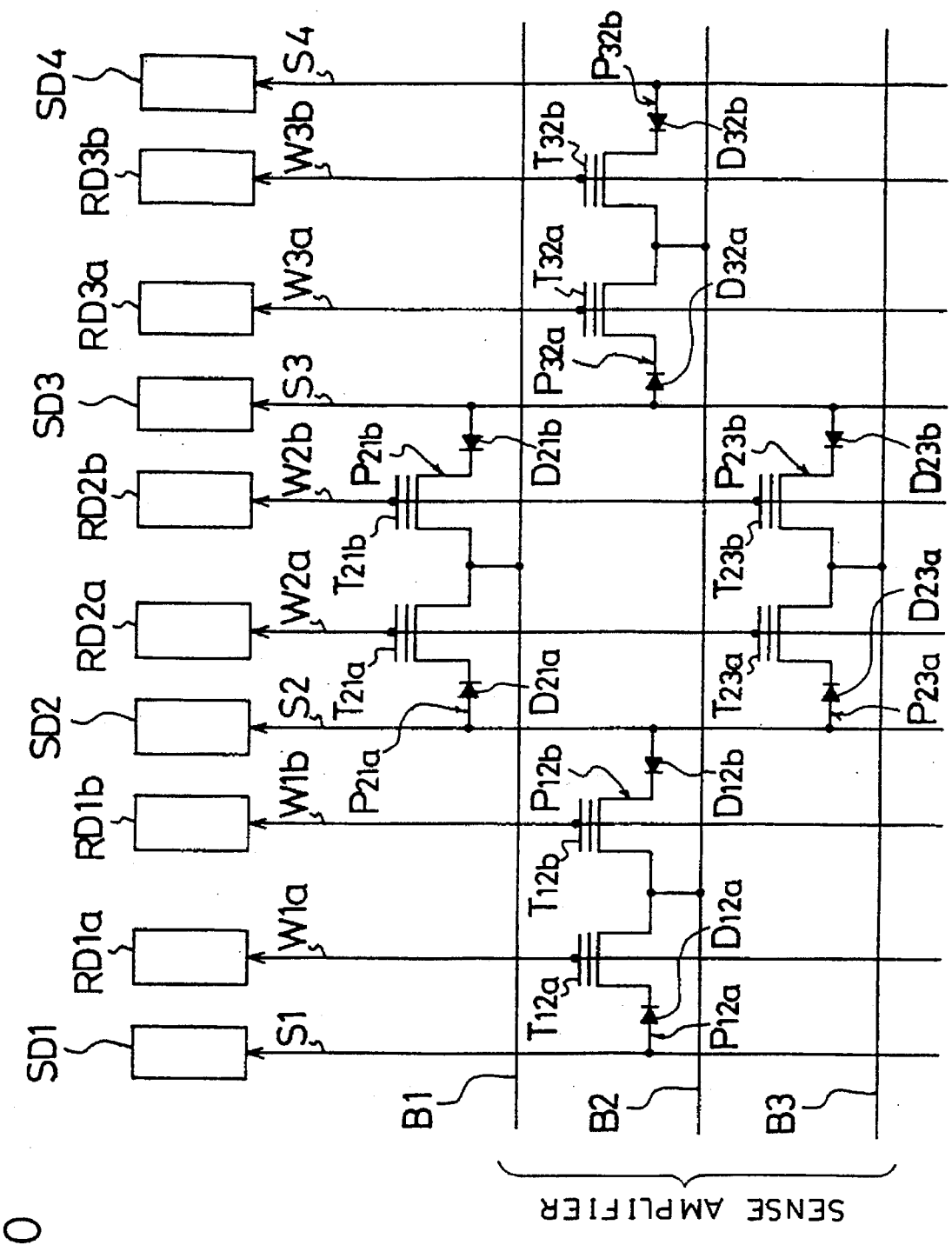
FIG. 20 is a circuit diagram of a memory cell array in accordance with a sixth embodiment of the present invention.
Figure 42:
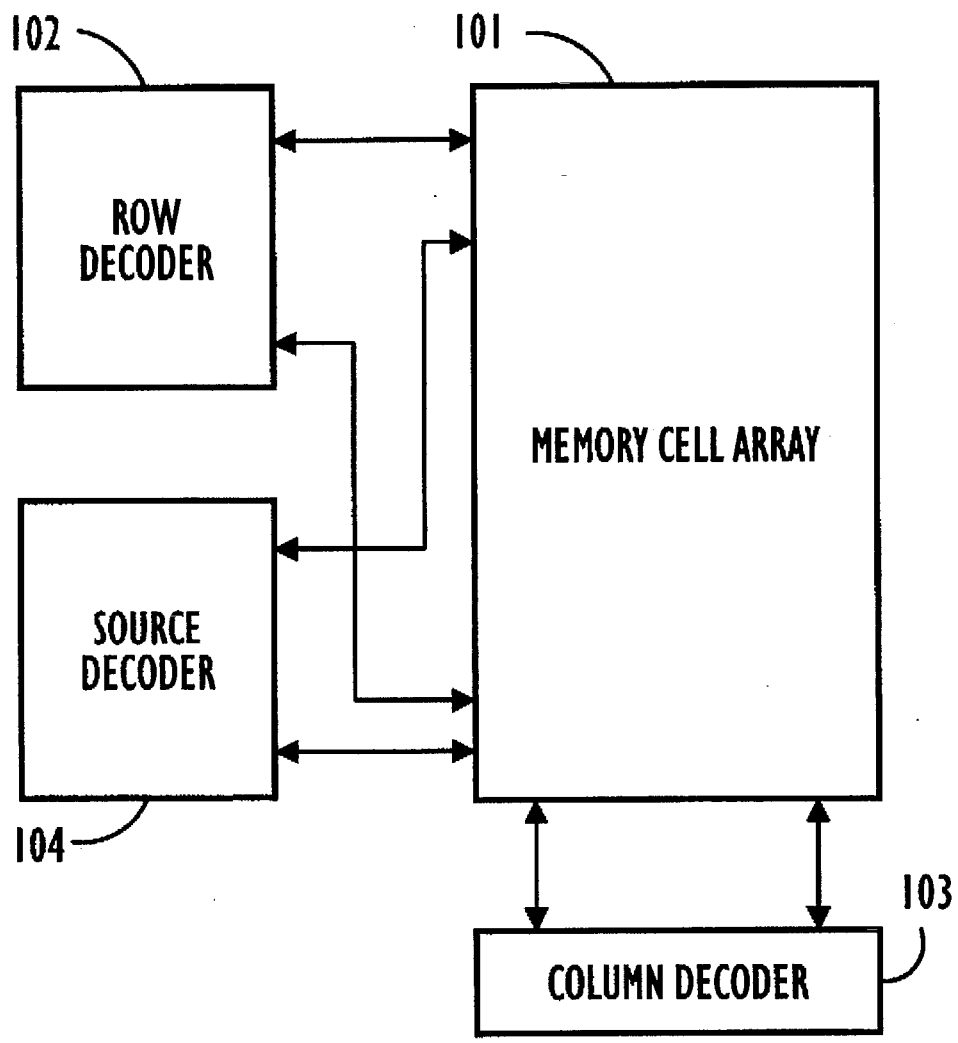
FIG. 42 shows in block form an entire semiconductor memory of a conventional type.

Since a semiconductor memory of the sixth embodiment can be represented using the FIG. 42 circuit diagram, the circuit structure of the present semiconductor memory is not described here accordingly. FIG. 20 is a circuit diagram illustrating part of a memory cell array of a flash-type EEPROM. The FIG. 20 circuit diagram is basically identical in interconnection relationship and in memory cell arrangement with the FIG. 15 circuit diagram (the fifth embodiment). A feature of the present embodiment is that a DIODE D is connected between the source of a MEMORY CELL (T) and a SOURCELINE S.

Figures 21A, 21B, 21C, 21D:
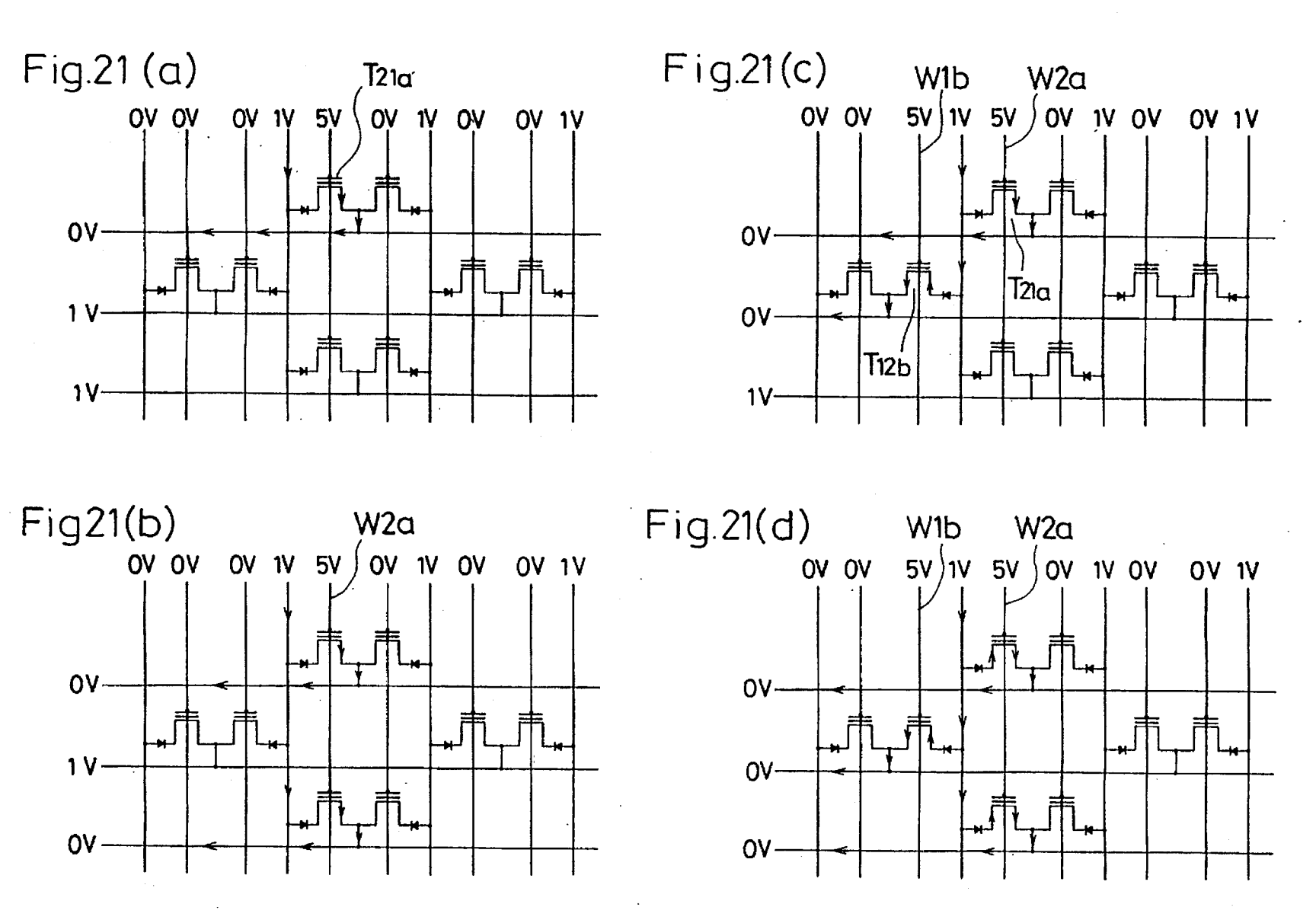

In the present embodiment, reading is accomplished in the same way as in the second embodiment. FIG. 21a shows a 1-bit reading operation for reading MEMORY CELL (T21a) (see arrows in the figure). FIG. 21b shows a multi-bit reading operation for reading every memory cell in a single wordline, i.e., WORDLINE W2a (see arrows in the figure). In the FIG. 21b reading operation, data is put out every other bitline. As shown in FIG. 21c, two wordlines (e.g., WORDLINE W1b and WORDLINE W2a) are selected at the same time thereby to read MEMORY CELL (T12b) and MEMORY CELL (T12a). Additionally, a group of all memory cells associated with WORDLINES W1b, W2a can be read (see FIG. 21d). In this reading operation, data is outputted from each bitline and thus each bitline must be provided with a sense amplifier.

Figure 22:
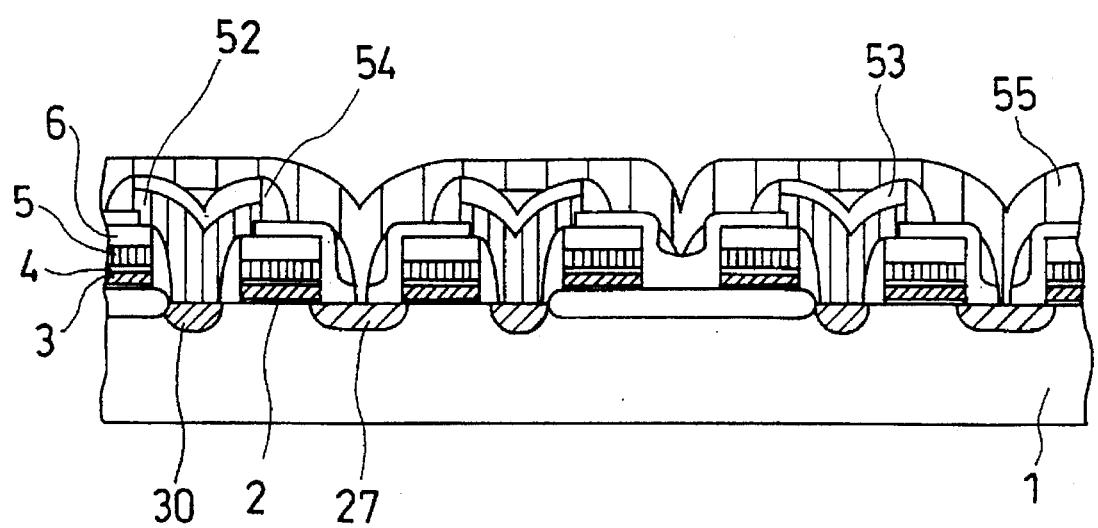
FIG. 22 shows a memory cell of the sixth embodiment in cross section taken along in a direction in parallel with a memory cell bitline.

FIG. 22 illustrates a memory cell of the present embodiment in cross section taken along in a direction in parallel with BITLINE B. In the present embodiment, like reference numerals have been used to indicate like elements of the memory cell and they are not described here accordingly. The FIG. 22 memory cell structure differs from the FIG. 17 memory cell structure in that in the former structure a diode structure is formed on the source side. Neither a top plan view nor a cross sectional view taken along in a direction in parallel with WORDLINE W is given since they are similar to the ones in the fifth embodiment.

A floating gate memory cell of FIG. 6 (the second embodiment) having an offset region is used in the present invention. However, a memory cell according to the first, third, or fourth embodiment may be used.

EMBODIMENT 7

Figure 23:
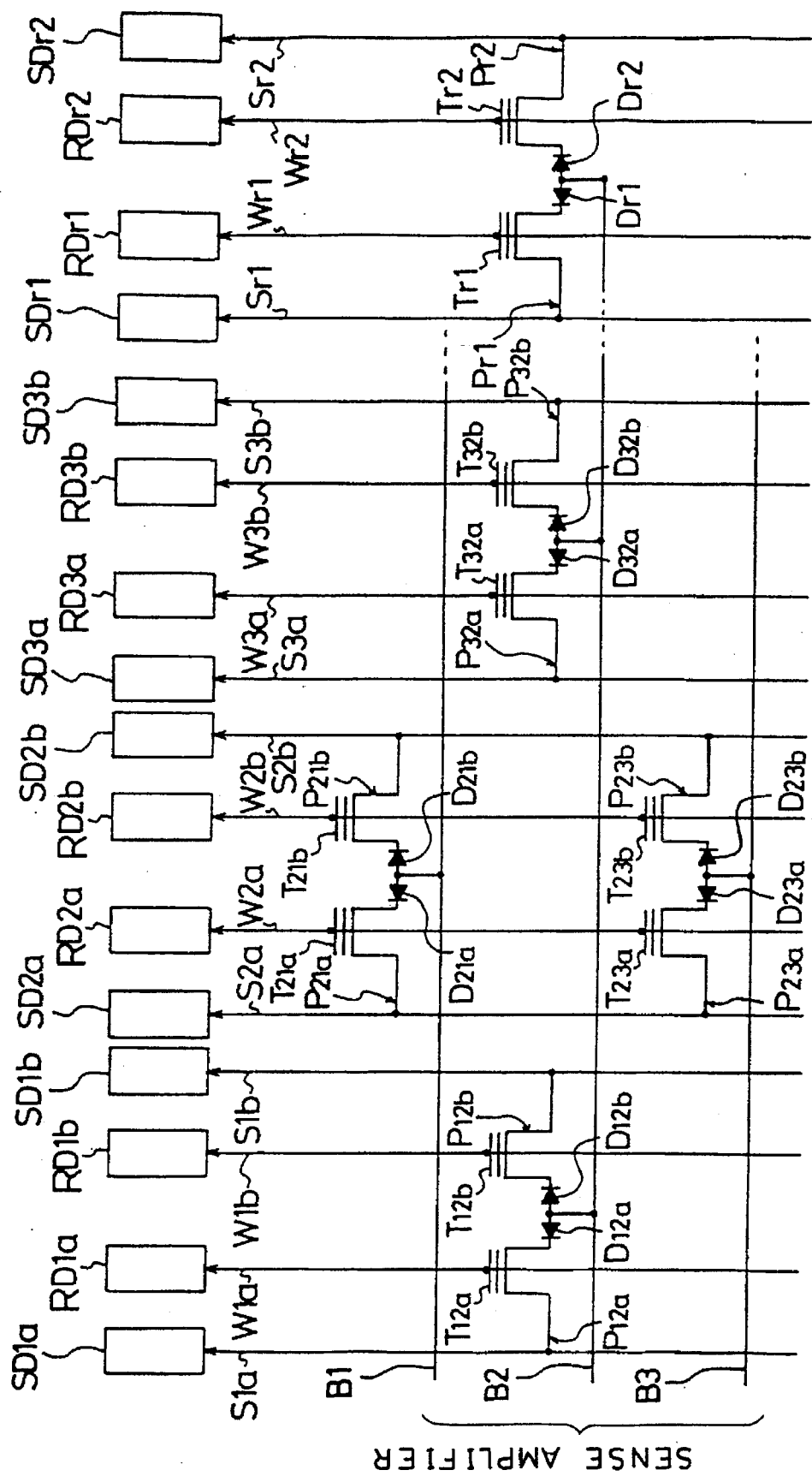
FIG. 23 is a circuit diagram of a memory cell array in accordance with a seventh embodiment of the present invention.
Figure 24:
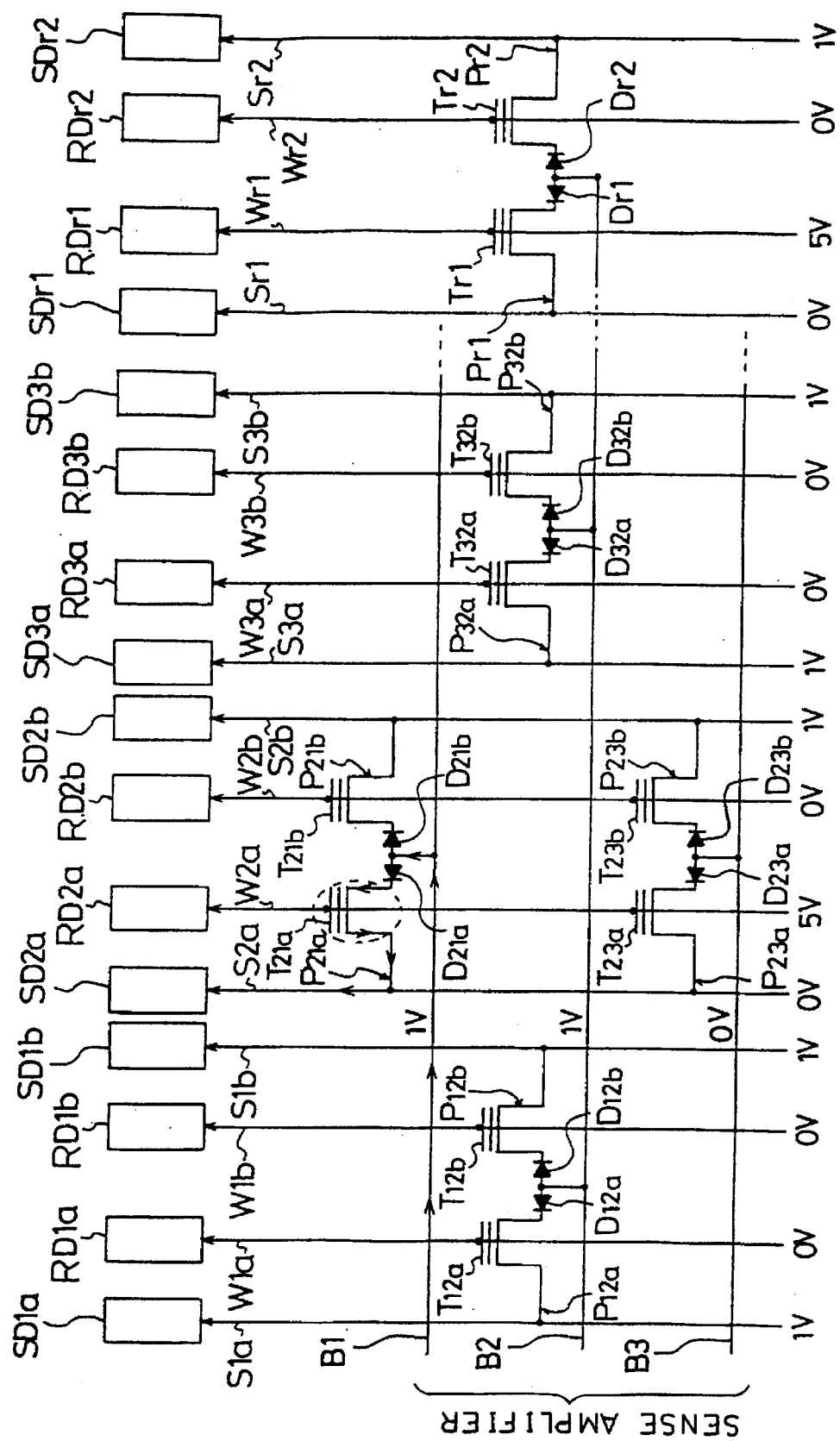
FIG. 24 is a circuit diagram useful in understanding the 1-bit reading of a memory cell array of the seventh embodiment.
Figure 25:
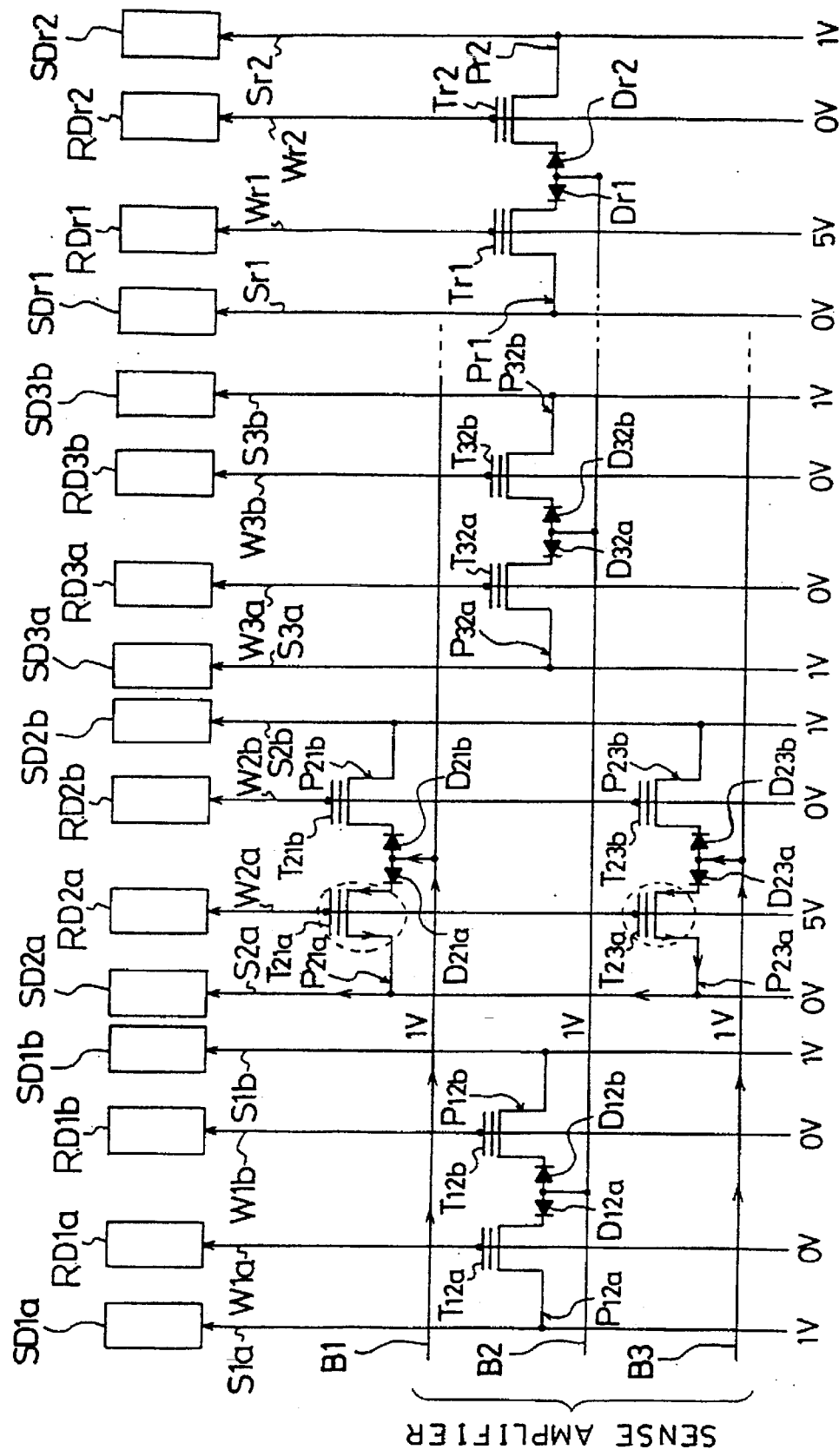
FIG. 25 is a circuit diagram useful in understanding the reading of a group of memory cells associated with a single wordline of a memory cell array of the seventh embodiment.
Figure 26A:
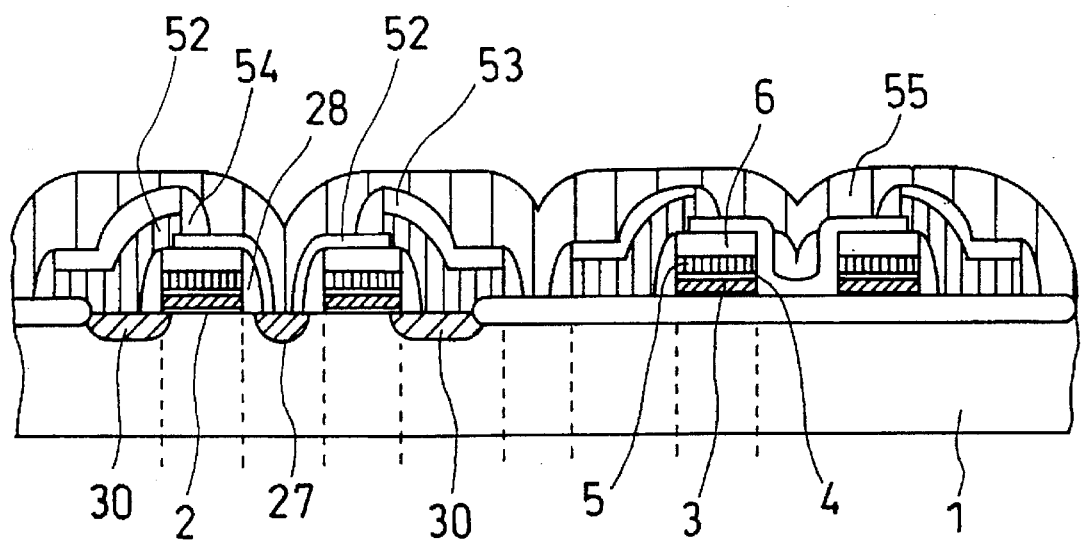
FIG. 26a shows, in cross section taken along in a direction parallel with a memory cell bitline, a memory cell of the seventh embodiment
Figure 26B:
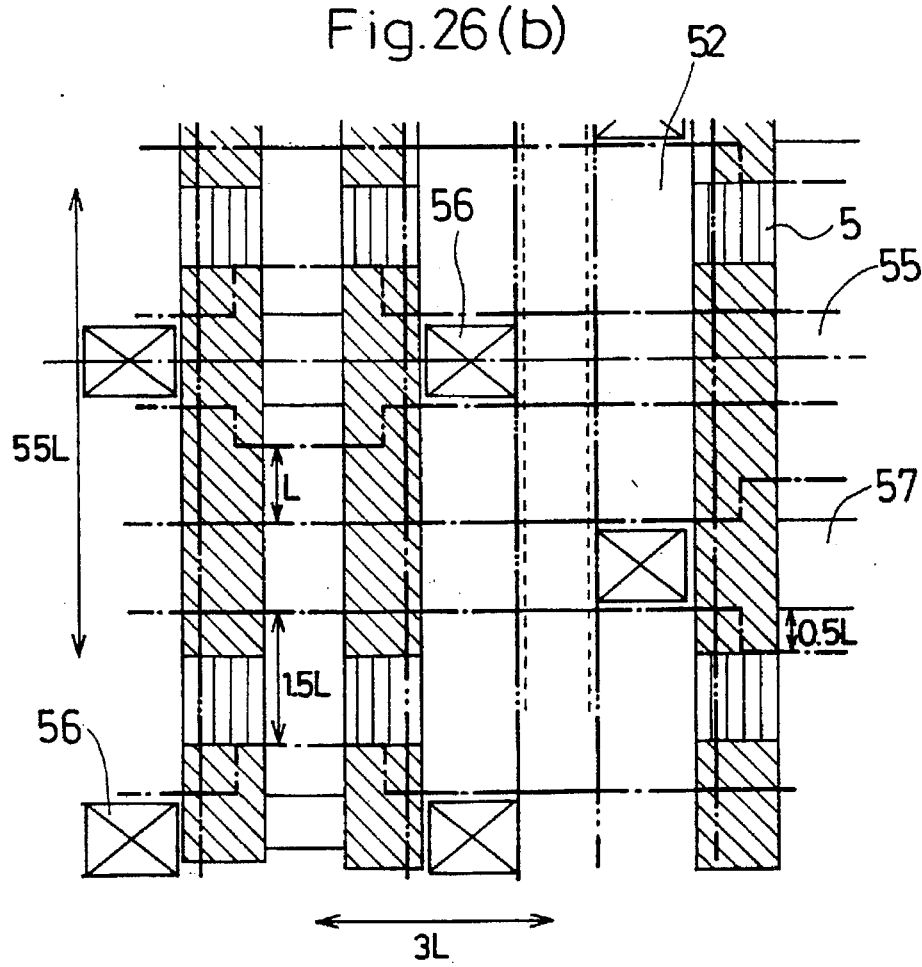
FIG. 26b is the corresponding top plan view.

Since the semiconductor memory of the seventh embodiment can be represented using the FIG. 42 circuit diagram, the circuit structure of the present semiconductor memory is not described here accordingly. FIG. 23 is a circuit diagram illustrating part of a memory cell array of a flash-type EEPROM. FIGS. 24 and 25 are diagrams useful in understanding an operation of driving a semiconductor memory. FIG. 26a shows a memory cell in cross section taken along in a direction in parallel with BITLINE B, and FIG. 26b is the corresponding top plan view. The present embodiment is a folded bitline structure version of the first embodiment. In the present embodiment, memory cells in pairs are placed in checkerboard arrangement and a pair of memory cells have drains connected to a common bitline via respective diodes, which is the same as the fifth embodiment (see FIG. 15). In the present embodiment, however, two sourcelines (e.g., SOURCELINES S2a, S2b) are arranged in place of a single sourceline (e.g., SOURCELINE S2 of FIG. 15) and are connected to respective source decoders (e.g., SOURCE DECODERS SD2a, SD2b). The source of MEMORY CELL (T12b) is connected to SOURCELINE S1b. The source of MEMORY CELL (T21a) is connected to SOURCELINE S2a. A BITLINE B is provided with a dummy cell Tr pair of two bits. For example, DUMMY CELL Tr1 and DUMMY CELL Tr2 are provided for BITLINE B2. The drains of DUMMY CELLS Tr1, Tr2 are connected to a common bitline (BITLINE B2) via DIODE Dr1 and via DIODE Dr2. The sources of DUMMY CELLS Tr1, Tr2 are connected to SOURCELINES Sr1, St2, respectively. Placed at an end of SOURCELINE Sr1 is SOURCE DECODER SDr1. SOURCE DECODER SDr2 is placed at an end of SOURCELINE St2. The gates of DUMMY CELLS Tr1, Tr2 are connected to WORDLINES Wr1, Wr2, respectively. Placed at an end of WORDLINE Wr1 is ROW DECODER RDr1. ROW DECODER RDc2 is placed at an end of WORDLINE Wr2.

In the present embodiment, reading is accomplished in the same way as in the second embodiment. For example, MEMORY CELL (T21a) is read through BITLINE B1 while DUMMY CELL (Tr1) is read through BITLINE B2 (see FIG. 24). As shown in FIG. 25, when extracting pieces of information out of a group of all memory cells in WORDLINE W2a, the memory cells are read through, for example, BITLINES B1, B3 while the dummy cells are read through, for example, BITLINES B2, B4.

Referring to FIGS. 26a and 26b, a memory cell structure of the semiconductor memory of the present embodiment is described. The present memory cell structure is almost identical with the fifth embodiment memory cell structure as shown in FIGS. 17a and 17b. Therefore like reference numerals have been used to indicate like elements of the memory cell. In the fifth embodiment, one sourceline is arranged for every two wordlines. In the present embodiment, two sourcelines are arranged for every two wordlines. The present embodiment therefore requires larger cell area in comparison with the fifth embodiment. However, the present embodiment's folded bitline structure provides better sense amplifier sensitivity.

In FIGS. 26a and 26, it is assumed that a mask alignment margin is ½ of a design rule, and a cell area is 16.5 times the square of a design rule. The mask alignment margin, however, depends on the lithography technique used, so it may change.

The present embodiment employs a floating gate memory cell structure having an offset region of FIG. 6 (the second embodiment). However, a memory cell according to the first, third, or fourth embodiment may be used.

In the present embodiment, the floating gate 3, the control gate 5, and the source wire 52 are linear but they may partly be deformed to a lithography technique used.

In the present embodiment, the source wire 52 is a wiring material but it may be formed by a diffused layer.

EMBODIMENT 8

Figure 27:
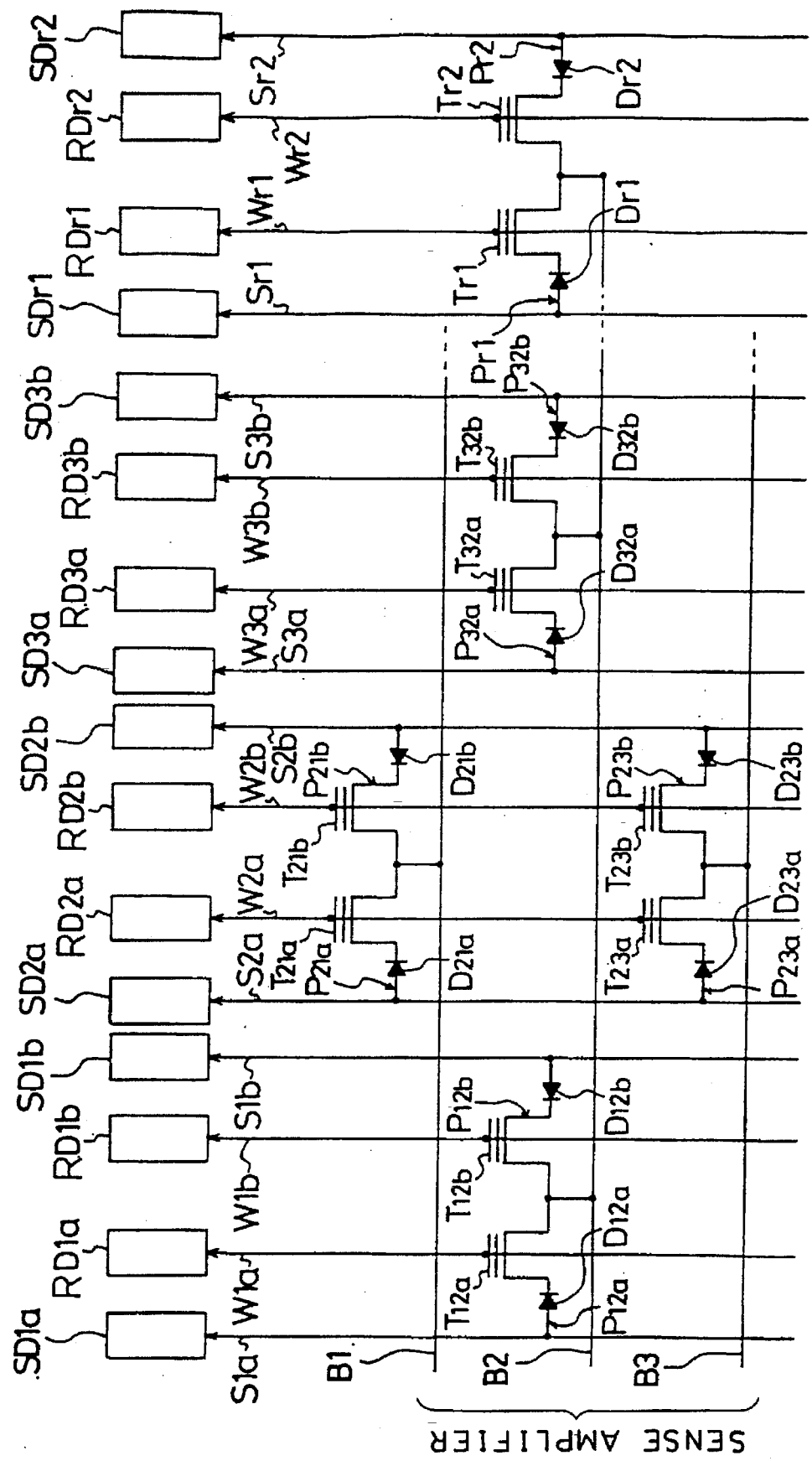
FIG. 27 is a circuit diagram of a memory cell array in accordance with an eighth embodiment of the present invention.

Since a semiconductor memory of the eighth embodiment can be represented using the FIG. 42 circuit diagram, the circuit structure of the present semiconductor memory is not described here accordingly. FIG. 27 is a circuit diagram illustrating part of a memory cell array of a flash-type EEPROM. The present semiconductor memory is basically identical in configuration with the seventh embodiment semiconductor memory. In the present embodiment, however, a diode is formed on the memory cell source side.

Figure 28:
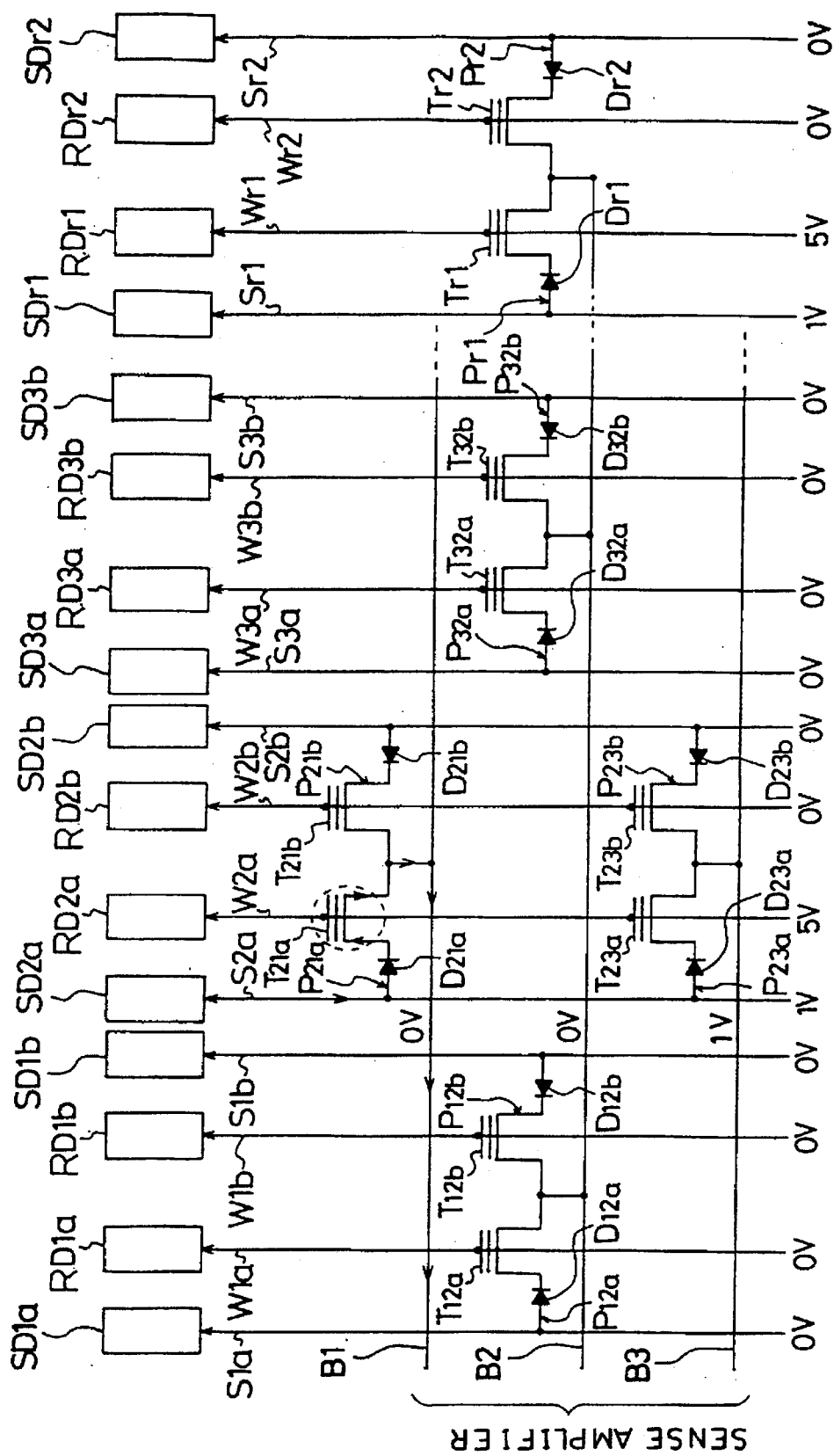
FIG. 28 is a circuit diagram useful in understanding the 1-bit reading of a memory cell array of the eighth embodiment.
Figure 29:
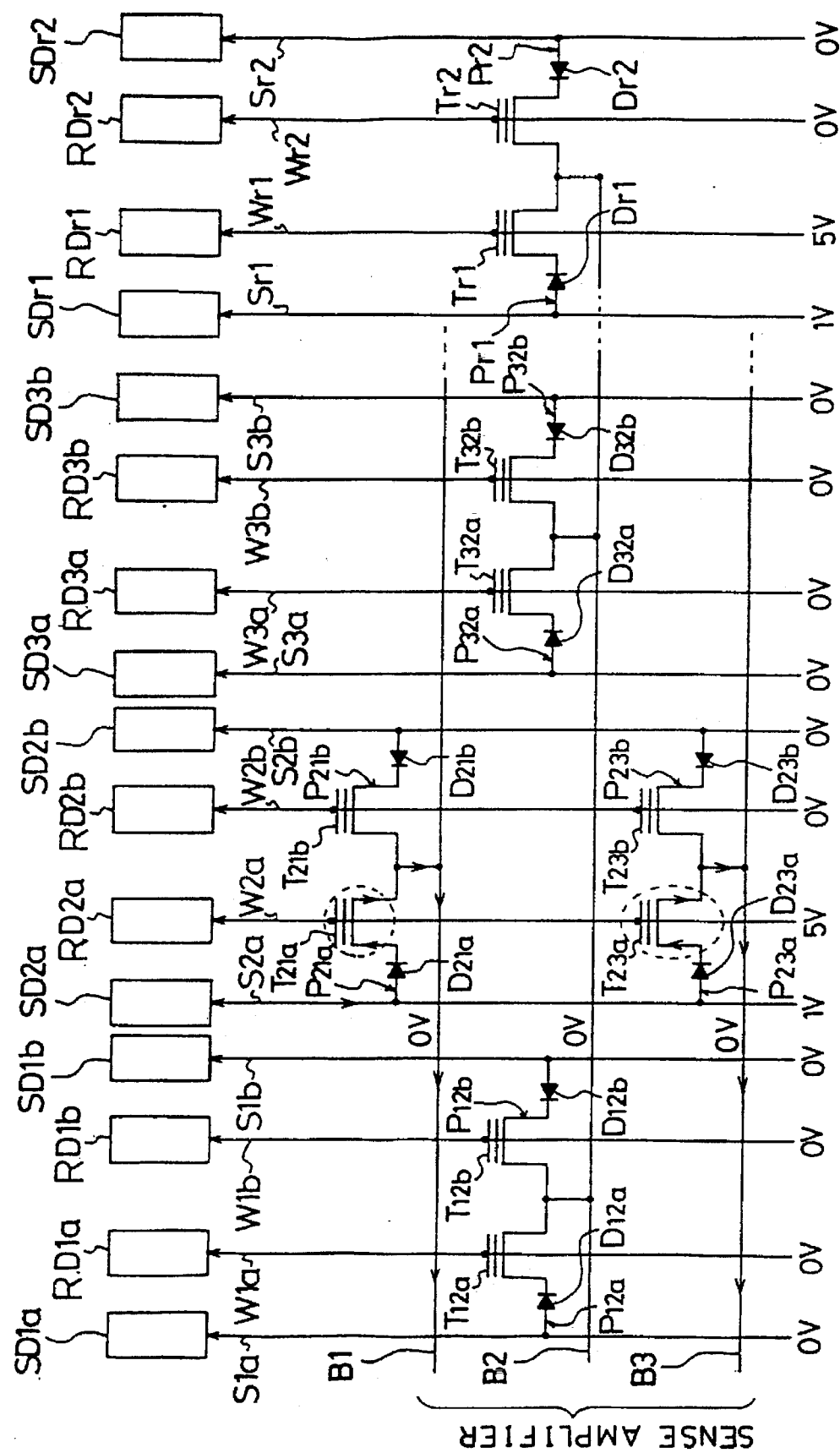
FIG. 29 is a circuit diagram useful in understanding the reading of a group of memory cells associated with a single wordline of a memory cell array of the eighth embodiment.

In the present embodiment, reading is accomplished in the same way as in the second embodiment. For example, MEMORY CELL (T21a) is read through BITLINE B1 while DUMMY CELL (Tr1) is read through BITLINE B2 (see FIG. 28). As shown in FIG. 29, when extracting pieces of information out of a group of all memory cells in WORDLINE W2a, the memory cells are read through, for example, BITLINES B1, B3 while the dummy cells are read through, for example, BITLINES B2, B4.

Figure 30:
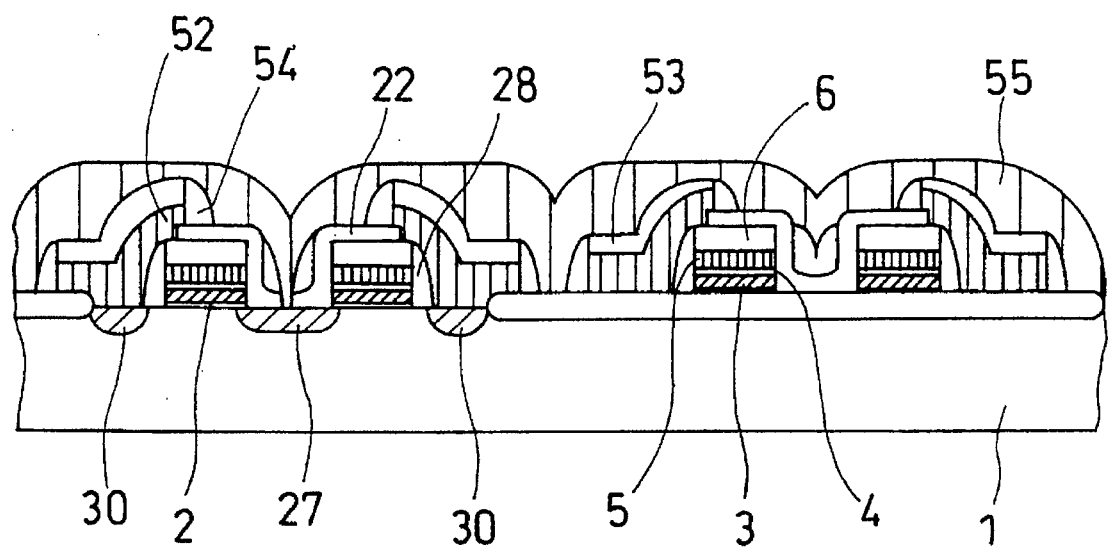
FIG. 30 shows a memory cell of the eighth embodiment cross section taken along in a direction in parallel with a memory cell bitline.

Referring now to FIG. 30, a memory cell structure of the present embodiment is described. The present embodiment discloses a memory cell structure almost identical in organization with the FIG. 22 memory cell structure (the sixth embodiment). In the sixth embodiment, one sourceline is arranged for every two wordlines. In the present embodiment, two sourcelines are arranged for every two wordlines. The present embodiment therefore requires larger cell area in comparison with the' sixth embodiment. However, the present embodiment's folded bitline structure can provide better sense amplifier sensitivity.

In FIG. 30, it is assumed that a mask alignment margin is ½ of a design rule, and a cell area is 16.5 times the square of a design rule. The mask alignment margin, however, depends on a lithography technique used, so it may change.

The present embodiment employs a floating gate memory cell structure having an offset region of FIG. 6 (the second embodiment). However, a memory cell according to tile first, third, or fourth embodiment may be used.

EMBODIMENT 9

Figure 43:
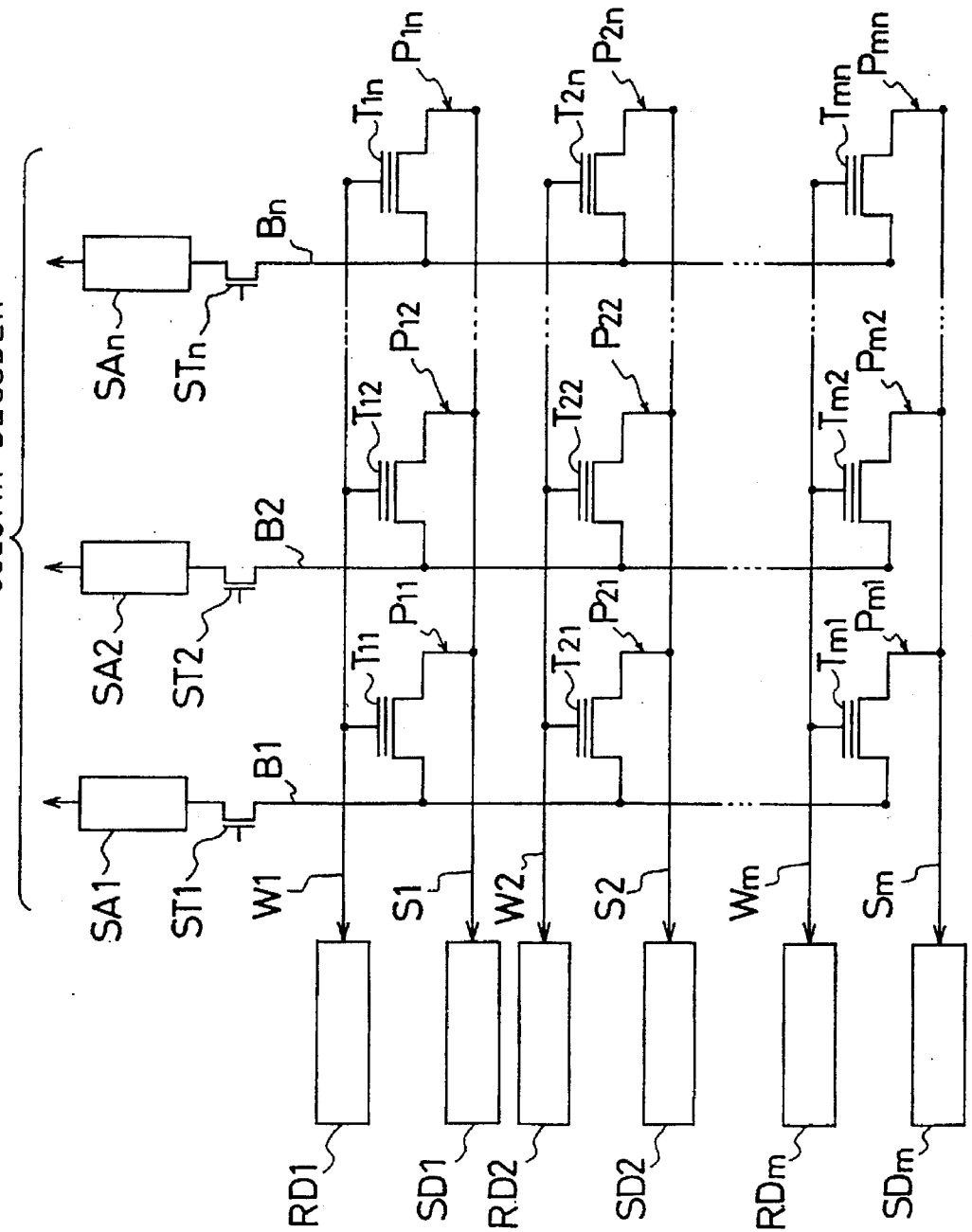
FIG. 43 is a circuit diagram of a conventional memory cell array.
Figure 44:
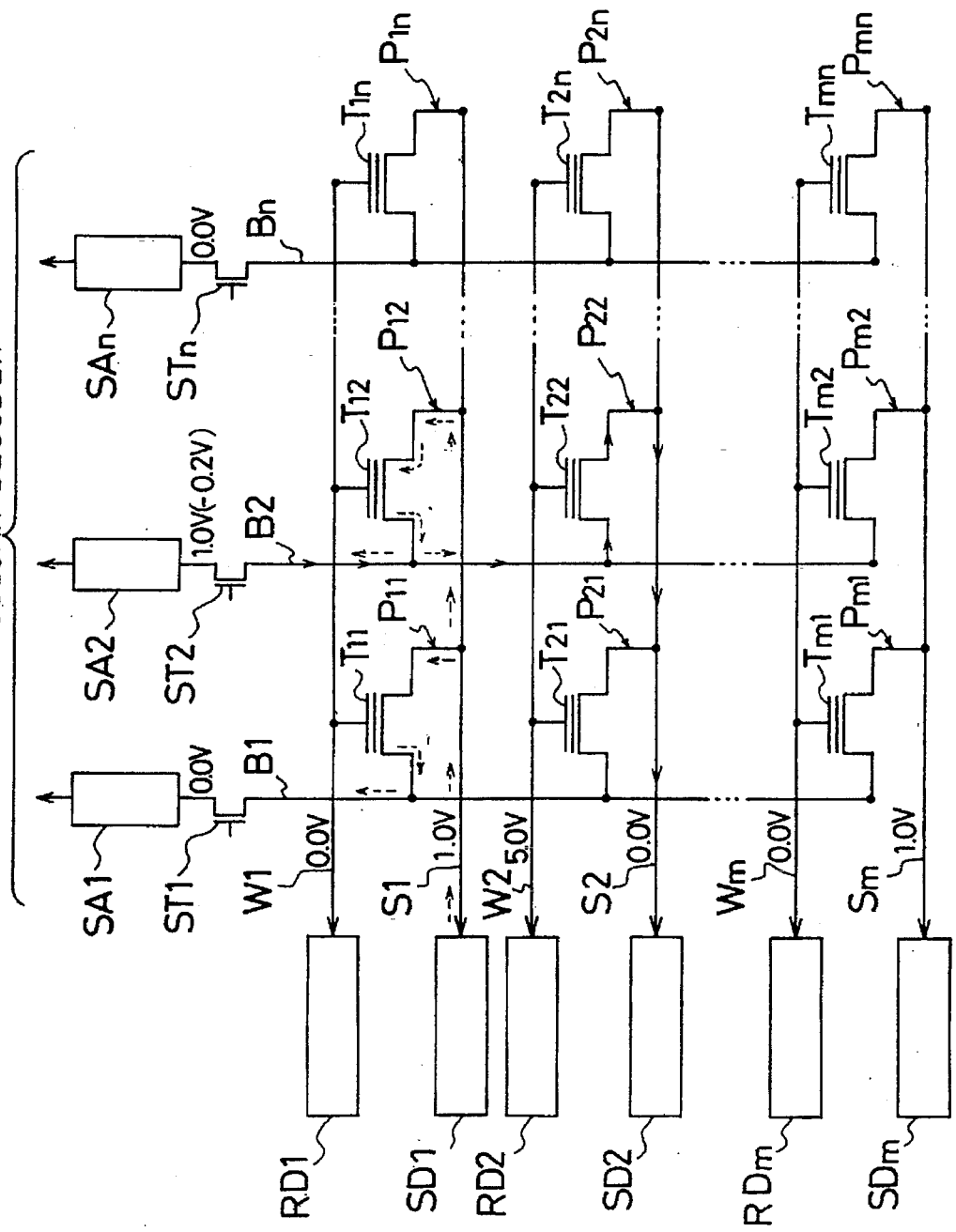
FIG. 44 is a circuit diagram useful in understanding the reading of a conventional memory cell array.

A semiconductor memory of the ninth embodiment has a structure similar to the FIG. 42 structure. Additionally, a memory cell array of the present semiconductor memory (see FIG. 31) is identical in organization with the FIG. 43 memory cell array. In other words, an array of memory cells in m rows and n columns is provided, each memory cell having therein a respective transistor T. In the present embodiment, MEMORY CELLS (T11)–(Tmn), WORDLINES W1–Wm, BITLINES B1–Bn, SOURCELINES S1–Sm, COLUMN SELECTION TRANSISTORS ST1–STn, SENSE AMPLIFIERS SA1–SAn, ROW DECODERS RD1–RDm, COLUMN DECODERS, and SOURCE DECODERS SD1–SDm are all organized and arranged in the same way as shown in FIG. 42. Each BITLINE B1–Bn is provided with a respective sense amplifier.

Figure 31:
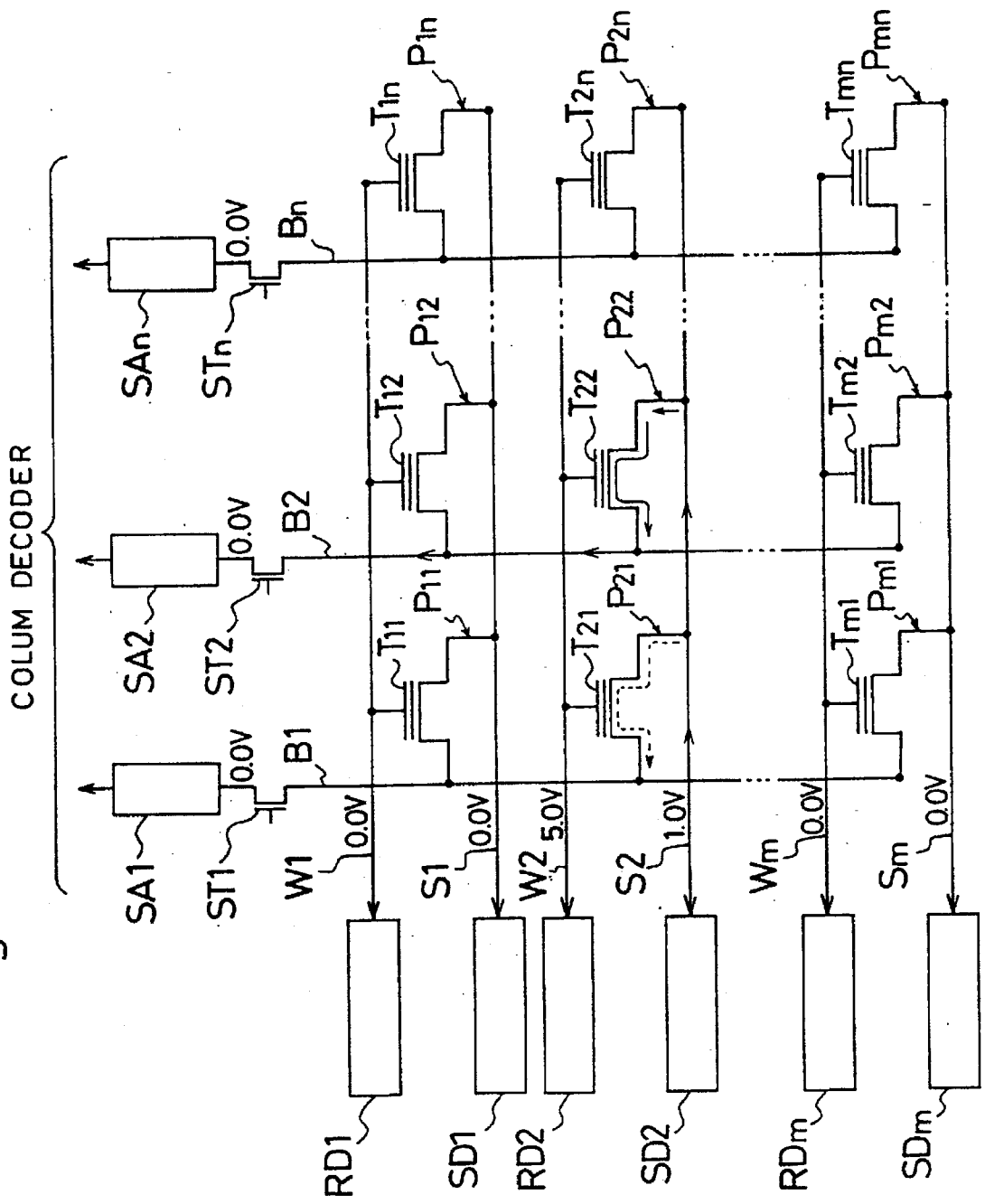
FIG. 31 is a circuit diagram which shows an organization of a semiconductor memory in accordance with a ninth embodiment of the present invention and which is useful in understanding the reading thereof.

Referring to FIG. 31, how reading is accomplished in the present embodiment is explained. For example, a reading operation of extracting items of data from a group of MEMORY CELLS (T21)–(T2n) associated with WORDLINE W2 and with SOURCELINE S2 is illustrated. It is assumed here that both MEMORY CELL (T11) and MEMORY CELL (T12) are being depleted. WORDLINE W2, which is a selected wordline, is set to Vcc (for example, 5 V) while WORDLINES W1, W3–Wm, which are deselected wordlines, are set to Vss (for example, 0 V). At the same time, SOURCELINE S2, which is a selected sourceline, is set to Vrm (for example, 1 V) while SOURCELINES S1, S3–Sm, which are deselected sourcelines, are set to Vss. Each of BITLINES B1–Bn is set to Vss via a respective sense amplifier. BITLINE B is coupled to SENSE AMPLIFIER SA, as a result of which the bitline potential changes slightly from Vss. However, for the sake of easy understanding of the description, it is assumed here that the bitline potential is constant at Vss.

If MEMORY CELL (T22) is in the "zero" state (i.e., the high threshold voltage condition), this condition places MEMORY CELL (T22) into the unoperating state thereby passing no current. Although MEMORY CELL (T12) is over-depleted, no current flows in MEMORY CELL (T12) because BITLINE B2 and SOURCELINE S1 are at the same potential. As a result, no current flows in BITLINE B2, and MEMORY CELL (T22) can be detected to be having a "zero" state. On the other hand, if MEMORY CELL (T21) is in the "one" state (i.e., the low threshold voltage condition), this places MEMORY CELL (T21) into the operating state thereby passing a current. As a result, a current flows in BITLINE B1, and MEMORY CELL (T21) can be detected to be having a "one" state. In spite of MEMORY CELL (T11) being over-depleted at this point in time, the threshold voltage of MEMORY CELL (T11) is controlled to such an extent that a current from MEMORY CELL (T21) does not flow into SOURCELINE S1 through PASSAGE P11 in which MEMORY CELL (T11) is arranged.

The present embodiment provides a way of extracting information pieces from a group of MEMORY CELLS (T21)–(T2m) by applying a reading voltage to WORDLINE W2 and to SOURCELINE S2 only. As compared with the reading of a conventional semiconductor memory with an array of non-volatile memory cells, less power consumption can be accomplished because a less number of wires is charged or discharged when the reading frequency is high or when a reading operation is performed during the verification operation.

The potential of bitlines and the potential of deselected sourcelines are set to Vss. This prevents a deselected memory cell from undergoing a drop in the threshold voltage due to Vd (the drain voltage). No read errors occur.

In the above-described reading operation, Vrm (the read intermediate potential level) is applied to a selected sourceline and a drop in the selected memory cell threshold voltage occurs due to Vs (i.e., the source voltage). However, if a selected memory cell has a "one" state, there are produced no problems by such application of Vrm, rather it provides the advantage that the operating current of the selected memory cell increases thereby providing a higher reading operation rate. Additionally, if a Vrm, which is set to a rather higher level in comparison with the aforesaid Vrm, is applied to a selected sourceline, this accomplishes a fast read. If a selected memory cell has a "zero" state (i.e., the high threshold voltage condition), then a drop in the selected memory cell threshold voltage may occur due to Vs. If a memory cell in the "zero" state is given a sufficiently high threshold voltage lower limit, this prevents a current from flowing even if the threshold voltage drops due to Vs. For the case of NOR-type non-volatile memories, it is known that a memory cell in the "zero state has not a threshold voltage upper limit in particular but a lower limit and there is some room capable of affording variations in the characteristic.

In the above-described reading operation, a group of memory cells, i.e., all memory cells associated with a selected wordline, are read. However, a single memory cell may be read. For example, MEMORY CELL (T22) can be read by setting the potential of each of WORDLINES W1–Wm and the potential of each of SOURCELINES S1–Sm according to FIG. 1, by setting BITLINE B2, which is a selected bitline, to, say, Vss (0 V), and by bringing each of BITLINES B1, B3–Bn to a "float" by establishing an off state between B1, B3–Bn and the voltage source. Unlike a conventional read, BITLINE B2 has a low potential level, i.e., Vss. Therefore a drop in the threshold voltage is controlled thereby preventing the occurrence of read errors. The present embodiment reading method provides the advantage that less power consumption is accomplished because charging and discharging operations of no use are not performed.

Figure 32:
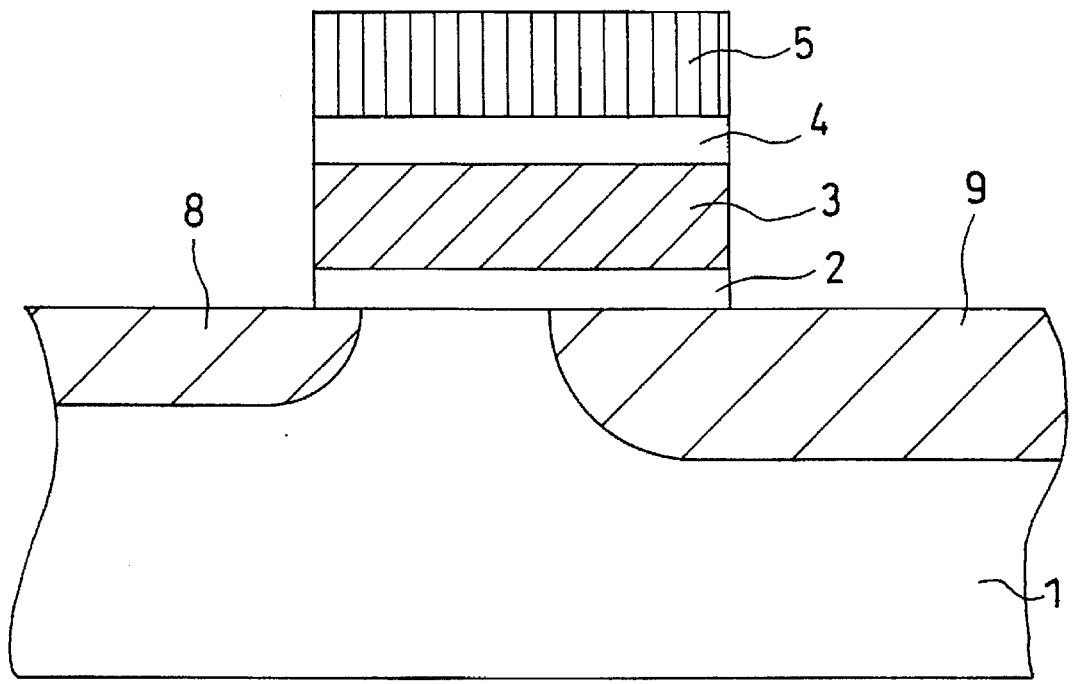
FIG. 32 shows in cross section a memory cell having an asymmetric source/drain structure of the ninth embodiment.
Figure 33:
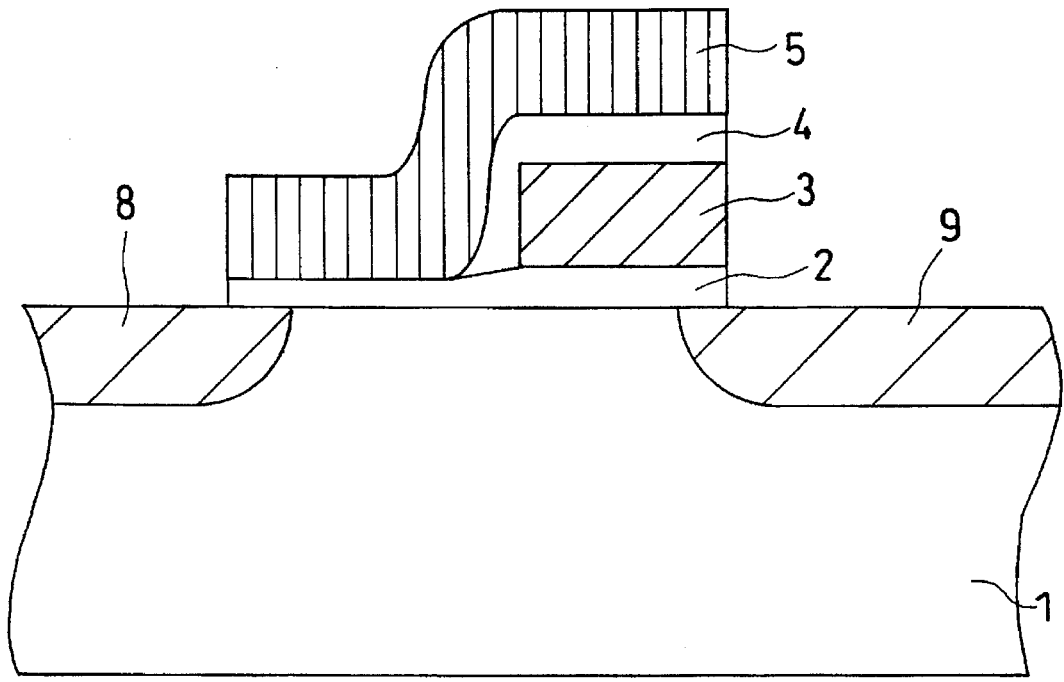
FIG. 33 shows in cross section a memory cell having a split gate structure of the ninth embodiment.
Figure 34:
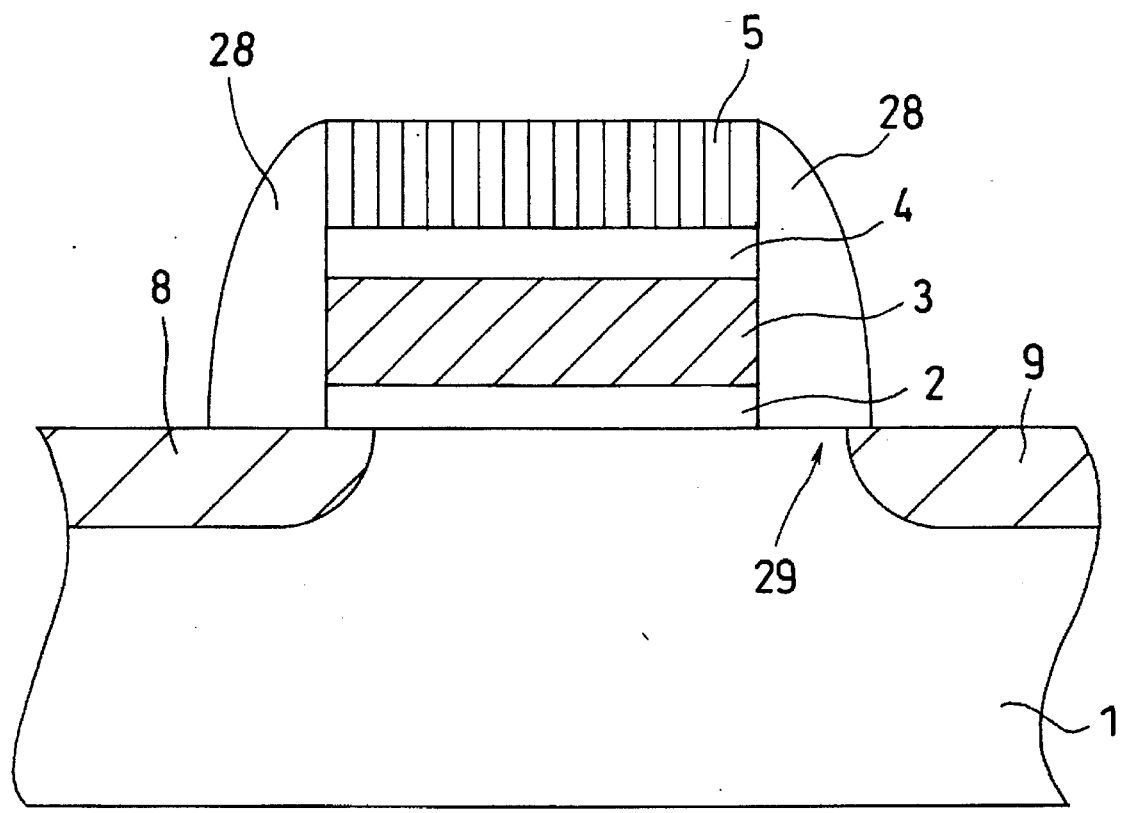
FIG. 34 shows in cross section a memory cell having an offset structure of the ninth embodiment.

If a "zero"-state memory cell is given a sufficiently high threshold voltage lower limit, and if it is designed such that no current flows through the memory cell even if a drop in the threshold voltage is caused by Vs (the source voltage), and if the selected sourceline potential is set such that a drop in the threshold voltage due to Vs is enhanced during the reading operation, this increases the memory cell operating current thereby speeding up reading operations. This is implemented by increasing the capacitive coupling ratio of floating gate to source thereby to increase Vs to such an extent that no soft writing occurs. FIGS. 32 and 33 each illustrate a structure capable of increasing the capacitive coupling ratio of floating gate to source. 1 is a semiconductor substrate. 2 is a gate dielectric layer. 3 is a floating gate electrode. 4 is a capacitance dielectric layer. 5 is a gate electrode. 8 is a drain region. 9 is a source region. In an example of FIG. 32, the source region 9 and the drain region 8 are in asymmetric arrangement and the source region 9 has a greater overlap portion with the floating gate 3 in comparison with the drain region 8. In an example of FIG. 33, a split gate structure is employed and the floating gate 3 is located on the source region's 9 side.

There are some cases where it is impossible to give a memory cell in the "zero" state a sufficiently high threshold voltage lower limit because of write/erase operating limitations. In such a case, it is not preferable for a selected memory cell to undergo a drop in the threshold voltage due to Vs. If a structure capable of bringing the aforesaid ratio almost to a nil, this nearly prevents a drop in the threshold voltage. A structure, shown in FIG. 4, may be used in which an offset region 29 laving the same conductivity type as the semiconductor substrate 1 is formed between the source region 9 and an underneath region of the floating gate 3. 28 is a sidewall.

Another structure (not shown) may be employed in which although it has a split gate structure as shown in FIG. 33 the floating gate 3 is located on the drain region's 8 side.

In the present embodiment reading method, the selected sourceline potential is set to Vrm (for example, 1 V) which however may be set at Vcc.

Further, in the present embodiment reading method, the selected bitline potential is set at Vss via a sense amplifier. However, when a sense amplifier needs a reference potential, the selected bitline potential (SBLP) may be set such that Vss<SBLP<Vrm.

The present embodiment uses a non-volatile memory cell with a floating gate. Instead of using such a memory cell, a non-volatile memory transistor may be used which is capable of changing a threshold voltage by means of an implantation with electrons into a dielectric layer on a channel region of a MOS transistor such as an MNOS (metal nitride oxide semiconductor) memory cell.

Figure 35:
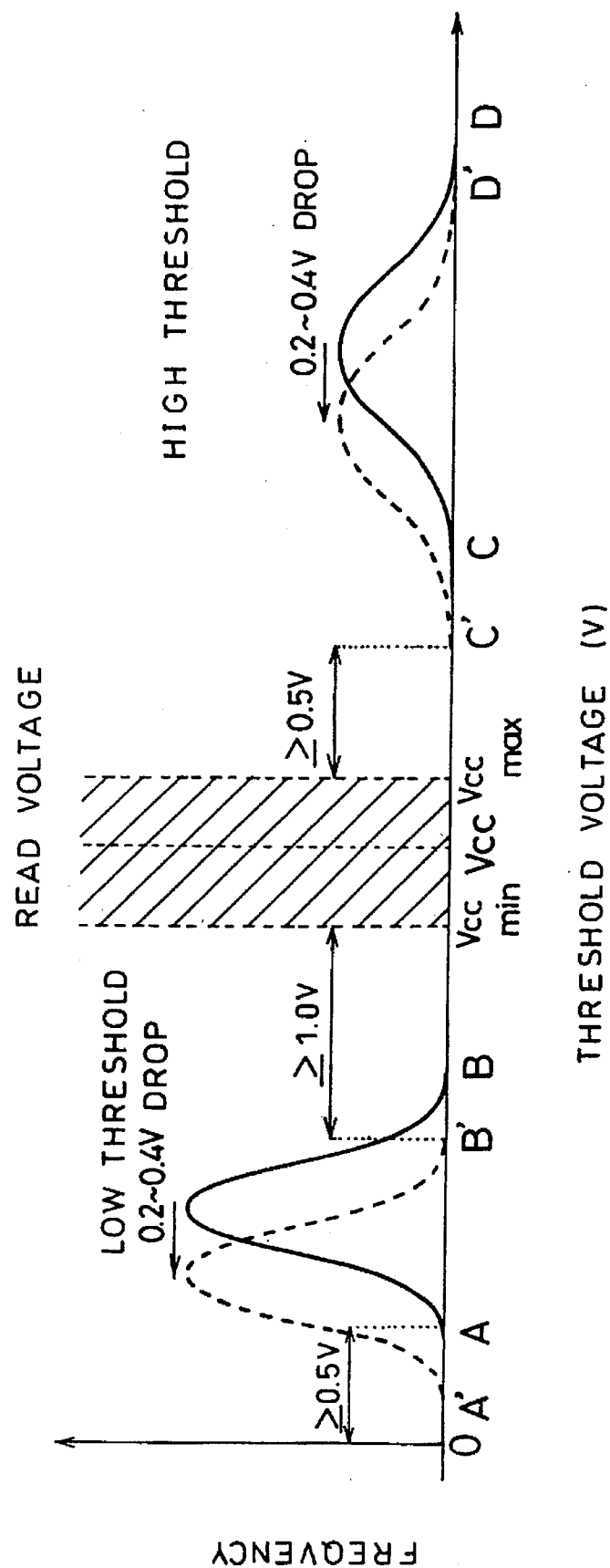
FIG. 35 is a diagram outlining a memory cell threshold voltage distribution in the ninth embodiment.

Referring now to FIG. 35, a verification operation in accordance with the present embodiment is described. FIG. 35 is a graph showing a threshold voltage distribution. In the graph, the abscissa indicates the non-volatile memory threshold voltage and the ordinate indicates the frequency. In an usual NOR-type non-volatile memory, verification is executed either in a write operation or in an erase operation in which a memory cell makes a transition to a "one" state. Here, a case is described in which a verification operation is executed in an operation in which a memory cell makes a transition to a "one" state.

Generally, in a verification operation, a pulse is applied such that a transition of state is made under bias conditions in order that a memory cell gradually makes a transition to a "one" state, and the memory cell is detected by a sense amplifier as to whether or not it goes into 'a "one" state, every time a pulse is applied. If the memory cell is detected to be having a "one" state, then the write or erase operation is completed. If the memory cell is detected not having a "one" state, then a pulse is again applied and detection is continued. Such is repeated until the memory cell is detected by the sense amplifier to be having a "one" state. Although this verification is performed in the same way that the FIG. 31 reading operation is performed, the selected sourceline potential must be held low enough to enable a sense amplifier to detect same (for example, 0.5 V). The present embodiment verification provides a distribution of memory cell threshold voltages represented by Curves A–B, C–D of FIG. 35. In the "one" state, the lower limit potential is set at Point A while the upper limit potential is set at Point B. In the "zero" state, the lower limit potential is set at Point C while the upper limit potential is set at Point D.

Figure 46:
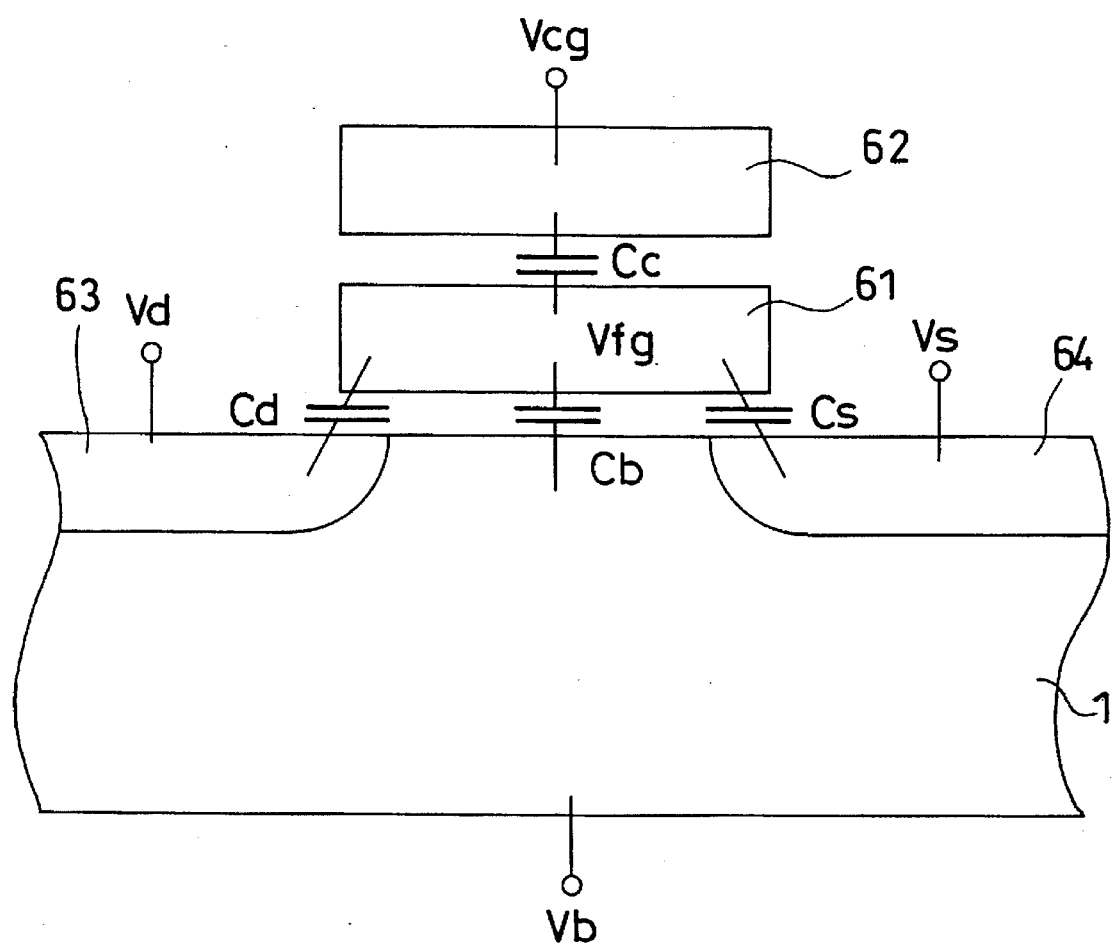
FIG. 46 is a diagram illustrating in cross section a memory cell capacitive coupling state in a conventional semiconductor memory.
Figure 47A:
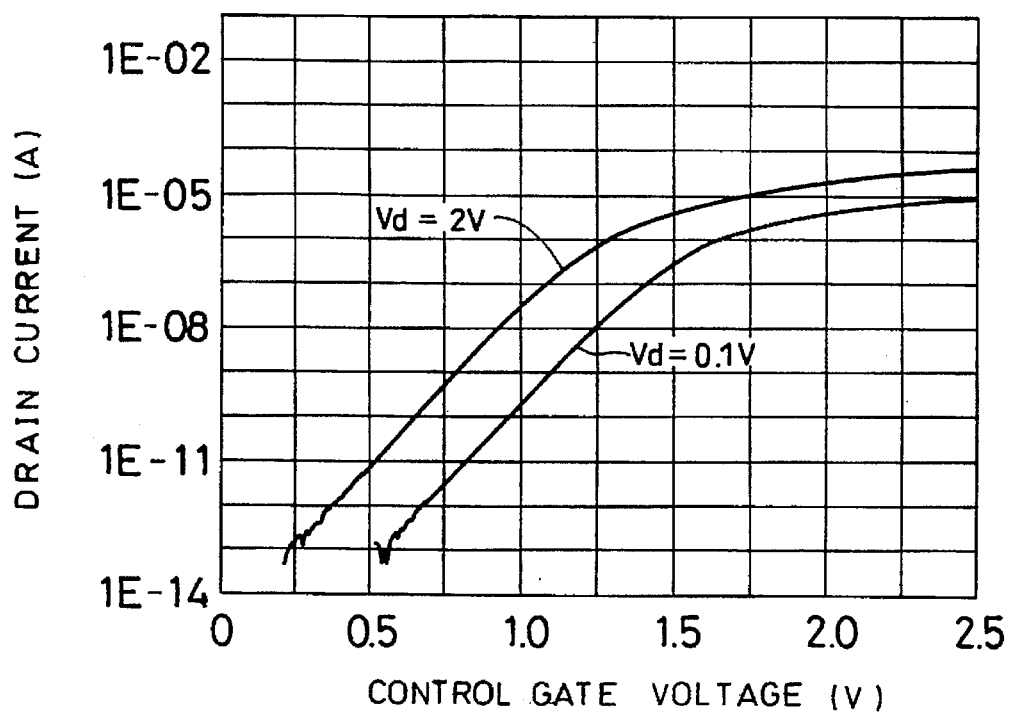
FIG. 47, comprised of 47a and 47b is a diagram showing the electric properties of a conventional semiconductor memory.
Figure 47B:
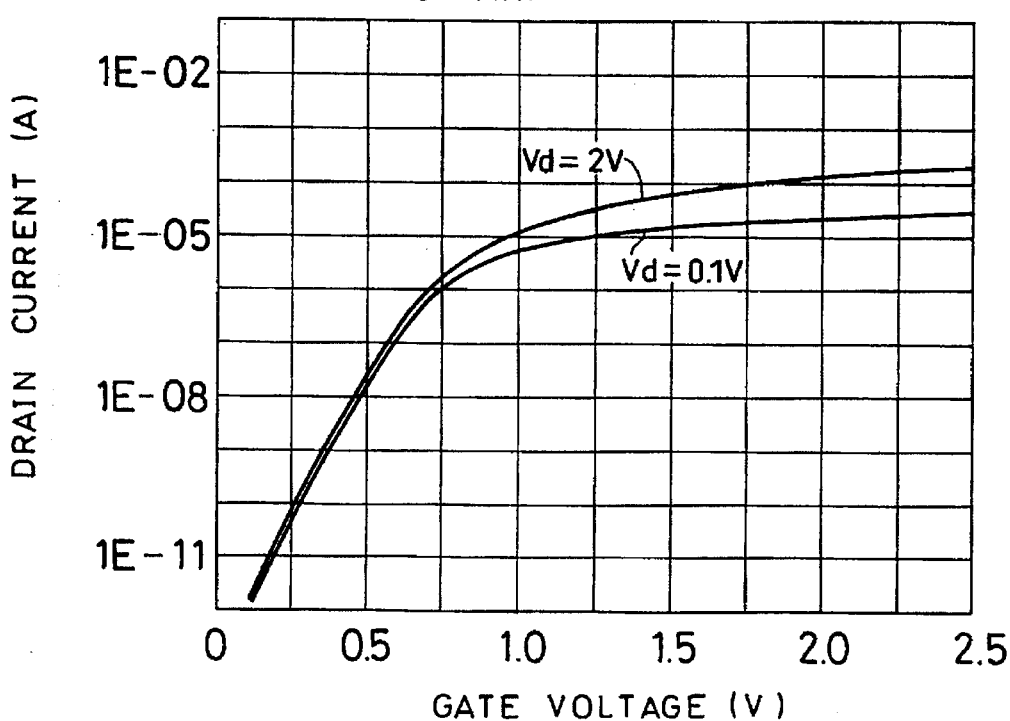

A usual reading operation uses Vrm (1 V) as a source voltage (see FIG. 31) that is higher than one used in a verification operation. As previously explained with reference to FIGS. 46, 47 and using the capacitance-potential relation formulas, the memory cell threshold voltage decreases as the source voltage increases. As indicated by the distribution of memory cell threshold voltages of FIG. 35 (Curves A'–B', C'–D'), the lower limit potential level is set at Point A' while the upper limit potential level is set at Point B', in the "one" state, and the lower limit potential level is set at Point C' while the upper limit potential level is set at point D', in the "zero" state.

Figure 45:
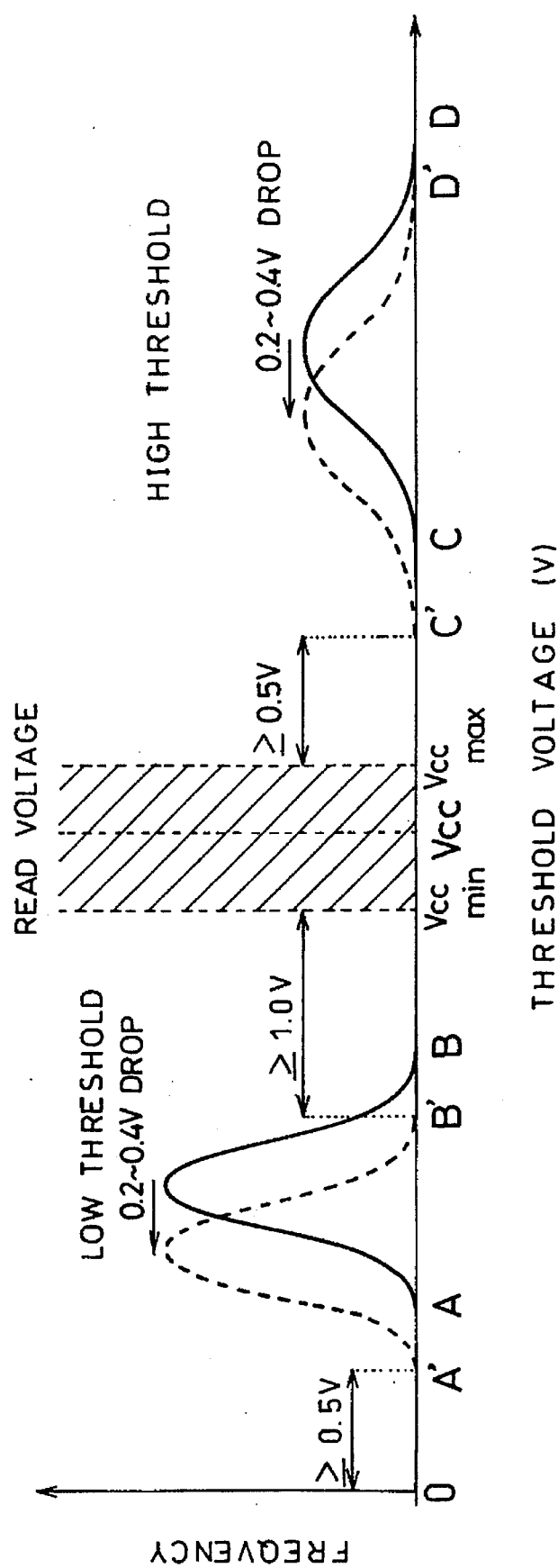
FIG. 45 is a diagram showing a memory cell threshold voltage distribution in a conventional semiconductor memory.

The Curve A'–B' distribution and the Curve C'–D' distribution are applied to a selected memory cell only. The threshold voltages of the remaining deselected memory cells remain unchanged, or are distributed according to Curves A–B, C–D. The threshold voltage lower limit potential in the "one" state is provided for prevention of the misreading of a deselected memory cell, and the threshold voltage upper limit potential level in the "one" state is provided for securing a reading current of a selected memory cell. In a conventional NOR-type non-volatile memory, the memory cell threshold voltage distribution in the "one" state is controlled to fall within the Point A'–B' range of FIG. 35. On the other hand, in the present embodiment, the memory cell threshold voltage distribution in the "one" state is controlled to just fall within the Point A–B range of FIG. 35. In other words, the FIG. 45 conventional method, on the one hand, requires a potential difference of 0.5 V or more between Point zero and Point A', and the present embodiment method, on the other hand, requires a potential difference of 0.5 V or more between Point zero and Point A. Additionally in the present embodiment method the Point A' potential may take a negative level. The present embodiment method therefore can provide a greater margin.

A threshold voltage should be set higher than usually so that no operating current flows at Point C'.

In a reading operation of the above-described verification method, the selected sourceline potential is 0.5 V. Other potentials may be used for the selected sourceline potential.

Further, the selected bitline potential is set at Vss via a sense amplifier. However, when a sense amplifier needs a reference potential, the selected bitline potential (SBLP) may be set such that Vss<SBLP<Vrm.

The present embodiment uses a non-volatile memory cell with a floating gate. Instead of using such a memory cell, a non-volatile memory transistor may be used which is capable of changing a threshold voltage by means of an implantation with electrons into a dielectric layer on a channel region of a MOS transistor such as an MNOS (metal nitride oxide semiconductor) memory cell.

Figure 36:
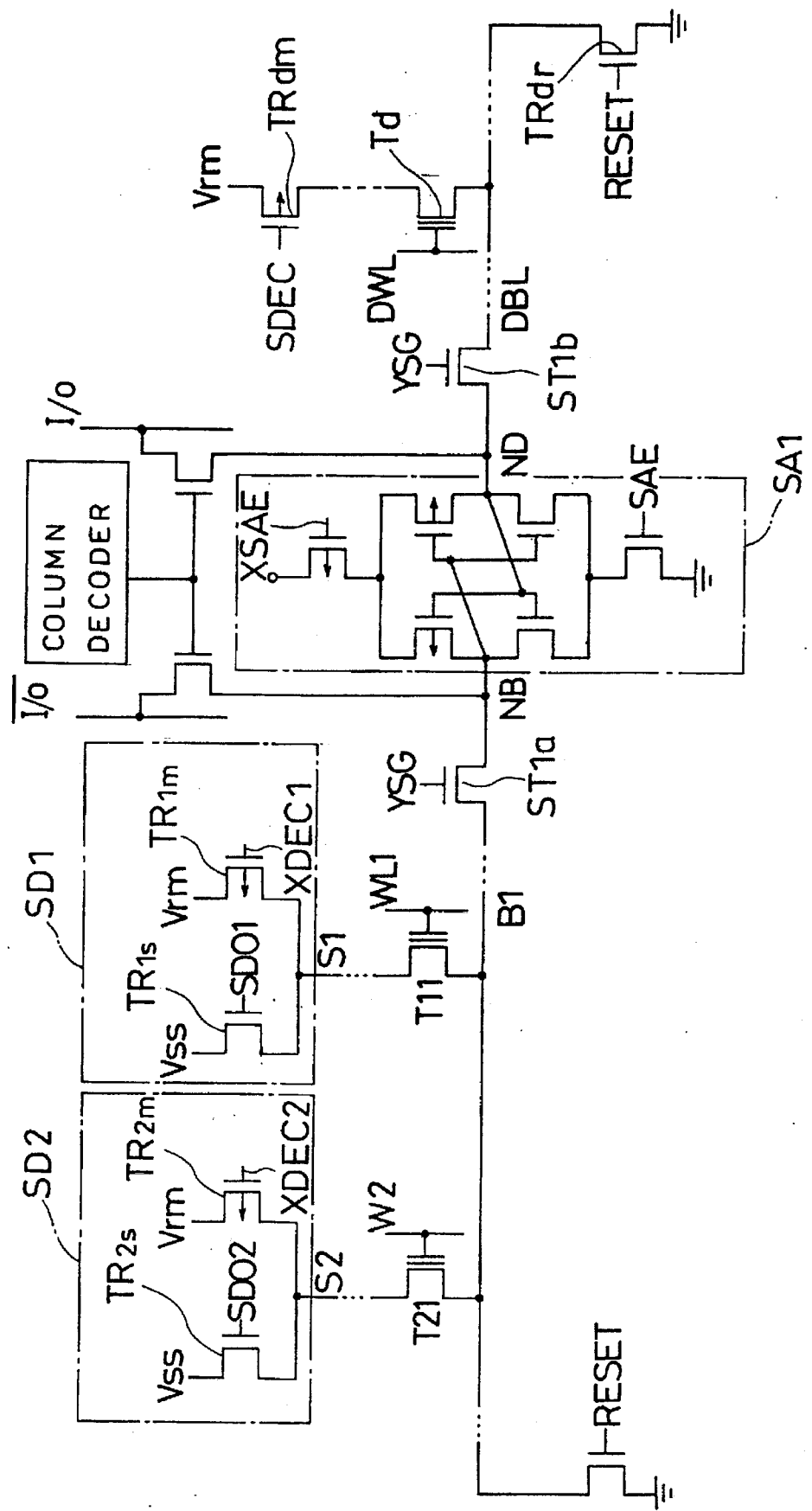
FIG. 36 is a circuit diagram illustrating in detail a memory cell array of a semiconductor memory of the ninth embodiment.

The structure of an array of memory cells of the present embodiment as well as the reading of a memory cell is illustrated. In FIG. 36 part of FIG. 31 is illustrated in detail. FIG. 36 shows in detail MEMORY CELLS (T11), (T21), BITLINE B1, SOURCELINES S1, S2, SOURCE DECODERS SD1, SD2, SENSE AMPLIFIER SA1, and DUMMY CELL (Td). SOURCE DECODER SD1 has therein MOS TRANSISTOR TR1m for applying Vrm to SOURCELINE S1 and MOS TRANSISTOR TR1s for applying Vss to SOURCELINE S1. SOURCE DECODER SD2 has therein MOS TRANSISTOR TR2m for applying Vrm to SOURCELINE S2 and MOS TRANSISTOR TR2s for applying Vss to SOURCELINE S2. MOS TRANSISTOR TR1s receives at its gate SIGNAL SDO1. MOS TRANSISTOR TR2s receives at its gate SIGNAL SD02. MOS TRANSISTOR TR1m receives at its gate SIGNAL XDEC1. MOS TRANSISTOR TR2m receives at its gate SIGNAL XDEC2. Such a structure is only for the sake of simplifying the description of the timing of voltage application to sourcelines. Other structures may be used.

NB indicates a bitline node. BITLINE NODE NB is connected to BITLINE B1 via SELECTION TRANSISTOR ST1a responsive to SIGNAL YSG. ND indicates a dummy bitline node. DUMMY BITLINE NODE ND is connected to DUMMY BITLINE DBL via SELECTION TRANSISTOR ST1b responsive to SIGNAL YSG. TRdm indicates a MOS transistor for applying Vrm to the drain of DUMMY CELL (Td). MOS TRANSISTOR TRdm is responsive to SIGNAL DXDEC. TRdr indicates a MOS transistor for applying Vss to the source of DUMMY CELL (Td). MOS TRANSISTOR TRdm is responsive SIGNAL RESET.

Figure 37:
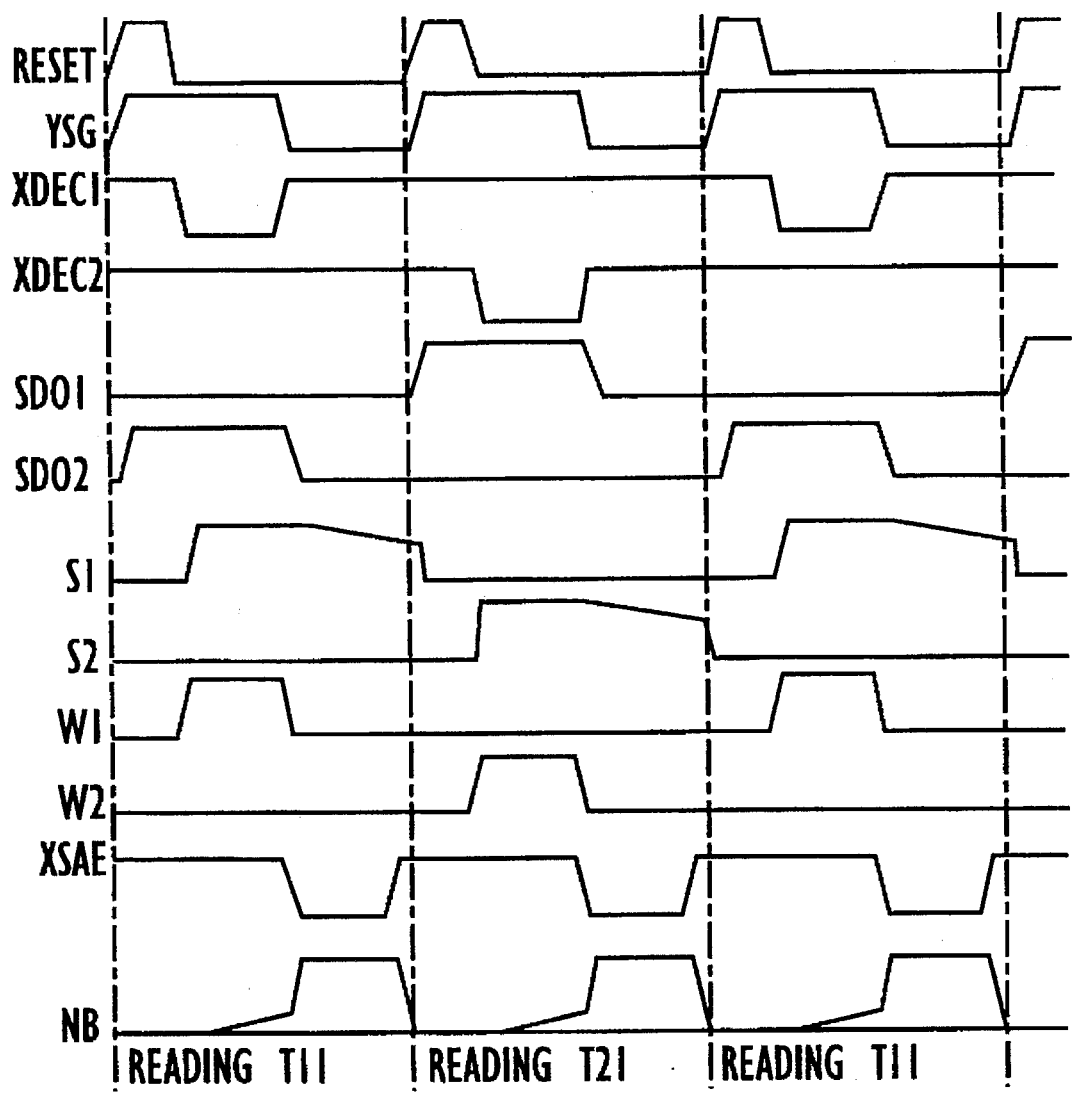
FIG. 37 is a timing diagram useful in understanding how each signal varies in a reading mode of operation of the ninth embodiment.

Reading is accomplished as follows. As can be seen from a timing diagram of FIG. 37, MEMORY CELL (T11) is read, and MEMORY CELL (T21) is read, and MEMORY CELL (T11) is again read. Pre-operations are carried out as follows. SIGNAL YSG is made high. SIGNAL RESET stays high for a very short time, with SELECTION TRANSISTOR ST1a and SELECTION TRANSISTOR ST1b conducting. The potentials of BITLINE NODE NB and DUMMY BITLINE NODE ND are reset to Vss. Next, a memory cell of MEMORY CELLS (T11)–(Tm1) is selected. The potential of deselected sourcelines is set to Vss while on the other hand the potential of a selected sourceline is set to Vrm. For example, when reading MEMORY CELL. (T11), SIGNAL SDO1 is made low while SIGNAL SDO2 is made high, and thereafter SIGNAL XDEC1 is made low while SIGNAL XDEC2 is held high. More specifically, upon SIGNAL XDEC1 being made low, WORDLINE W1, which is a selected wordline, is made high while WORDLINE W2, which is a deselected wordline, is held low. At this point in time, if MEMORY CELL (T11) (i.e., the selected memory cell) is in the "one" state, then the BITLINE NODE NB potential varies about 200 mV. If MEMORY CELL (T11) is in the "zero" state, then the BITLINE NODE NB potential does not vary. At the same time, DUMMY BITLINE NODE ND is held at a reference potential by DUMMY CELL (Td). Thereafter, determining the time when the difference in potential between BITLINE NODE NB and DUMMY BITLINE NODE ND becomes greater than a given value, SIGNAL YSG is made low, the potential level of WORDLINE W1 is made low, SIGNAL XDEC1 is made high, and SIGNAL SDO1 is made low, in order to disconnect BITLINE B1 and SENSE AMPLIFIER SA1. Immediately after this, SIGNAL XSAE is made low so to make SENSE AMPLIFIER SA1 active, whereupon the difference in potential between BITLINE NODE NB and DUMMY BITLINE NODE ND is amplified. Likewise, the reading of MEMORY CELL (T21) can be performed in the same way that MEMORY CELL (T11) is read.

EMBODIMENT 10

A tenth embodiment of the present invention relates to a method of bringing the deselected sourceline potential into a float. This method is explained with reference to FIGS. 38 and 39. Since a semiconductor memory of the tenth embodiment can be represented using the FIG. 42 circuit diagram, the circuit structure of the present semiconductor memory is not described here accordingly. Additionally, an entire memory cell structure of the present embodiment is identical with the one as shown in FIG. 31 (the ninth embodiment), which therefore is not described here.

Figure 38:
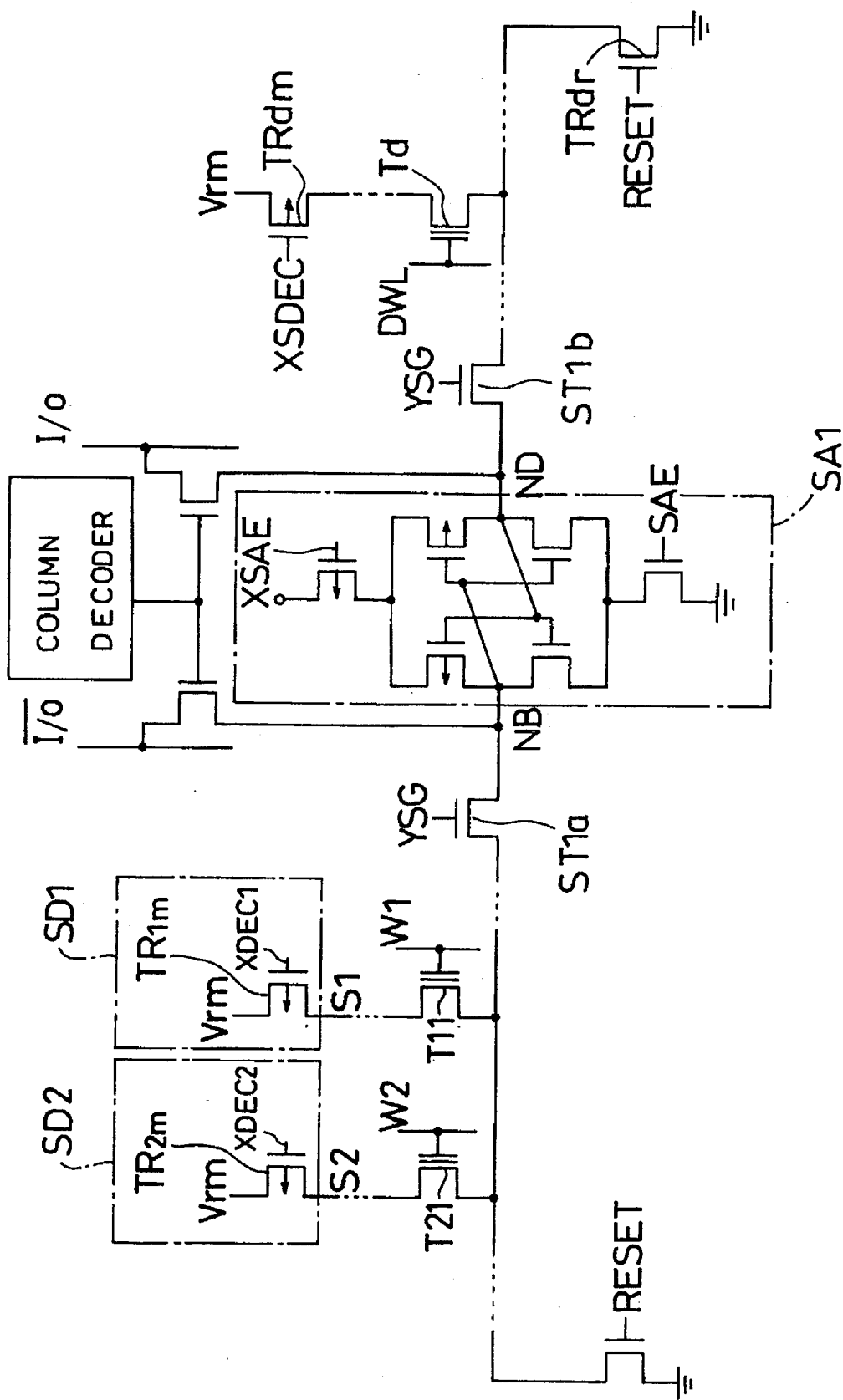
FIG. 38 is a circuit diagram illustrating in detail a memory cell array of a semiconductor memory in accordance with a tenth embodiment of the present invention.
Figure 39:
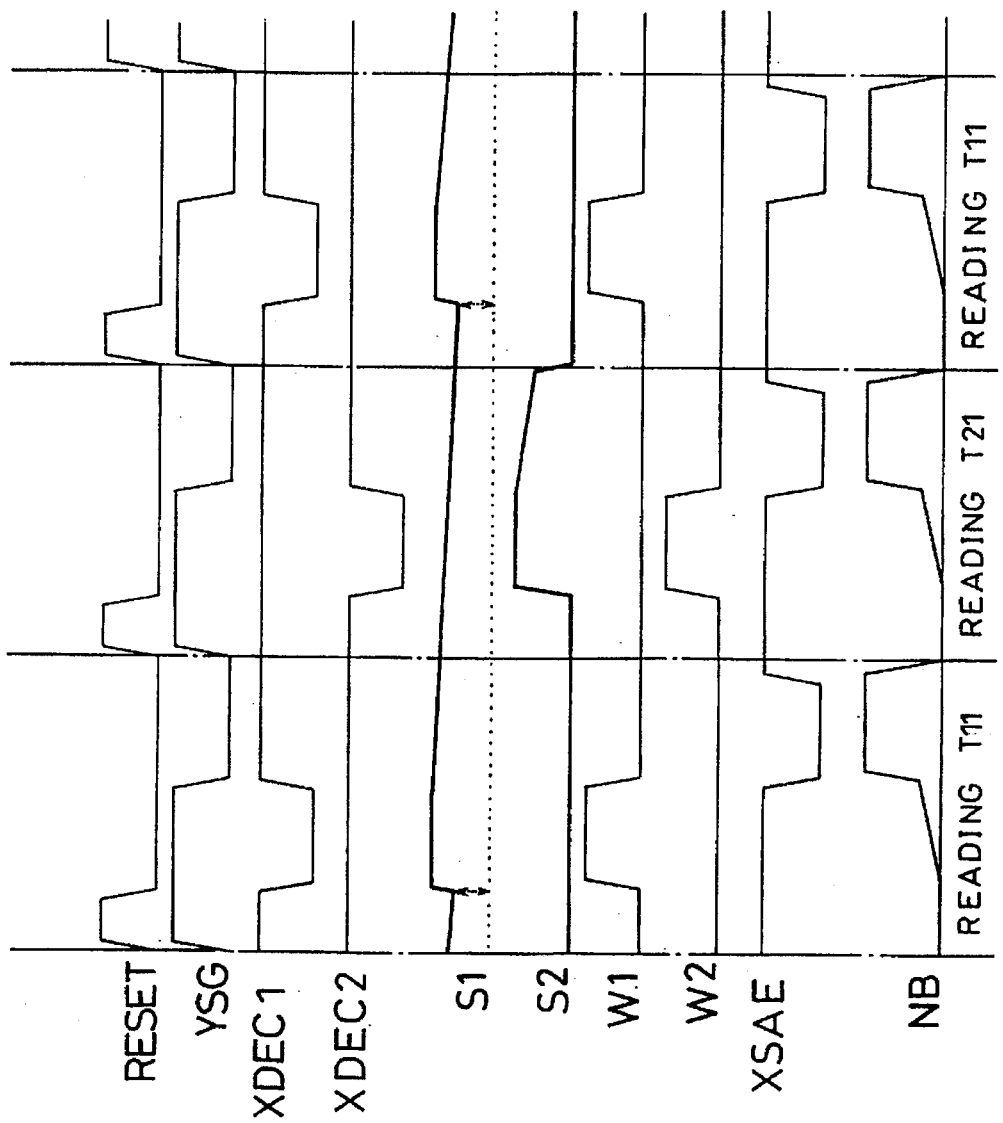
FIG. 39 is a timing diagram useful in understanding how each signal varies in a reading mode of operation of the tenth embodiment.

FIG. 38 shows in detail MEMORY CELLS (T11), (T21), BITLINE B1, SOURCELINES S1, S2, SOURCE DECODERS SD1, SD2, SENSE AMPLIFIER SA1, and DUMMY CELL (Td). SOURCE DECODER SD1 has therein MOS TRANSISTOR TR1m for applying Vrm to SOURCELINE S1. SOURCE DECODER SD2 has therein MOS TRANSISTOR TR2m for applying Vrm to SOURCELINE S2. MOS TRANSISTOR TR1s for applying Vss to SOURCELINE S1 is not provided. MOS TRANSISTOR TR2s for applying Vss to SOURCELINE S2 is not provided. In other words, the deselected sourceline potential is brought to a float.

Reading is accomplished as follows. As can be seen from a timing diagram of FIG. 39, MEMORY CELL (T11) is first read, and MEMORY CELL (T21) is read, and MEMORY CELL (T11) is again read. Pre-operations are carried out as follows. SIGNAL YSG is made high. SIGNAL RESET stays high for a very short time, with SELECTION TRANSISTOR ST1a and SELECTION TRANSISTOR ST1b conducting. The potentials of BITLINE NODE NB and DUMMY BITLINE NODE ND are reset to Vss. Next, a memory cell of MEMORY CELLS (T11)–(Tm1) is selected. The potential of deselected sourcelines is set to Vss while on the other hand the potential of a selected sourceline is set to Vrm. For example, when extracting an item of data out of MEMORY CELL (T11), SIGNAL XDEC1 is made low while SIGNAL XDEC2 is held high. More specifically, upon SIGNAL XDEC1 being made low, WORDLINE W1, which is a selected wordline, is made high while WORDLINE W2, which is a deselected wordline, is held low. At this point in time, if MEMORY CELL (T11) (i.e., the selected memory cell) is in the "one" state (the high threshold voltage condition), then the BITLINE NODE NB potential varies about 200 mV. If MEMORY CELL (T11) is in the "zero" state (the low threshold voltage condition), then the BITLINE NODE NB potential does not vary. At the same time, DUMMY BITLINE NODE ND is held at a reference potential by DUMMY CELL (Td). Thereafter, determining the time when the difference in potential between BITLINE NODE NB and DUMMY BITLINE NODE ND becomes greater than a given value, SIGNAL YSG is made low, the potential level of WORDLINE W1 is made low, and SIGNAL XDEC1 is made high, in order to disconnect BITLINE B1 and SENSE AMPLIFIER SA1. Immediately after this, SIGNAL XSAE is made low to make SENSE AMPLIFIER SA1 active, whereupon the difference in potential between BITLINE NODE NB and DUMMY BITLINE NODE ND is amplified. Likewise, the reading of MEMORY CELL (T21) can be performed in the same way that MEMORY CELL (T11) is read.

The present embodiment reading operation is compared with the ninth embodiment reading operation. In the ninth embodiment reading, the potential of each sourceline is reset to Vss by a respective MOS transistor TR, thereby involving charge/discharge operations, and an extra amount of power necessary for such charge/discharge operations is consumed. Conversely, in the present embodiment, the potential of each deselected sourceline is brought into a float, so that theoretically no sourceline charge/discharge occurs. However, if one or more memory cells of all memory cells connected to a certain sourceline (for example, SOURCELINE S2) are depleted, then SOURCELINE S2 passes its charges onto a bitline through such a depleted memory cell at the reset time and the potential level of SOURCELINE S2 is reset to Vss. Therefore, when extracting information again from a memory cell in SOURCELINE S2, it is necessary to charge SOURCELINE S2 from Vss up to Vrm. Extra power is consumed. However, if none of all memory cells connected to a certain sourceline (for example, SOURCELINE S1) is depleted, SOURCELINE S1 does not pass its charges onto a bitline and the potential level of SOURCELINE S1 is kept more or less at a potential level of Vrm even if the potential is somewhat reduced due to possible leakage current. Therefore, when extracting information again from a memory cell in SOURCELINE S1, only considerably less charge/discharge is required, whereupon the total power consumption can be reduced.

EMBODIMENT 11

Figure 40:
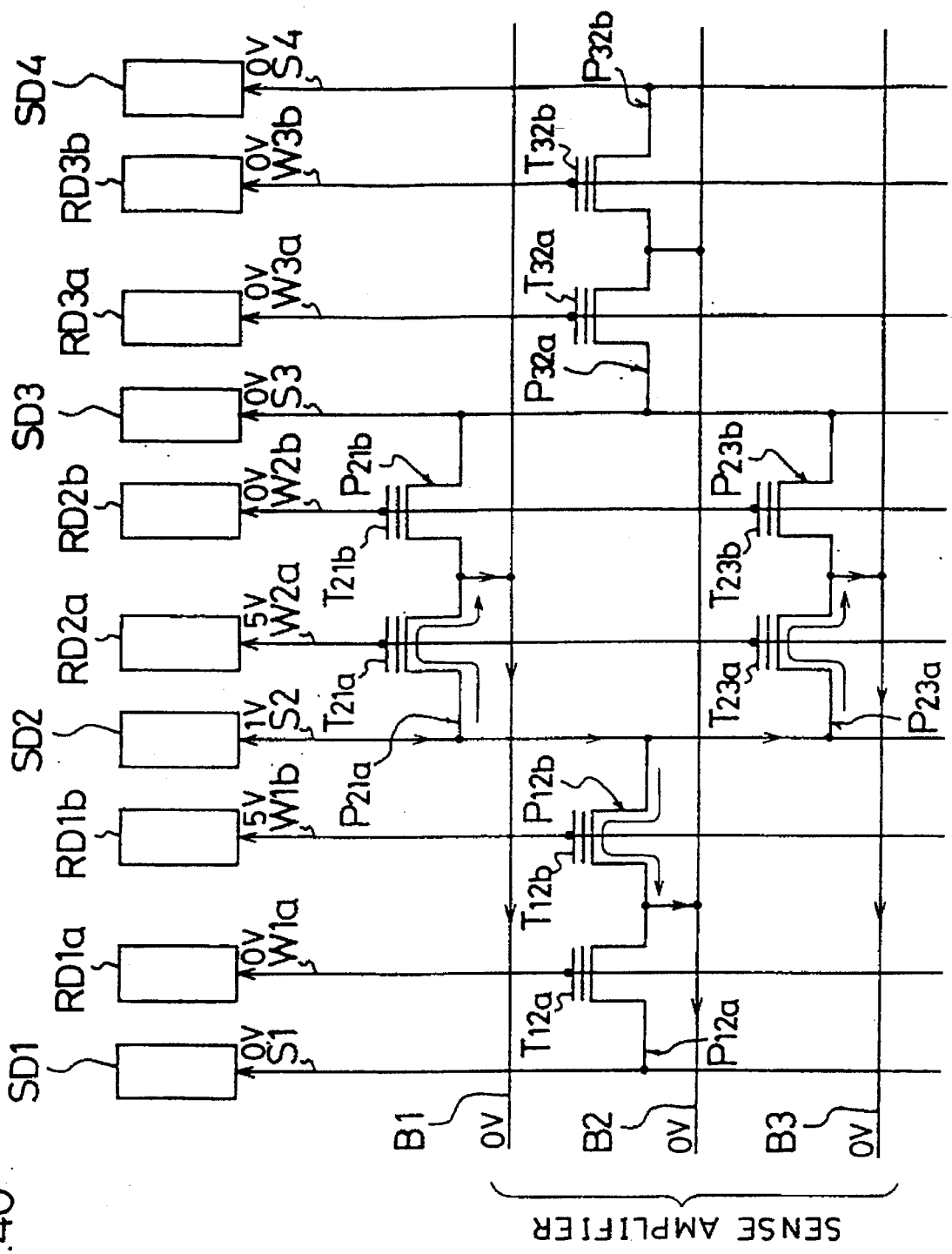
FIG. 40 is a circuit diagram which shows an organization of a memory cell array in accordance with an eleventh embodiment of the present invention and which is useful in understanding the reading thereof.

A method of driving a semiconductor memory of the eleventh embodiment is described. Since a semiconductor memory of the eleventh embodiment can be represented using the FIG. 42 circuit diagram, the circuit structure of the present semiconductor memory is not described here accordingly. As shown in FIG. 40, the drains of two memory cells (e.g., MEMORY CELLS (T21a), (T21b)) are connected to BITLINE B1 via a common line. The source of MEMORY CELL (T21a) is connected to SOURCELINE S2 while the source of MEMORY CELL (T21b) to SOURCELINE S3. In other words, the drains of a pair of memory cells are connected to a common bitline, and the sources thereof are connected to respective sourcelines. No memory cells are placed in regions next to MEMORY CELLS (T21a), (T21B). With respect to BITLINE B2, a pair of memory cells (T12a), (T12b) and a pair of memory cells (T32a), (T32b) are arranged at intervals of two bits. The source of MEMORY CELL (T12b) is connected to SOURCELINE S2 to which the source of the memory cell (T21a) is connected. Likewise, the source of MEMORY CELL (T32a) is connected to SOURCELINE S3 that the source of the memory cell (T21b) is connected to.

Arranged between SOURCELINES S1 and S2 are two wordlines, WORDLINES W1a and W1b. Arranged between SOURCELINES S2 and S3 are two wordlines, WORDLINES W2a and W2b. BITLINES B1–B3 are in vertical cross arrangement with respect to WORDLINE W and SOURCELINE S, thereby providing a pattern of crossed lines of a "checkerboard" for arrangement of MEMORY CELLS (T) in pairs of two bits. The gate of each MEMORY CELL (T), which is of an NOR-type, is connected to WORDLINE W. WORDLINE W1a is connected to ROW DECODER DR1a. WORDLINE W1b is connected to ROW DECODER RD1b. WORDLINE W2a is connected to ROW DECODER RD2b. WORDLINE W2b is connected to ROW DECODER RD2b. WORDLINE W3a is connected to ROW DECODER RD3a. WORDLINE W3b is connected to ROW DECODER RD3b. SOURCELINES S1, S2, S3 are connected to SOURCE DECODERS SD1, SD2, SD3, respectively. BITLINE B1 is connected, via COLUMN SELECTION TRANSISTOR ST1, to SENSE AMPLIFIER SA1 which is connected to a column decoder. BITLINE B2 is connected, via COLUMN SELECTION TRANSISTOR ST2, to SENSE AMPLIFIER SA2 which is connected to a column decoder. BITLINE B3 is connected, via COLUMN SELECTION TRANSISTOR ST3, to SENSE AMPLIFIER SA3 which is connected to a column decoder.

Figure 41:
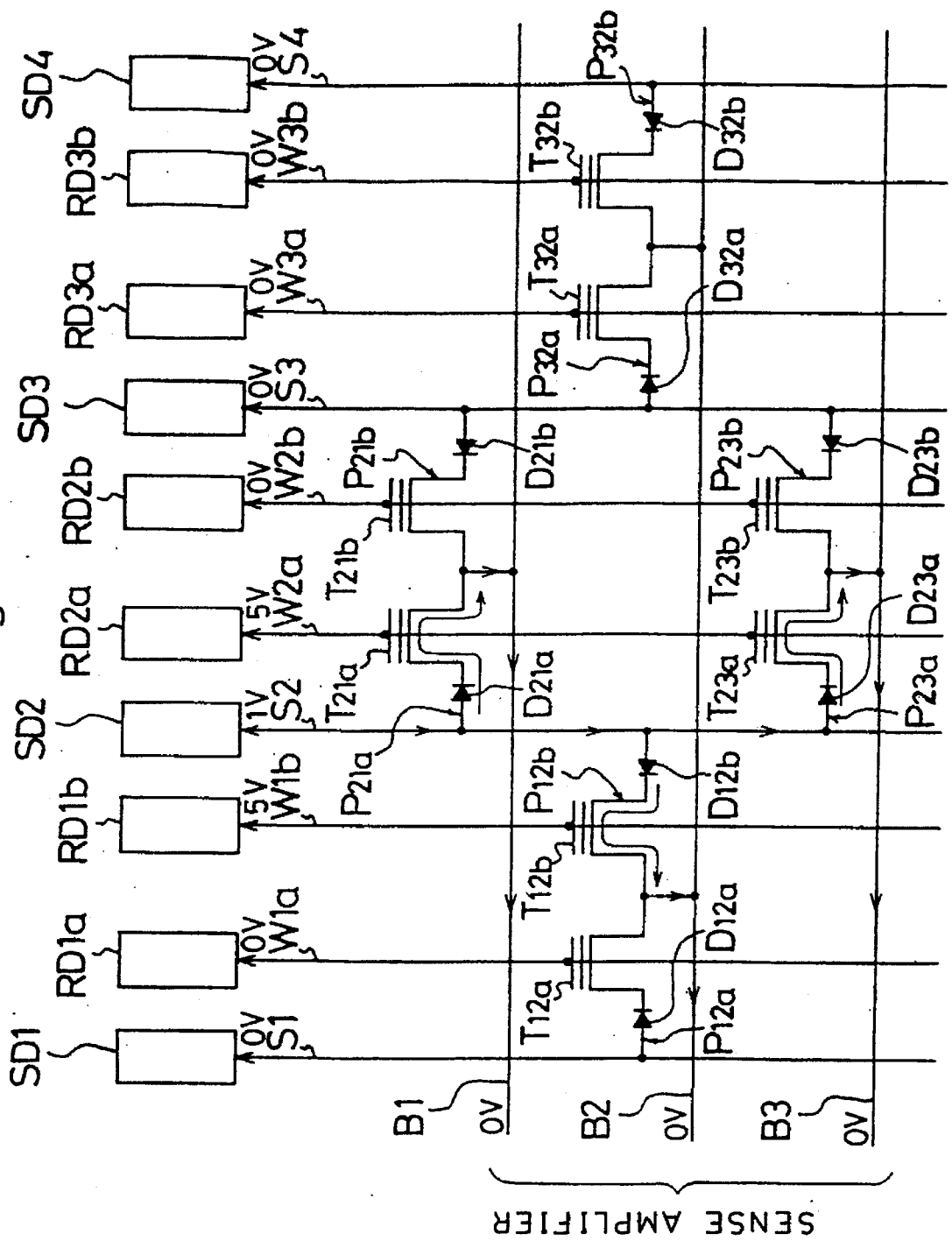
FIG. 41 is a circuit diagram which shows an organization of a memory cell array having diodes in accordance with a twelfth embodiment of the present invention and which is useful in understanding the reading thereof.

As shown in FIG. 41, an anisotropic resistance section off the sixth embodiment may be added to a checkerboard-like memory cell array structure and may be placed on the source side of a memory transistor forming a memory cell. In FIG. 41, DIODE D (D12a, D12b, D21a . . . ) is connected between SOURCELINE S (S1, S2 . . . ) and MEMORY TRANSISTOR T (T12a, T12b, T21b . . . ). However, a diode may be connected between a drain and a memory transistor and such a structure is implemented by a method described in the sixth embodiment.

In the present embodiment, reading is accomplished using the same voltage relationship as in the ninth embodiment. As shown in FIG. 40 or in FIG. 41, WORDLINES W1b and W2a, which are selected wordlines, are set to Vcc (for example, 5 V), and WORDLINES W1a, W2b–W3b, which are deselected wordlines, are set to Vss (0 V), and SOURCELINE S2, which is a selected sourceline, is set to Vrm (1 V), and SOURCELINES S1, S3, S4, which are deselected sourcelines, are set to Vss (0 V), and all bitlines are set to Vss (0 V) via their respective sense amplifiers, in order to extract items of data from a group of all memory cells associated with WORDLINES W1b and W2a.

For the case of a memory cell array having a structure of FIG. 41, reading may be performed with the wordline potential kept at Vss.

If the threshold voltage is controlled in such a manner as to prevent a memory cell from being depleted, a group of all memory cells associated with a single wordline can be read, as in the ninth embodiment.

The present embodiment uses a non-volatile memory cell with a floating gate. Instead of using such a memory cell, a non-volatile memory transistor may be used which is capable of changing a threshold voltage by means of an implantation with electrons into a dielectric layer on a channel region of a MOS transistor such as an MNOS (metal nitride oxide semiconductor) memory cell.

The invention claimed is:

1. A non-volatile semiconductor memory comprising:

an array of non-volatile memory cells arranged in columns and rows, wherein each said non-volatile memory cell has a transistor and a capacitance section, said transistor being composed of, at least, a gate, a channel region, a source, and a drain;

a plurality of wordlines, wherein each said wordline is connected to each of said gates in a row of said memory cell array;

a plurality of bitlines, wherein each said bitline is connected to each of said drains in a column of said memory cell array;

a plurality of sourcelines, wherein each said sourceline is connected to each of said sources in a row of said memory cell array;

a row decoder circuit for selecting among said plurality of wordlines;

a column decoder circuit for selecting among said plurality of bitlines;

a source decoder circuit for selecting among said plurality of sourcelines;

a plurality of anisotropic resistance sections;

wherein:

each said anisotropic resistance section is arranged in a path from a said bitline to a said sourceline through a said transistor, said anisotropic resistance section is arranged between said channel region of the transistor and said bitline;

each said anisotropic resistance section has voltage-current properties which are different for different levels of voltages applied across said anisotropic resistance section;

each said anisotropic resistance section has a forward direction in which a current flows therethrough with lesser resistance and a reverse direction in which a current flows therethrough with greater resistance, said anisotropic resistance section has properties such that resistance to a current flowing from said memory cell to said bitline is larger than resistance to a current flowing from said bitline to said memory cell.

2. A non-volatile semiconductor memory according to claim 1 wherein:

said anisotropic resistance section is a diode capable of permitting a current to pass therethrough in one direction only.

3. A non-volatile semiconductor memory according to claim 2 wherein:

said diode is a Schottky diode formed by depositing a conductive layer directly on a semiconductor substrate surface region acting as a source or drain of said transistor.

4. A non-volatile semiconductor memory according to claim 2 wherein:

said diode is a PN diode formed between an internal region of a semiconductor substrate acting as a source or drain of said transistor and a contact region of said semiconductor substrate.

5. A non-volatile semiconductor memory according to claim 1 wherein:

said anisotropic resistance section is an offset region formed by implanting, between a drain of said transistor and an under-gate channel region, an impurity of the same conductivity type as said channel region.

6. A non-volatile semiconductor memory according to claim wherein:

drains of each of pairs of memory cells in adjacent relationship of said memory cells are connected to a common bitline;

said pairs of memory cells are placed in checkerboard arrangement to form an array structure;

two wordlines are arranged to a single sourceline, and sources of memory cells, connected to said wordlines located next to said source line, are connected to said source line.

7. A non-volatile semiconductor memory cell according to claim 6 further comprising:
   a plurality of sense amplifiers, each said sense amplifier requiring a reference electric potential;
   a plurality of reference dummy cells, each said reference dummy cell being arranged in each said bitline;
   wherein:
      said reference electric potential is generated in one of two adjoining bitlines.

8. A method of driving a non-volatile semiconductor memory;
   said non-volatile semiconductor memory comprising:
      an array of non-volatile memory cells arranged in columns and rows, wherein each said non-volatile memory cell has a transistor and a capacitance section, said transistor being composed of, at least, a gate, a source, and a drain;
      a plurality of wordlines, wherein each said wordline is connected to each of said gates in a row of said memory cell array;
      a plurality of bitlines, wherein each said bitline is connected to each of said drains in a column of said memory cell array;
      a plurality of sourcelines, wherein each said sourceline is connected to each of said sources in a row of said memory cell array;
      a row decoder circuit for selecting among said plurality of wordlines;
      a column decoder circuit for selecting among said plurality of bitlines;
      a source decoder circuit for selecting among said plurality of sourcelines;
      a plurality of anisotropic resistance sections;
      wherein:
         each said anisotropic resistance section is arranged in a path from a said bitline to a said sourceline through a said transistor;
         each said anisotropic resistance section has voltage-current properties which are different for different levels of voltages applied across said anisotropic resistance section;
         each said anisotropic resistance section has a forward direction in which a current flows therethrough with lesser resistance and a reverse direction in which a current flows therethrough with greater resistance;
         said drive method comprising the steps of:
            selecting, from among said plurality of bitlines, a bitline associated with a memory cell to be read by means of said column decoder circuit;
            selecting, from among said plurality of sourcelines, a sourceline associated with said memory cell by means of said source decoder circuit;
            setting the electric potential of said selected bitline and the electric potential of said selected sourceline such that the electric potential relationship of said selected bitline versus said selected sourceline agrees with said forwarding direction of said anisotropic resistance section, and setting the higher of said selected bitline's electric potential and said selected sourceline's electric potential as a reading electric potential;
            setting the electric potential of deselected sourcelines to an electric potential level above the lower of said selected bitline's electric potential and said selected sourceline's electric potential but below said reading electric potential.

9. The method according to claim 8 wherein:
   said non-volatile semiconductor memory further comprises:
      a plurality of sense amplifiers, each of said sense amplifiers requiring a reference electric potential;
      a plurality of reference dummy cells, each of said reference dummy cell being arranged in a said bitline;
   wherein:
      said reference electric potential is generated in one of two adjoining bitlines;
      said drive method further comprising the steps of:
         selecting, from among said dummy memory cells, a dummy memory cell connected to a bitline located next to said selected bitline by means of said column decoder circuit;
         bringing the electric potential of a deselected bitline located next to said selected bitline to the same electric potential level as the electric potential of said selected bitline;
         setting the electric potential of a sourceline connected to said selected dummy memory cell such that the electric potential relationship of a bitline connected to said selected dummy cell with said sourceline agrees with a forward direction of an anisotropic resistance section of said selected dummy cell;
         generating said reference electric potential in said bitline next to said selected bitline.

10. The method according to claim 8 wherein:
    all of said plurality of wordlines are set to a ground level when reading said memory cell.

11. A method of driving a non-volatile semiconductor memory;
    said non-volatile semiconductor memory comprising:
       an array of non-volatile memory cells arranged in columns and rows, wherein each said non-volatile memory cell has a transistor and a capacitance section, said transistor being composed of, at least, a gate, a source, and a drain;
       a plurality of wordlines, wherein each said wordline is connected to each of said gates in a row of said memory cell array;
       a plurality of bitlines, wherein each said bitline is connected to each of said drains in a column of said memory cell array;
       a plurality of sourcelines, wherein each said sourceline is connected to each of said sources in a row of said memory cell array;
       a row decoder circuit for selecting among said plurality of wordlines;
       a column decoder circuit for selecting among said plurality of bitlines;
       a source decoder circuit for selecting among said plurality of sourcelines;
       a plurality of anisotropic resistance sections;
       wherein:
          each said anisotropic resistance section is arranged in a path from a said bitline to a said sourceline through a said transistor;

each said anisotropic resistance section has voltage-current properties which are different for different levels of voltages applied across said anisotropic resistance section;

each said anisotropic resistance section has a forward direction in which a current flows therethrough with lesser resistance and a reverse direction in which a current flows therethrough with greater resistance wherein:

said forward direction of said anisotropic resistance section is formed such that voltage on the bitline side is greater than voltage on the sourceline side;

said drive method comprising the steps of:

bringing an erased memory cell to having a negative threshold voltage;

selecting, from among said plurality of bitlines, a bitline associated with a memory cell to be read by means of said column decoder circuit;

selecting, from among said plurality of sourcelines, a sourceline associated with said memory cell by means of said source decoder circuit;

bringing the electric potential of all of said wordlines to a ground level;

increasing the electric potential of said selected bitline;

bringing the electric potential of said selected sourceline to said ground level;

bringing the electric potential of deselected bitlines to said ground level;

passing an electric current between said selected bit line and said selected sourceline thereby to generate hot electrons for increasing said memory cell's threshold voltage.

12. A non-volatile semiconductor memory according to claim 1 wherein:

said anisotropic resistance is an offset region formed by implanting, between said source of said transistor and said channel region, an impurity of the same conductivity type as said channel region.

* * * * *

UNITED STATES PATENT AND TRADEMARK OFFICE
CERTIFICATE OF CORRECTION

PATENT NO. : 5,627,779
DATED : May 6, 1997
INVENTOR(S) : ODAKE et al.

It is certified that error appears in the above-identified patent and that said Letters Patent is hereby corrected as shown below:

Col. 34, line 62: After "claim" insert --1--

Signed and Sealed this

Twenty-second Day of September, 1998

Attest:

BRUCE LEHMAN

*Attesting Officer*     *Commissioner of Patents and Trademarks*